(12) United States Patent
Rofougaran

(10) Patent No.: US 7,899,394 B2
(45) Date of Patent: Mar. 1, 2011

(54) RFID SYSTEM WITH RF BUS

(75) Inventor: Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 1065 days.

(21) Appl. No.: 11/700,286

(22) Filed: Jan. 31, 2007

(65) Prior Publication Data

US 2007/0229270 A1  Oct. 4, 2007

Related U.S. Application Data

(63) Continuation-in-part of application No. 11/377,812, filed on Mar. 16, 2006, now Pat. No. 7,664,461, and a continuation-in-part of application No. 11/394,808, filed on Mar. 31, 2006, now Pat. No. 7,595,732.

(51) Int. Cl.
*H04B 5/00* (2006.01)
*H04M 1/00* (2006.01)
*H04Q 5/22* (2006.01)

(52) U.S. Cl. ............... 455/41.1; 455/41.2; 455/552.1; 455/553.1; 340/10.1; 340/10.2; 375/295; 375/316

(58) Field of Classification Search ............. 455/11.1, 455/41.1, 41.2, 41.3, 73, 127.4, 552.1, 553.1; 340/10.1, 10.2, 10.3, 572.1; 375/295, 316
See application file for complete search history.

(56) References Cited

U.S. PATENT DOCUMENTS 7,196,613 B2 * 3/2007 Horwitz et al. ............. 340/10.1
7,257,093 B1   8/2007 Witzke et al.

OTHER PUBLICATIONS

Dr. Lynn Fuller. "Microelectromechanical Systems (MEMs) Applications—Microphones," Rochester Institute of Technology Microelectronic Engineering, Apr. 25, 2005, pp. 1-43.

* cited by examiner

*Primary Examiner* — Eugene Yun
(74) *Attorney, Agent, or Firm* — Garlick Harrison & Markison; Bruce E. Garlick

(57) ABSTRACT

A radio frequency identification (RFID) system includes an RFID reader, an RFID tag, and a network connection module. The RFID reader includes a reader radio frequency (RF) bus transceiver. The network connection module includes a network connection RF bus transcevier, wherein the reader RF bus transceiver exchanges at least one of inbound RFID data and outbound RFID data with the network RF bus transceiver via an RF bus.

14 Claims, 44 Drawing Sheets

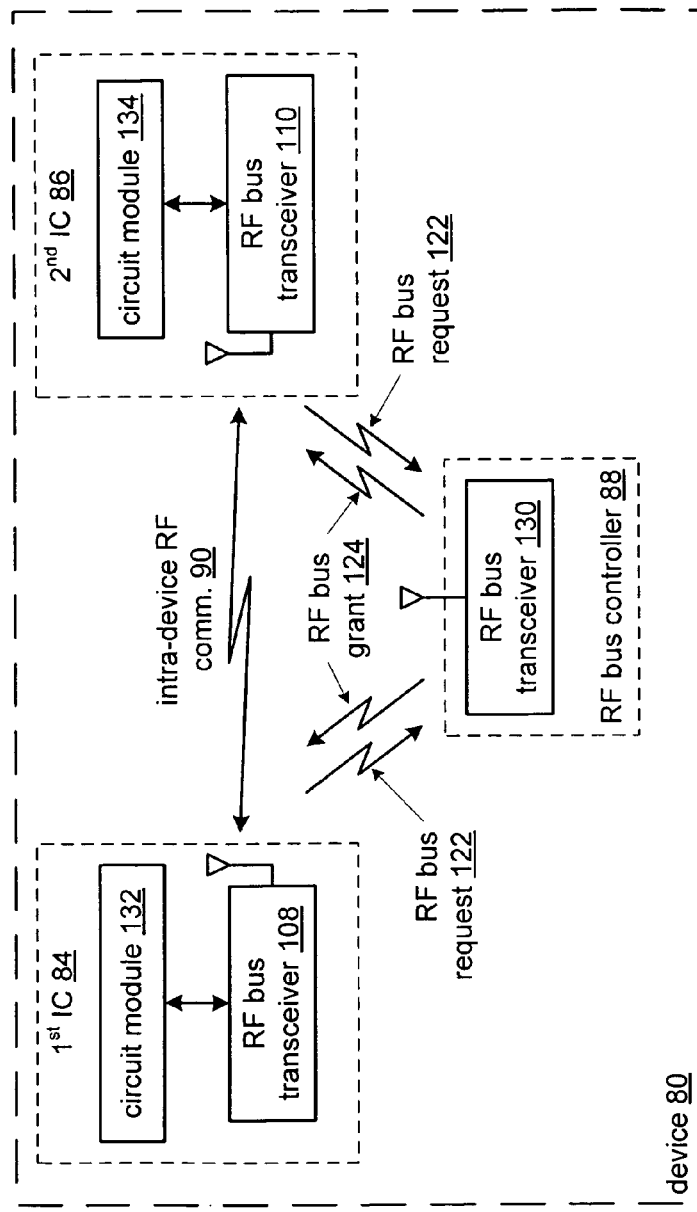

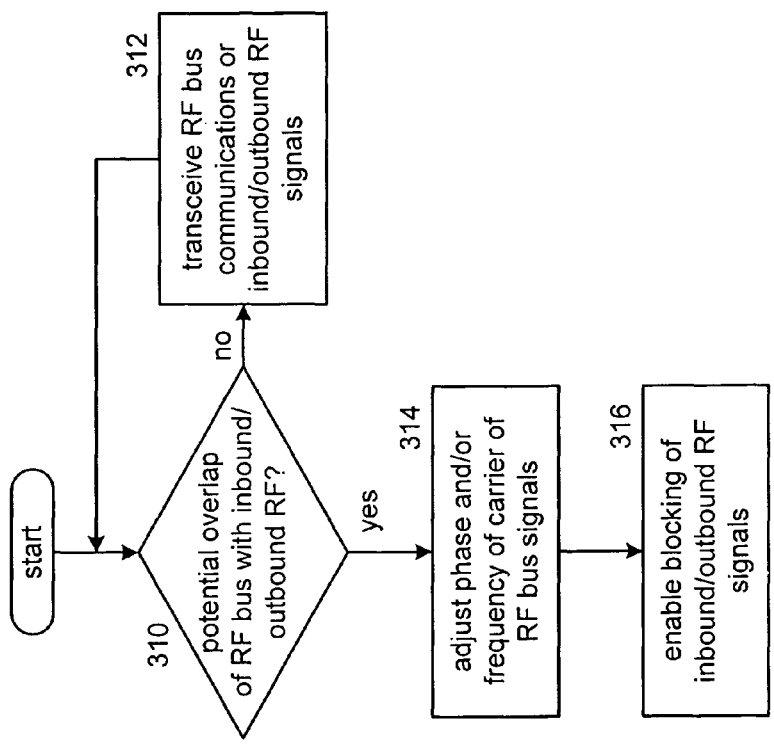

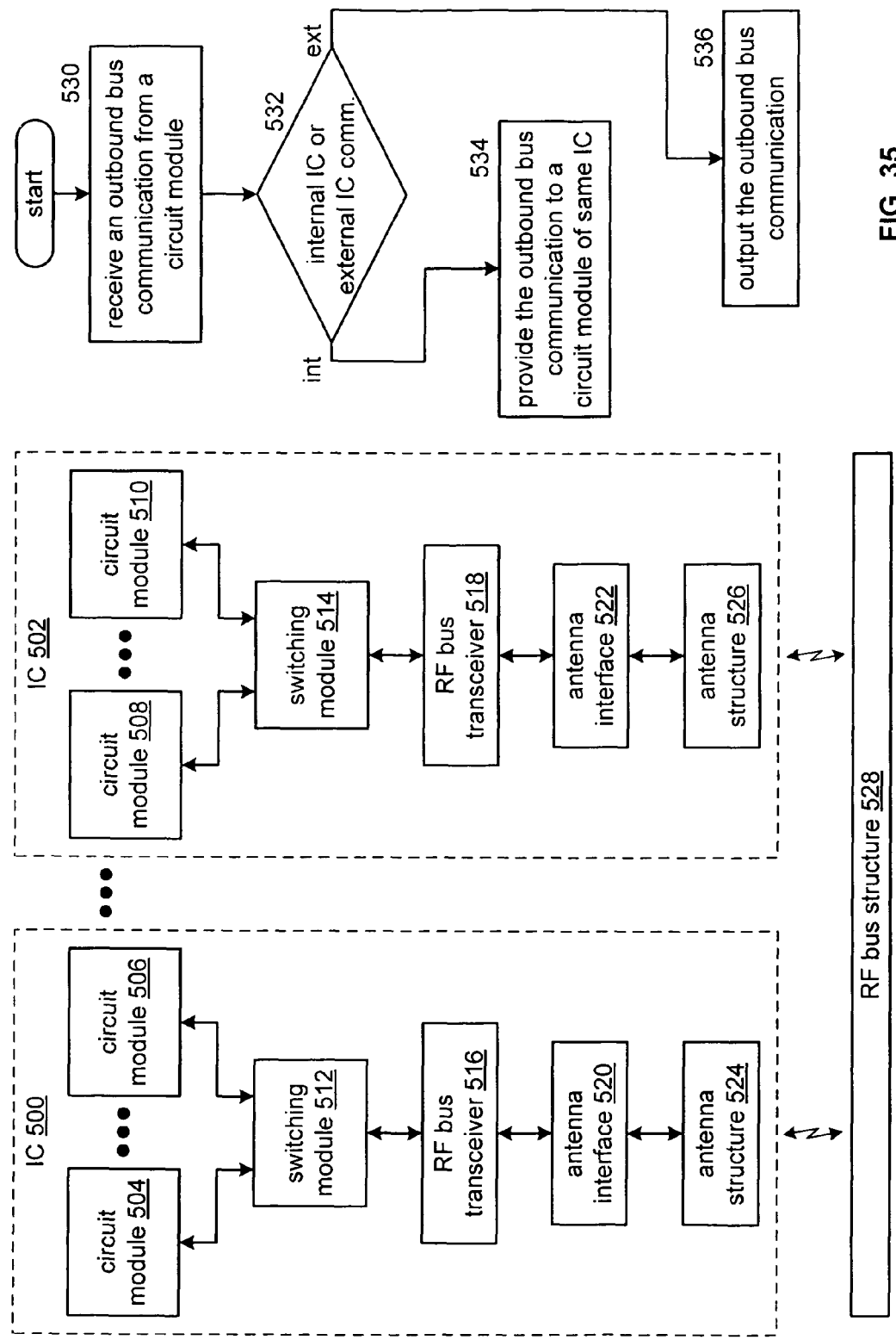

RFID SYSTEM WITH RF BUS

This patent application is claiming priority under 35 USC §120 as a continuation-in-part patent application of co-pending patent application entitled RFID READER ARCHITECTURE, having a filing date of Mar. 16, 2006, and a Ser. No. of 11/377,812 and of co-pending patent application entitled POWER GENERATING CIRCUIT, having a filing date of Mar. 31, 2006, and a Ser. No. of 11/394,808.

CROSS REFERENCE TO RELATED PATENTS

The present invention is related to the following co-pending patent applications:
1. entitled RF BUS CONTROLLER, having a filing date of Jan. 31, 2007, and a Ser. No. 11/700,285;
2. entitled INTRA-DEVICE RF BUS AND CONTROL THEREOF, having a filing date of Jan. 31, 2007, and a Ser. No. 11/700,421;
3. entitled SHARED RF BUS STRUCTURE, having a filing date of Jan. 31, 2007, and a Ser. No. 11/700,517;
4. entitled RF TRANSCEIVER DEVICE WITH RF BUS, having a filing date of Jan. 31, 2007, and a Ser. No. 11/700,592;
5. entitled RF BUS ACCESS PROTOCOL AND TRANSCEIVER, having a filing date of Jan. 31, 2007, and a Ser. No. 11/700,591.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to wireless communication and more particularly to inter-device wireless communications.

2. Description of Related Art

Communication systems are known to support wireless and wire lined communications between wireless and/or wire lined communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

In most applications, radio transceivers are implemented in one or more integrated circuits (ICs), which are inter-coupled via traces on a printed circuit board (PCB). The radio transceivers operate within licensed or unlicensed frequency spectrums. For example, wireless local area network (WLAN) transceivers communicate data within the unlicensed Industrial, Scientific, and Medical (ISM) frequency spectrum of 900 MHz, 2.4 GHz, and 5 GHz. While the ISM frequency spectrum is unlicensed there are restrictions on power, modulation techniques, and antenna gain.

As IC fabrication technology continues to advance, ICs will become smaller and smaller with more and more transistors. While this advancement allows for reduction in size of electronic devices, it does present a design challenge of providing and receiving signals, data, clock signals, operational instructions, etc., to and from a plurality of ICs of the device. Currently, this is addressed by improvements in IC packaging and multiple layer PCBs. For example, ICs may include a ball-grid array of 100-200 pins in a small space (e.g., 2 to 20 millimeters by 2 to 20 millimeters). A multiple layer PCB includes traces for each one of the pins of the IC to route to at least one other component on the PCB. Clearly, advancements in communication between ICs are needed to adequately support the forth-coming improvements in IC fabrication.

Therefore, a need exists for intra-device wireless communications and applications thereof.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

FIGS. 7-10 are schematic block diagrams of other embodiments of a device in accordance with the present invention;

FIG. 11 is a diagram of an embodiment of a frame of an intra-device wireless communication in accordance with the present invention;

FIG. 20 is a diagram of an example of a frame of an RF transceiver device wireless communication in accordance with the present invention;

FIG. 21 is a logic diagram of an embodiment of a method of resource allocation for an intra-device wireless communication in accordance with the present invention;

FIG. 34 is a schematic block diagram of another embodiment of a device in accordance with the present invention;

FIG. 35 is a logic diagram of a method for switching within a device accordance with the present invention;

DETAILED DESCRIPTION OF THE INVENTION

Figure 1:
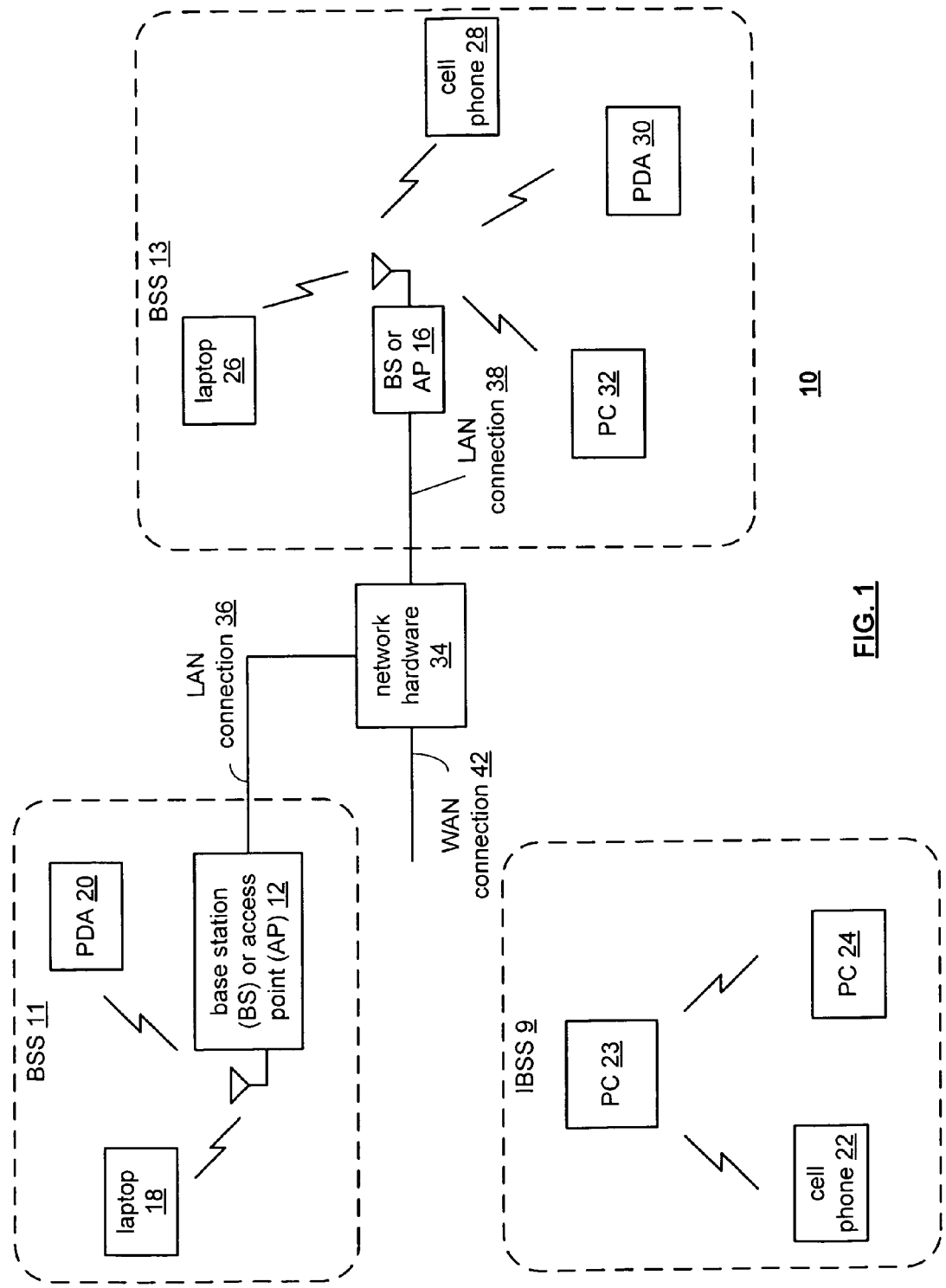
FIG. 1 is a schematic block diagram of an embodiment of a wireless communication system in accordance with the present invention.

FIG. 1 illustrates a schematic block diagram of a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28.

The base stations or access points 12 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
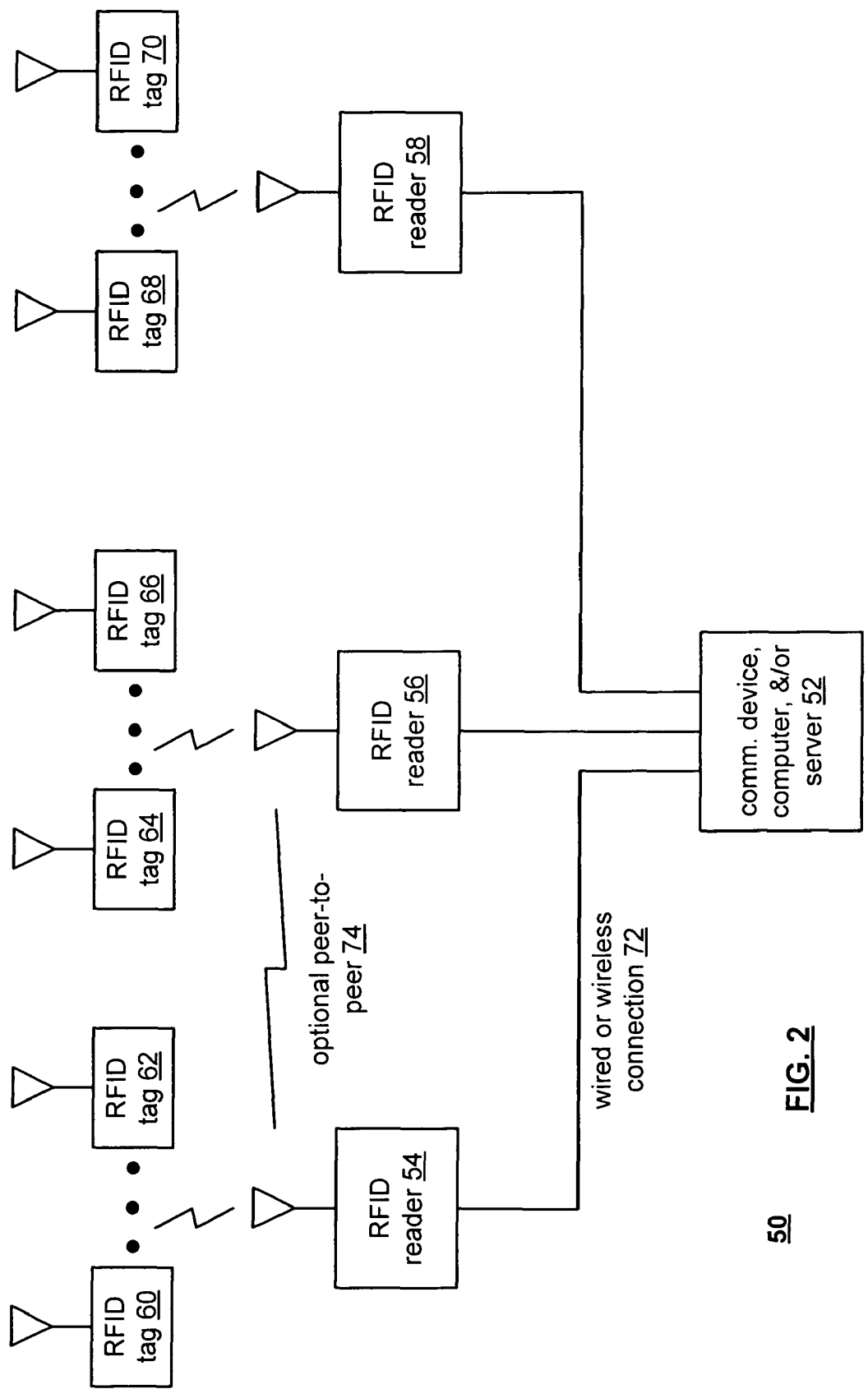
FIG. 2 is a schematic block diagram of an embodiment of an RFID system in accordance with the present invention.

FIG. 2 is a schematic block diagram of an embodiment of an RFID (radio frequency identification) system 50 that includes a communication device, a computer, and/or a server 52, a plurality of RFID readers 54-58 and a plurality of RFID tags 60-70. The RFID system 50 may be separate system from that of FIG. 1 and/or may overlay the system of FIG. 1 such that the plurality of communication devices 18-30 include an RFID reader 54-58 and/or an RFID tag 60-70. The RFID tags 60-70 may each be associated with a particular object for a variety of purposes including, but not limited to, tracking inventory, tracking status, location determination, assembly progress, et cetera.

Each RFID reader 54-58 wirelessly communicates with one or more RFID tags 60-70 within its coverage area. For example, RFID reader 54 may have RFID tags 60 and 62 within its coverage area, while RFID reader 56 has RFID tags 64 and 66, and RFID reader 58 has RFID tags 88 and 70 within its coverage area. The RF communication scheme between the RFID readers 54-58 and RFID tags 60-70 may be a back scatter near field and/or far field technique whereby the RFID readers 54-58 provide energy to the RFID tags via an RF signal. The RFID tags derive power from the RF signal and respond on the same RF carrier frequency with the requested data.

In this manner, the RFID readers 54-58 collect data as may be requested from the communication device, the computer, and/or the server 52 from each of the RFID tags 60-70 within its coverage area. The collected data is then conveyed to the communication device, the computer, and/or the server 52 via the wired or wireless connection 72 and/or via the peer-to-peer communication 74. In addition, and/or in the alternative, communication device, the computer, and/or the server 52 may provide data to one or more of the RFID tags 60-70 via the associated RFID reader 54-58. Such downloaded information is application dependent and may vary greatly. Upon receiving the downloaded data, the RFID tag would store the data in a non-volatile memory.

As indicated above, the RFID readers 54-58 may optionally communicate on a peer-to-peer basis such that each RFID reader does not need a separate wired or wireless connection 72 to the communication device, the computer, and/or the server 52. For example, RFID reader 54 and RFID reader 56 may communicate on a peer-to-peer basis utilizing a back scatter technique, a wireless LAN technique, and/or any other wireless communication technique. In this instance, RFID reader 66 may not include a wired or wireless connection 72 to the communication device, the computer, and/or the server 52. Communications between RFID reader 56 and the communication device, the computer, and/or the server 52 are conveyed through RFID reader 54 and the wired or wireless connection 72, which may be any one of a plurality of wired standards (e.g., Ethernet, fire wire, et cetera) and/or wireless communication standards (e.g., IEEE 802.11x, Bluetooth, et cetera).

As one of ordinary skill in the art will appreciate, the RFID system of FIG. 2 may be expanded to include a multitude of RFID readers 54-58 distributed throughout a desired location (for example, a building, office site, et cetera) where the RFID tags may be associated with equipment, inventory, personnel, et cetera. Note that the communication device, the computer, and/or the server 52 may be coupled to another server and/or network connection to provide wide area network coverage. Further note that the carrier frequency of the wireless communication between the RFID readers 54-58 and RFID tags 60-70 may range from about 10 MHz to 60 GHz.

Figure 3:
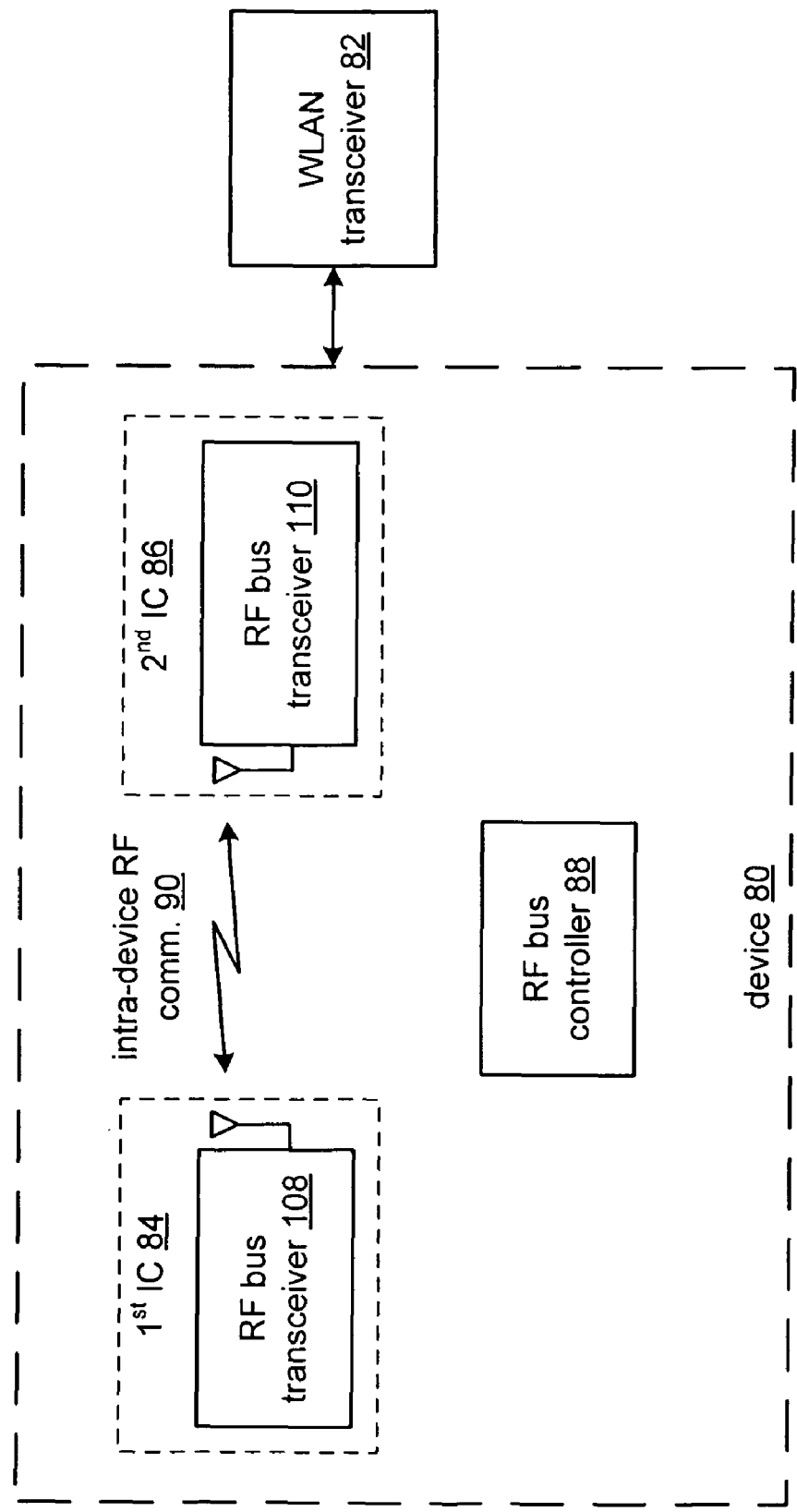
FIG. 3 is a schematic block diagram of an embodiment of a device in accordance with the present invention.

FIG. 3 is a schematic block diagram of an embodiment of a device 80 that includes a plurality of integrated circuits (ICs) 84, 86, and an RF bus controller 88. The device 80 may be any type of electronic apparatus that includes ICs. For example, the device may be a cellular telephone, personal computer, lap top computer, access point, base station, personal digital assistant, monitor, video game console, video game controller, audio equipment, audio/video equipment, a kitchen appliance, automobile electronics, etc. Accordingly, the ICs 84, 86 include circuit modules to provide at least some of the functionality of the device. For example, the ICs 84, 86 may be, and/or include, a microprocessor, microcontroller, digital signal processor, programmable logic circuit, memory, application specific integrated circuit (ASIC), analog to digital converter (ADC), digital to analog converter (DAC), digital logic circuitry, analog circuitry, graphics processor, etc.

In this embodiment, IC 84 includes a first radio frequency (RF) bus transceiver 108 and IC 86 includes a second RF bus transceiver 110 to support intra-device RF communications 90 therebetween. The intra-device RF communications 90 may be RF data communications, RF instruction communications, RF control signal communications, and/or RF input/output communications. For example, data, control, operational instructions, and/or input/output signals (e.g., analog input signals, analog output signals, digital input signals, digital output signals) that are traditionally conveyed between ICs via traces on a printed circuit board are, in device 80, transmitted via the intra-device RF communications 90.

The intra-device RF communications 90 may also include operating system level communications and application level communications. The operating system level communications are communications that correspond to resource management of the device 80, loading and executing applications (e.g., a program or algorithm), multitasking of applications, protection between applications, device start-up, interfacing with a user of the device 80, etc. The application level communications are communications that correspond to the data conveyed, operational instructions conveyed, and/or control signals conveyed during execution of an application.

The RF bus controller 88 is coupled to control the intra-device RF communications 90 between the first and second RF bus transceivers 108, 110. The RF bus controller 88 may be a separate IC or it may be included in one of the ICs 84, 86. The functionality of the RF bus controller 88 will be described in greater detail with reference to FIGS. 11, 20, 22, and 48-55.

Figure 4:
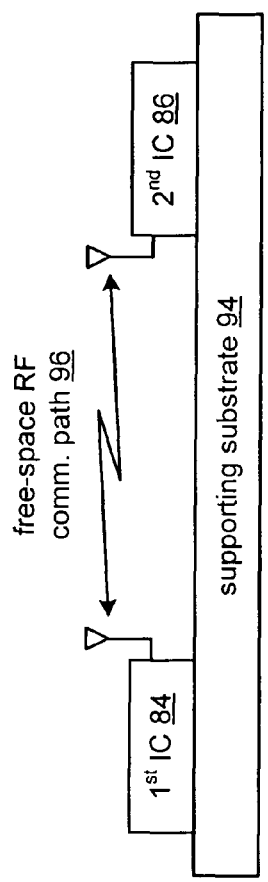
FIGS. 4-6 are diagrams of embodiments of intra-device wireless communications in accordance with the present invention.
Figure 5:
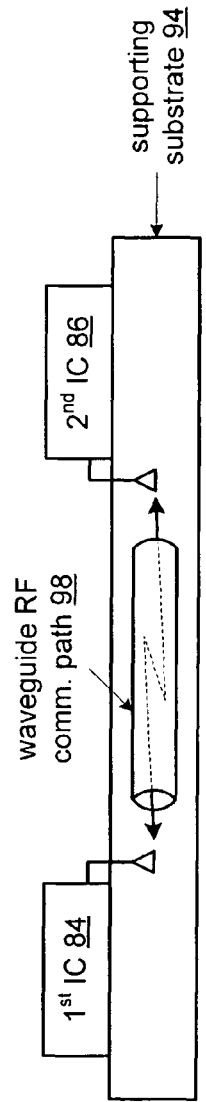
Figure 6:
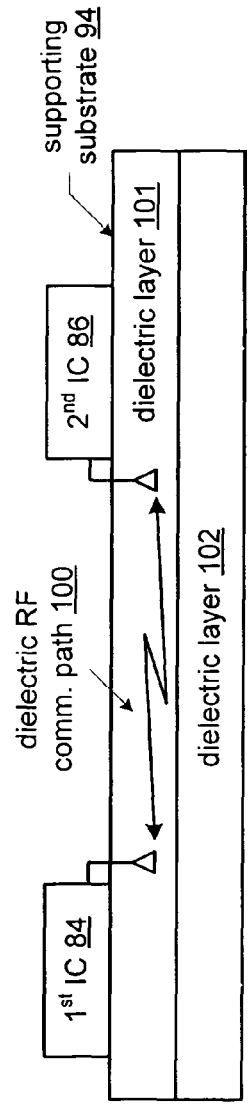

FIGS. 4-6 are diagrams of embodiments of intra-device wireless communications 90 being conveyed over different types of RF communication paths. In these embodiments, the antenna of each IC 84, 86 is shown external to the IC for ease of illustration, but, in most ICs embodiments, the antenna will be in the IC.

FIG. 4 illustrates the device 80 further including a supporting substrate 94 that supports the ICs 84, 86. In this embodiment, the intra-device RF communications 90 occur over a free-space RF communication path 96. In other words, the intra-device RF communications 90 are conveyed via the air.

FIG. 5 illustrates the device 80 having the supporting substrate 94 including a waveguide RF communication path 98. In this embodiment, the intra-device RF communications 90 occur via the waveguide RF communication path 98. The waveguide RF communication path 98 may be formed in a micro-electromechanical (MEM) area of the supporting substrate 94. The use of a MEM area to provide an RF bus structure to support intra-device RF communications 90 (which includes inter-IC RF communications and/or intra-IC RF communications) is described in greater detail with reference to FIGS. 36-46.

FIG. 5 illustrates the device 80 having the supporting substrate 94 including a plurality of dielectric layers 101, 102. In this embodiment, the dielectric layers 101 and 102 have different dielectric properties such that the border between dielectric layer 101 and dielectric layer 102 reflect the RF signals transceived by the ICs 84, 86. In this manner, dielectric layer 101 provides a dielectric RF communication path 100 for the intra-device RF communications 90.

In an embodiment of device 80, the intra-device RF communications 90 may occur over the free-space RF communication path 96, the waveguide RF communication path 98, and/or the dielectric RF communication path 100. In this embodiment, the RF bus controller 88 further functions to select one of the waveguide RF communication path 98, the dielectric layer RF communication path 100, or the free space RF communication path 96 based on at least one aspect of one of the intra-device RF communications. For example, high data rate and/or non-error tolerant communications (e.g., operating system level communications) may occur over the waveguide RF communication path 98, while lower data rate and/or error tolerant communications (e.g., some portions of application level communications) may occur over the free-space RF communication path 96. As another example, the aspect on which the RF communication path is selected may be user defined, operating system level defined, and/or pre-programmed into the device. As yet another example, the aspect may correspond to the IC initiating an intra-device RF communication and/or the IC receiving it. As a further example, the aspect may correspond to the number of intra-device RF communications 90 an IC currently has in progress.

Figure 7:
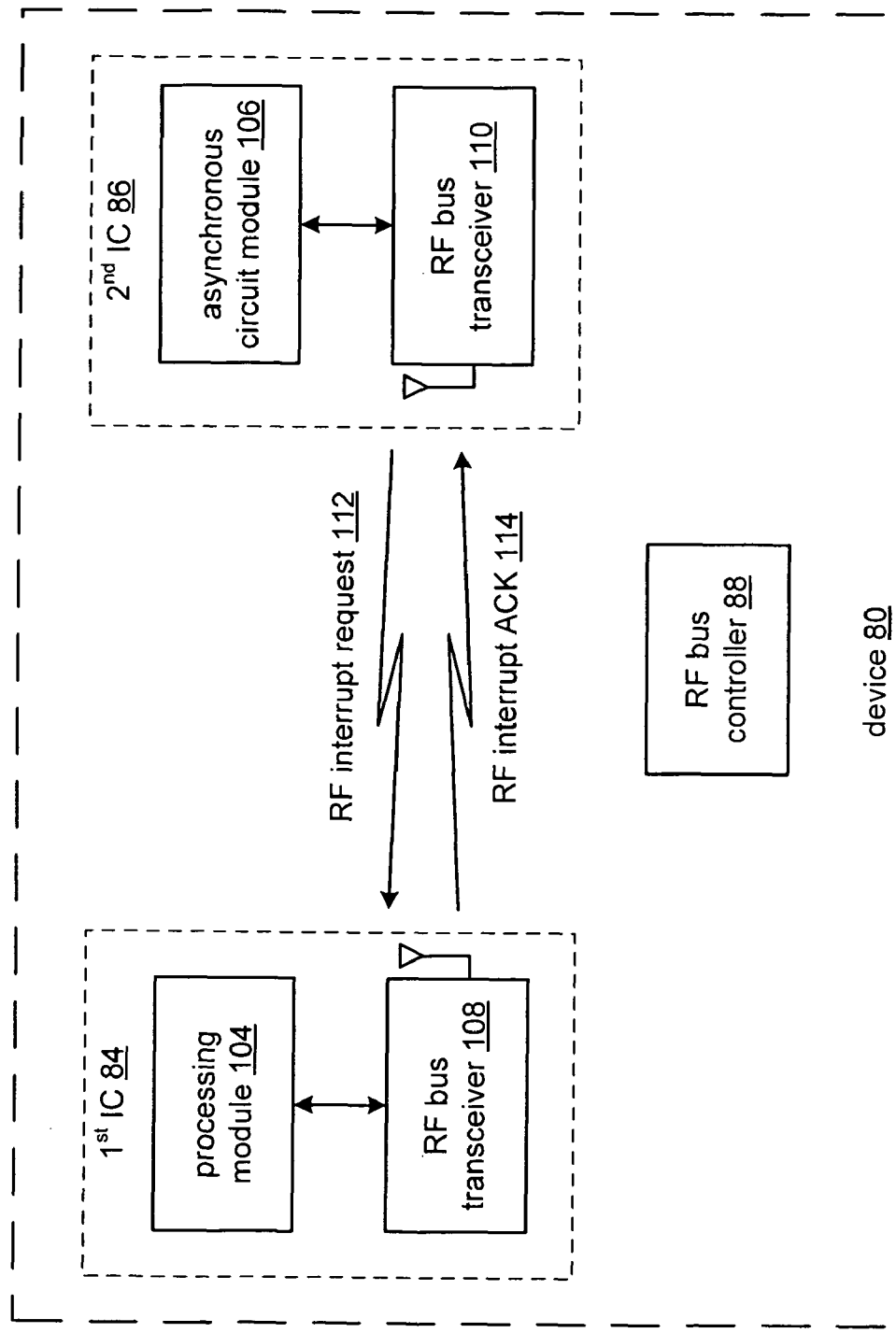

FIG. 7 is a schematic block diagram of another embodiment of the device 80 that includes ICs 84, 86 and the RF bus controller 88. In this embodiment, IC 84 includes a processing module 104 and the RF bus transceiver 108 and IC 86 includes an asynchronous circuit module 106 and the RF bus transcevier 110. The processing module 104 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

The asynchronous circuit module 106 may be any type of circuit and/or program that provides data to and/or receives data from the processing module 104 in an asynchronous manner that is unpredictable to the processing module 106. Such a circuit and/or program may be a user interface input/output (I/O), email application, security application, peripheral I/O circuit, etc.

In this embodiment, the asynchronous circuit module 106 provides an RF interrupt request communication 112 via the RF bus transceiver 110 to the RF bus transceiver 108 coupled to the processing module 104. The RF interrupt request communication 112 includes an interrupt request that is requesting the processing module 104 to stop what it is currently doing and execute software to process the asynchronous circuit module's request. In response to receiving and/or commencing execution of the interrupt request, the processing module 104 generates an interrupt acknowledgement. The RF bus transcevier 108 converts the interrupt acknowledgement into an RF interrupt acknowledgement communication 114.

The RF bus transceiver 110 receives the RF interrupt acknowledgement communication 114 and recaptures the interrupt acknowledgement therefrom. The RF bus transceiver 110 provides the interrupt acknowledgement to the asynchronous circuit module 106.

Figure 8:
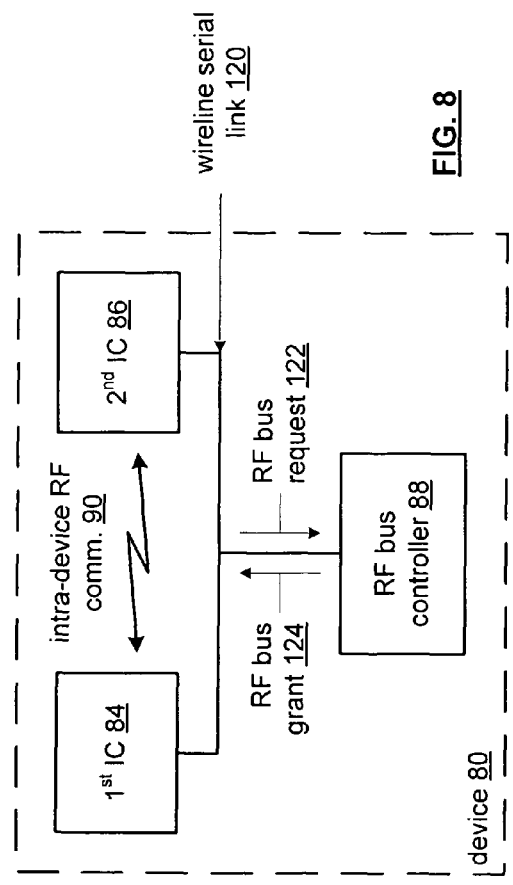

FIG. 8 is a schematic block diagram of another embodiment of the device 80 that includes the ICs 84, 86 and the RF bus controller 88. In this embodiment, the RF bus controller 88 receives RF bus requests 122 from the ICs 84, 86 via a wireline serial link 120. The RF bus controller 88 processes the RF bus requests 122 to produce RF bus grants 124, which are provided to the ICs 84, 86 via the wireline serial link 120. As such, for the ICs 84, 86 to access an RF bus to support the intra-device RF communications 90, the ICs 84, 86 communicate with the RF bus controller 88 via the wireline serial link 120.

Figure 9:
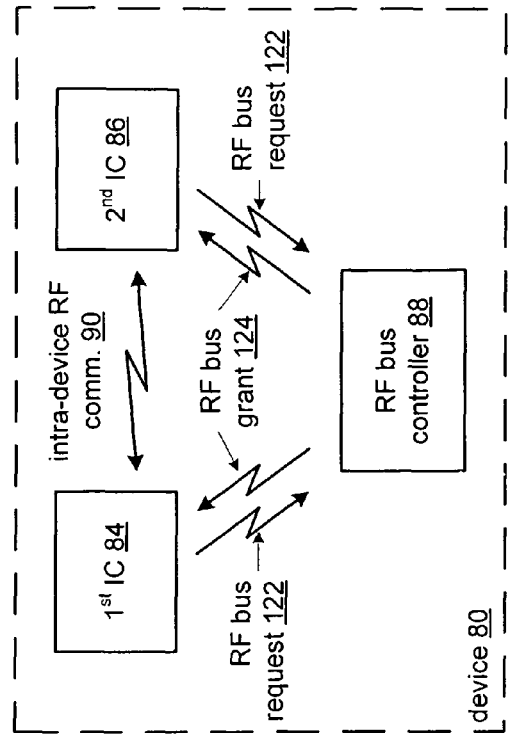

FIG. 9 is a schematic block diagram of another embodiment of the device 80 that includes the ICs 84, 86 and the RF bus controller 88. In this embodiment, the RF bus controller 88 receives RF bus requests 122 from the ICs 84, 86 via a wireless interface. The RF bus controller 88 processes the RF bus requests 122 to produce RF bus grants 124, which are provided to the ICs 84, 86 via the wireless interface. The RF bus request 122 and the RF bus grant 124 may be transceived at one carrier frequency while the intra-device RF communications 90 may be transceived at a different carrier frequency or different carrier frequencies. Alternatively, the RF bus request 122 and the RF bus grant 124 may be transceived at the carrier frequency or frequencies as the intra-device RF communications 90.

FIG. 10 is a schematic block diagram of another embodiment of the device 80 that includes the ICs 84, 86 and the RF bus controller 88. In this embodiment, the RF bus controller 88 includes an RF bus transceiver 130, IC 84 includes a circuit module 132 and the RF bus transceiver 108, and IC 86 includes a circuit module 134 and the RF bus transceiver 110. The circuit modules 132, 134 may be any type of digital circuit, analog circuit, logic circuit, and/or processing circuit. For example, one of the circuit modules 132, 134 may be, but is not limited to, a microprocessor, a component of a microprocessor, cache memory, read only memory, random access memory, programmable logic, digital signal processor, logic gate, amplifier, multiplier, adder, multiplexor, etc.

In this embodiment, the inter-device RF communication 90, RF bus requests 122, and the RF bus grants 124 occur within the same frequency spectrum. To minimize interference between the obtaining access to the RF bus and using the RF bus for the inter-device RF communications 90, the bus controller 88 controls access to the frequency spectrum by allocating at least one communication slot per frame to the wireless interface and allocating at least one other communication slot per frame for the intra-device RF communications. The communication slots may be time division multiple access (TDMA) slots within a TDMA frame, frequency division multiple access (FDMA) slots of an FDMA frame, and/or code division multiple access (CDMA) slots of a CDMA frame. Note that in this embodiment, frame is equivalent to a packet.

FIG. 11 is a diagram of an example of a frame of obtaining access to an RF Bus and using the RF bus by the embodiment of FIG. 10. The frame, or packet, includes a controller inquiry field 140, an IC response control field or fields 142, a resource allocation field or fields 144, and a data field or fields 146. The RF bus controller uses the controller inquiry field 140 to determine whether one or more ICs have an up-coming need to access the RF bus. In one embodiment, the RF bus controller 88 addresses a single IC per frame as to whether the IC has an up-coming need for the RF bus. In another embodiment, the RF bus controller 88 addresses two or more ICs as to whether they have an up-coming need for the RF bus. The RF bus controller 88 may be use a polling mechanism to address the ICs, which indicates how and when to response to the polling inquiry.

The ICs 84, 86 respond to the RF bus controller's query in the IC response control field or fields 142. In one embodiment, the ICs share a single IC response control field using a carrier sense multiple access (CSMA) with collision avoidance technique, using pre-assigned sub-slots, using a round robin technique, using a poll-respond technique, etc. In another embodiment, the ICs have their own IC response control field 142. In either embodiment, the ICs 84, 86 response includes an indication of whether it has data to convey via the RF bus, how much data to convey, the nature of the data (e.g., application data, application instructions, operating system level data and/or instructions, etc.), the target or targets of the data, a priority level of the requestor, a priority level of the data, data integrity requirements, and/or any other information relating to the conveyance of the data via the RF bus.

The RF bus controller 88 uses the resource allocation field or fields 144 to grant access to the RF bus to one or more ICs 84, 86. In one embodiment, the RF bus controller 88 uses a single field to respond to one or more ICs. In another embodiment, the RF bus controller 88 responds to the ICs in separate resource allocation fields 144. In either embodiment, the RF bus grant 144 indicates when, how, and for how long the IC has access to the RF bus during the one or more data fields 146. Various embodiments of requesting and obtaining access to the RF bus and transceiving via the RF bus will be described in greater detail with reference to FIGS. 49-64.

Figure 12:
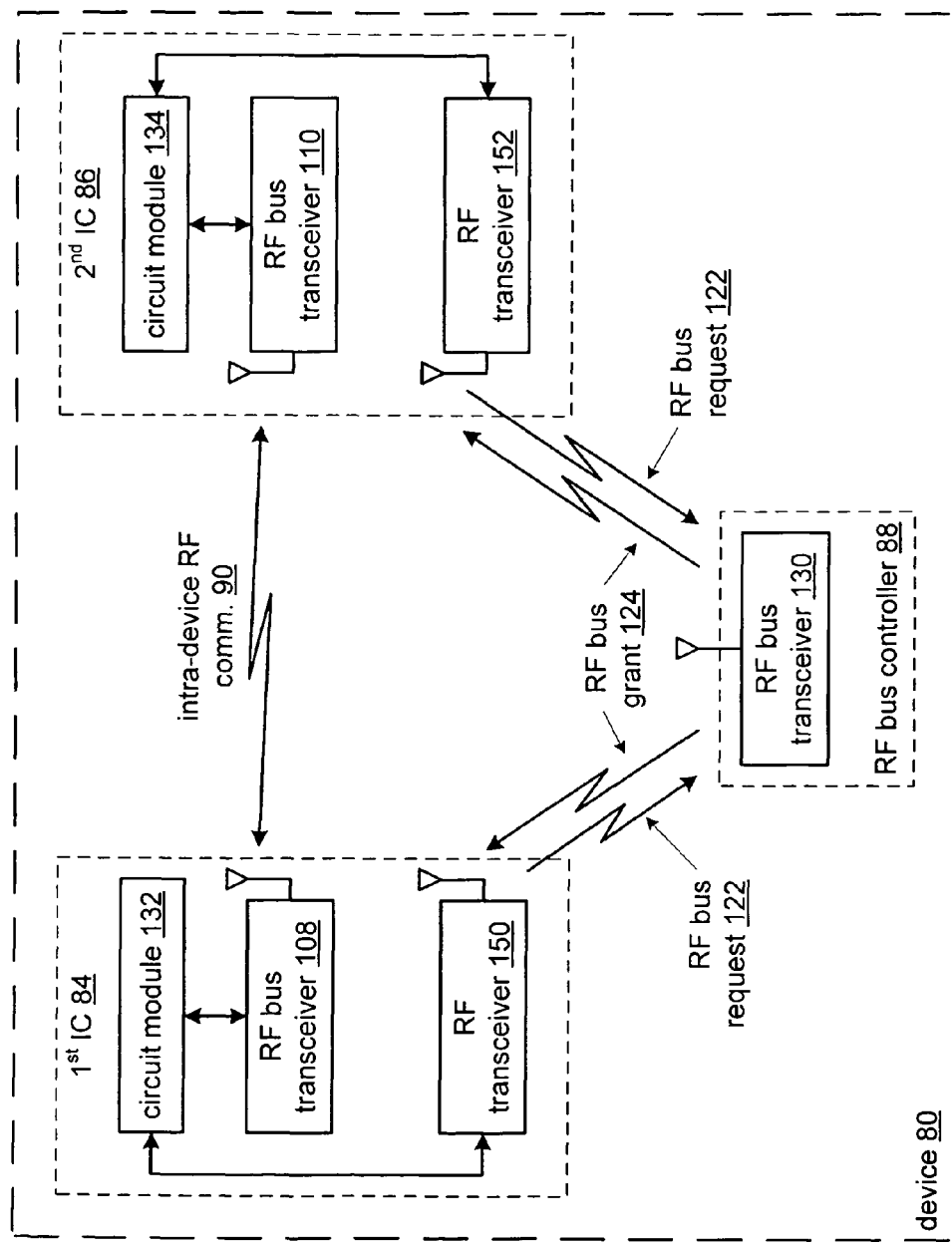
FIGS. 12-16 are schematic block diagrams of other embodiments of a device in accordance with the present invention.

FIG. 12 is a schematic block diagram of another embodiment of the device 80 that includes the ICs 84, 86 and the RF bus controller 88. In this embodiment, the RF bus controller 88 includes an RF bus transceiver 130. IC 84 includes the circuit module 132 the RF bus transceiver 108, and an RF transceiver 160. IC 86 includes the circuit module 134, the RF bus transceiver 110, and an RF transceiver 152.

In this embodiment, the inter-device RF communications 90 occur in a different frequency spectrum than the RF bus requests 122 and the RF bus grants 124. As such, they can occur simultaneously with minimal interference. In this manner, the RF bus requests 122 and RF bus grants 124 may be communicated using a CSMA with collision avoidance technique, a poll-response technique, allocated time slots of a TDMA frame, allocated frequency slots of an FDMA frame, and/or allocated code slots of a CDMA frame in one frequency spectrum or using one carrier frequency and the inter-device RF communications 90 may use a CSMA with collision avoidance technique, a poll-response technique, allocated time slots of a TDMA frame, allocated frequency slots of an FDMA frame, and/or allocated code slots of a CDMA frame in another frequency spectrum or using another carrier frequency.

Figure 13:
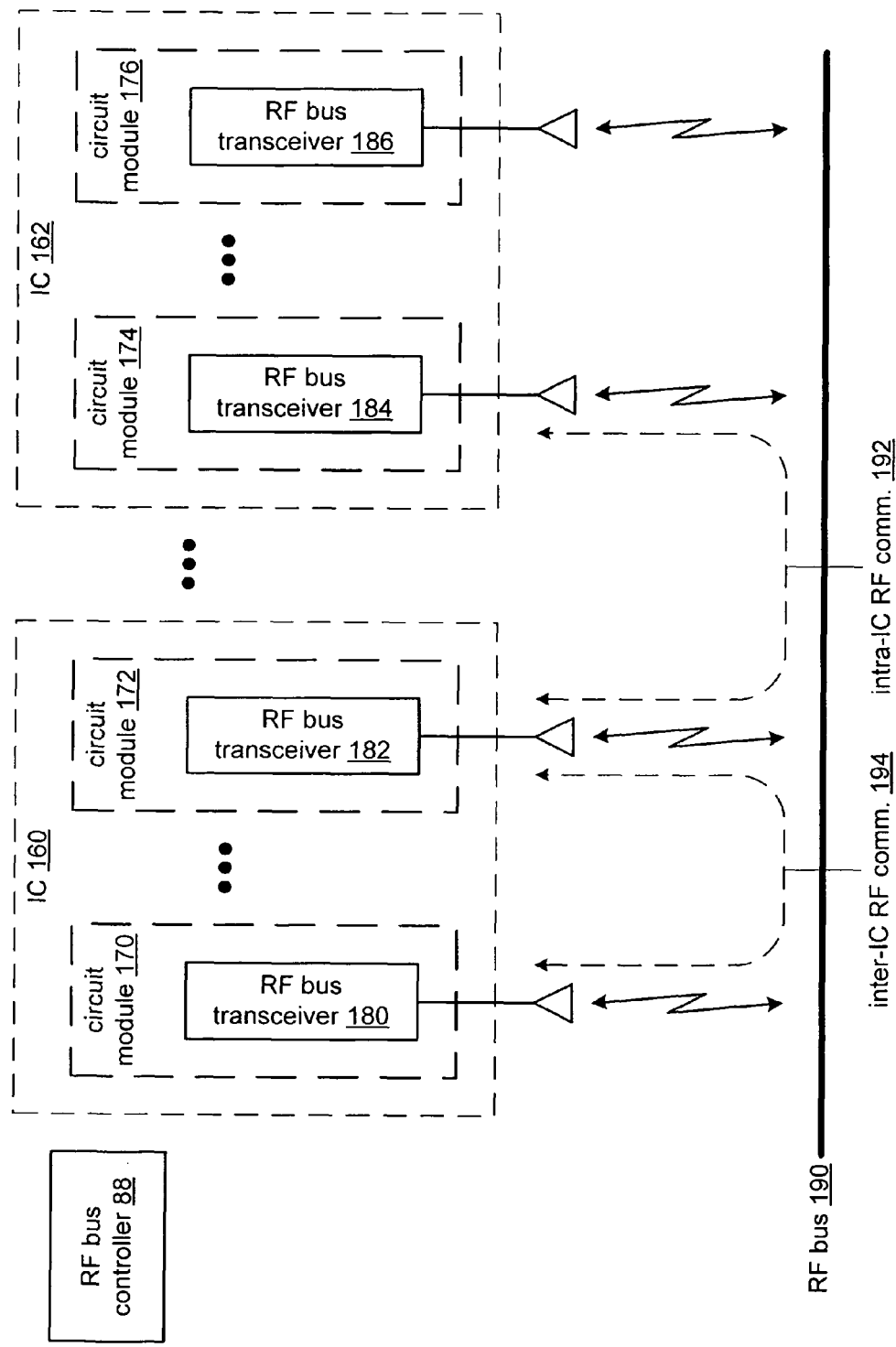

FIG. 13 is a schematic block diagram of another embodiment of the device 80 that includes a plurality of integrated circuits (ICs) 160, 162, the RF bus controller 88, and an RF bus 190. Each of the ICs 160, 162 includes a plurality of circuit modules 170-176 and each of the circuit modules 170-176 includes a radio frequency (RF) bus transceiver 180-186. The circuit modules 170-176 may be any type of digital circuit, analog circuit, logic circuit, and/or processing circuit that can be implemented on an IC. For example, one of the circuit modules 170-176 may be, but is not limited to, a microprocessor, a component of a microprocessor, cache memory, read only memory, random access memory, programmable logic, digital signal processor, logic gate, amplifier, multiplier, adder, multiplexor, etc.

In this embodiment, the RF bus controller 88, which may be a separate IC or contained with one of the ICs 160-162, controls intra-IC RF communications 192 between circuit modules 170-176 of different ICs 160, 162 and controls inter-IC RF communications 194 between circuit modules 170-172 or 174-176 of the same IC. In this manner, at least some of the communication between ICs and between circuit modules of an IC is done wirelessly via the RF bus transceivers 180-186. Note that the circuit modules 170-172 may also be inter-coupled with one or more traces within the IC 160, the circuit modules 174-176 may also be inter-coupled with one or more traces within the IC 162, and that IC 160 may be coupled to IC 162 via one or more traces on a supporting substrate (e.g., a printed circuit board).

The intra-IC RF communications 192 and the inter-IC RF communications 194 may be RF data communications, RF instruction communications, RF control signal communications, and/or RF input/output communications. For example, data, control, operational instructions, and/or input/output communications (e.g., analog input signals, analog output signals, digital input signals, digital output signals) that are traditionally conveyed between ICs via traces on a printed circuit board are at least partially transmitted by the RF bus transceivers 180-186 via the RF bus 190.

The intra-IC RF communications 192 and/or the inter-IC RF communications 194 may also include operating system level communications and application level communications. The operating system level communications are communications that correspond to resource management of the device 80, loading and executing applications (e.g., a program or algorithm), multitasking of applications, protection between applications, device start-up, interfacing with a user of the device, etc. The application level communications are communications that correspond to the data conveyed, operational instructions conveyed, and/or control signals conveyed during execution of an application.

The RF bus 190 may be one or more of a free-space RF communication path 96, a waveguide RF communication path 98, and/or a dielectric RF communication path 100. For example, the RF bus 190 may include at least one data RF bus, at least one instruction RF bus, and at least one control RF bus for intra-IC RF communications 192 and the inter-IC RF communications 194. In this example, intra-IC RF data communications 192 may occur over a free-space RF communication path 96, while the intra-IC RF instruction and/or control communications 192 may occur over a waveguide RF communication path 98 and/or a dielectric RF communication path 100 within the IC 160 or 162. Further, inter-IC RF data communications 194 may occur over a free-space RF communication path 96, while the intra-IC RF instruction and/or control communications 194 may occur over a waveguide RF communication path 98 and/or a dielectric RF communication path 100 within a supporting substrate of the ICs 160-162. As an alternative example, the inter- and intra-IC communications 192-194 may occur over multiple waveguide RF communication paths, multiple dielectric RF communication paths, and/or multiple free-space RF communication paths (e.g., use different carrier frequencies, distributed frequency patterns, TDMA, FDMA, CDMA, etc.).

Figure 14:
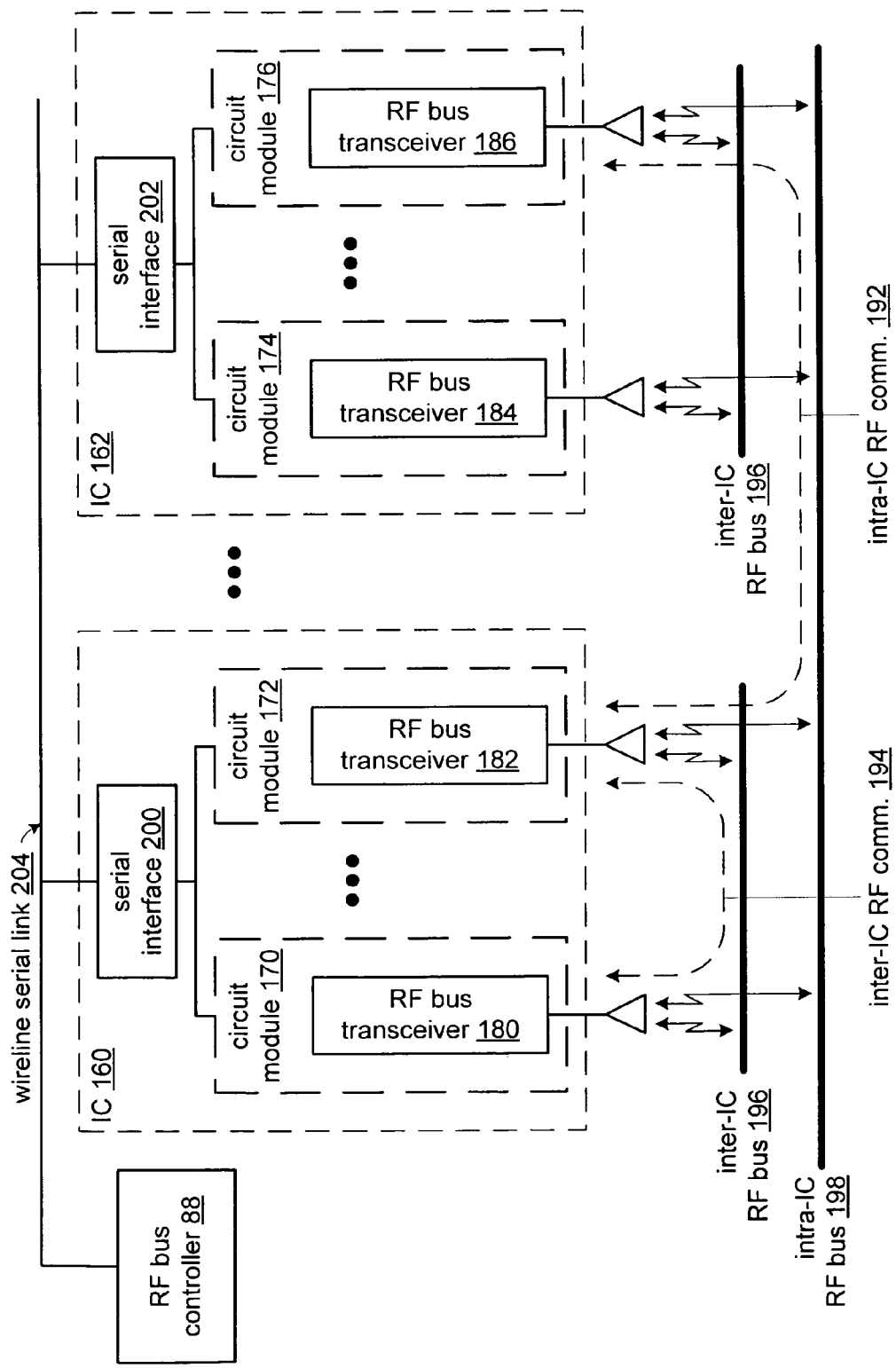

FIG. 14 is a schematic block diagram of another embodiment of the device 80 that includes a plurality of integrated circuits (ICs) 160, 162, the RF bus controller 88, a plurality of inter-IC RF buses 196, and an intra-IC RF bus 198. Each of the ICs 160, 162 includes a plurality of circuit modules 170-176 and a serial interface module 200-202. Each of the circuit modules 170-176 includes a radio frequency (RF) bus transceiver 180-186.

In this embodiment, the RF bus controller 88 is coupled to the ICs 160-162 via a wireline serial link 204 to control access to the inter-IC RF buses 196 and to the intra-IC RF bus 198. For instance, when a circuit module 170-176 has data to transmit to another circuit module 170-176 of the same IC or of a different IC, the requesting circuit module 170-176 provides an RF bus request to the RF bus controller 88 via the wireline serial link 204 and the corresponding serial interface module 200-202. The serial link 204 and the corresponding serial interface modules 200-202 may be a standardized protocol, a de-facto standard protocol, or a proprietary protocol. For example, the serial link 204 may be a universal serial bus (USB), an IEEE 1394 link, an I2C link, an I2S link, etc.

The RF bus controller 88 processes the RF bus request, as will be described in greater detail with reference to FIGS. 49-55, to determine at least one of whether the requester needs access to one of the plurality of inter-IC RF buses 196 or to the intra-IC RF bus 198, how much data it has to send, the type of the data, the location of the target circuit module(s), the priority of the requester, the priority of the data, etc. When the RF bus controller 88 has determined how and when the requester is to access the RF bus 196 and/or 198, the RF bus controller 88 provides an RF bus grant to the requestor via the wireline link 204.

As shown, the intra-IC RF bus 198 supports intra-IC RF communications 194 and the plurality of inter-IC RF buses 196 support corresponding inter-IC RF communications 192. In this manner, multiple inter-IC RF communications 192 may be simultaneously occurring and may also occur simultaneously with one or more intra-IC RF communications 194.

Figure 15:
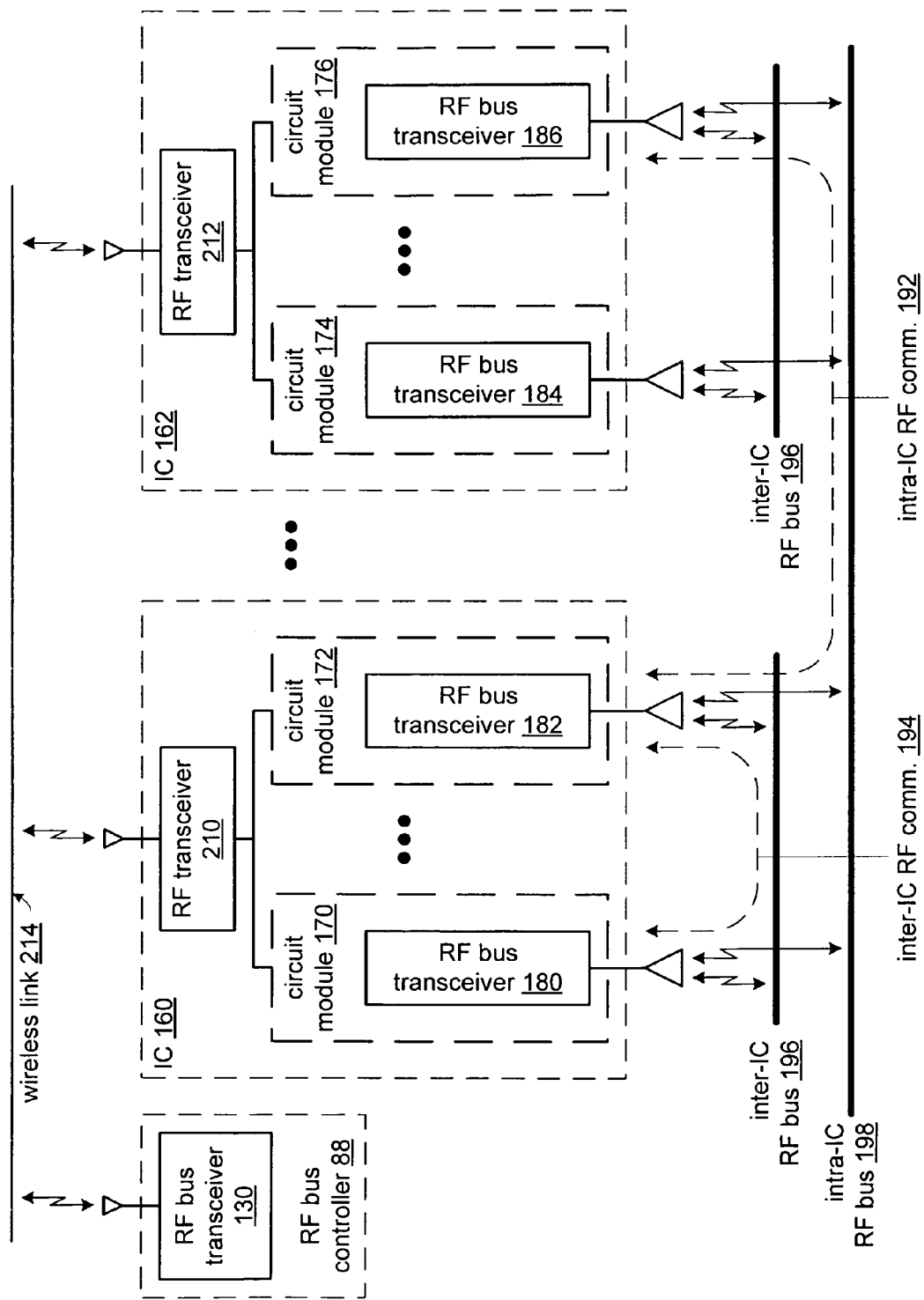

FIG. 15 is a schematic block diagram of another embodiment of the device 80 that includes a plurality of integrated circuits (ICs) 160, 162, the RF bus controller 88, a plurality of inter-IC RF buses 196, and an intra-IC RF bus 198. Each of the ICs 160, 162 includes a plurality of circuit modules 170-176 and an RF transceiver 210-212. Each of the circuit modules 170-176 includes a radio frequency (RF) bus transceiver 180-186 and the RF bus controller 88 includes the RF bus transceiver 130.

In this embodiment, the RF bus controller 88 is coupled to the ICs 160-162 via a wireless link 214 to control access to the inter-IC RF buses 196 and to the intra-IC RF bus 198. For instance, when a circuit module 170-176 has data to transmit to another circuit module 170-176 of the same IC or of a different IC, the requesting circuit module 170-176 provides an RF bus request to the RF bus controller 88 via the wireless link 214 and the RF transceiver 210-212. The wireless link 214 and the corresponding RF transceivers 210-212 may be a standardized protocol, a de-facto standard protocol, or a proprietary protocol.

The RF bus controller 88 processes the RF bus request, as will be described in greater detail with reference to FIGS. 49-55, to determine at least one of whether the requestor needs access to one of the plurality of inter-IC RF buses 196 or to the intra-IC RF bus 198, how much data it has to send, the type of the data, the location of the target circuit module(s), the priority of the requestor, the priority of the data, etc. When the RF bus controller 88 has determined how and when the requester is to access the RF bus 196 and/or 198, the RF bus controller 88 provides an RF bus grant to the requestor via the wireless link 214.

In one embodiment, the RF bus transceiver 130 operates within a first frequency band and the intra-IC RF communications 192 and the inter-IC RF communications 194 occur within the first frequency band. In this instance, the RF bus controller 88 allocates at least one communication slot to the wireless interface link 214, allocates at least one other communication slot for the intra-IC RF communications 192, and allocates at least another communication slot for the inter-IC RF communications 194. The communication slots may be time division multiple access (TDMA) slots, frequency division multiple access (FDMA) slot, and/or code division multiple access (CDMA) slots.

In another embodiment, the RF bus transceiver 130 operates within a first frequency band, the intra-IC RF communications 192 occur within the first frequency band, and the inter-IC RF communications 194 occur within a second frequency band. In this instance, the RF bus controller 88 allocates at least one communication slot in the first frequency band to the wireless link 214 and allocates at least one other communication slot in the first frequency band for the intra-IC RF communications 192. The communication slots may be time division multiple access (TDMA) slots, frequency division multiple access (FDMA) slot, and/or code division multiple access (CDMA) slots.

In another embodiment, the RF bus transceiver 130 operates within a first frequency band, the inter-IC RF communications 194 occur within the second frequency band, and the intra-IC RF communications 192 occur within the frequency band. In this instance, the RF bus controller 88 allocates at least one communication slot in the second frequency band to the wireless link 214 and allocates at least one other communication slot in the second frequency band for the inter-IC RF communications 194. The communication slots may be time division multiple access (TDMA) slots, frequency division multiple access (FDMA) slot, and/or code division multiple access (CDMA) slots.

In another embodiment, the RF bus transceiver 130 operates within a first frequency band, the intra-IC RF communications 192 occur within the second frequency band, and the inter-IC RF communications 194 occur within a third frequency band. With the different types of communication (e.g., RF bus access, inter-IC, and intra-IC) occurring within different frequency bands, the different types of communication may occur simultaneously with minimal interference from each other.

Figure 16:
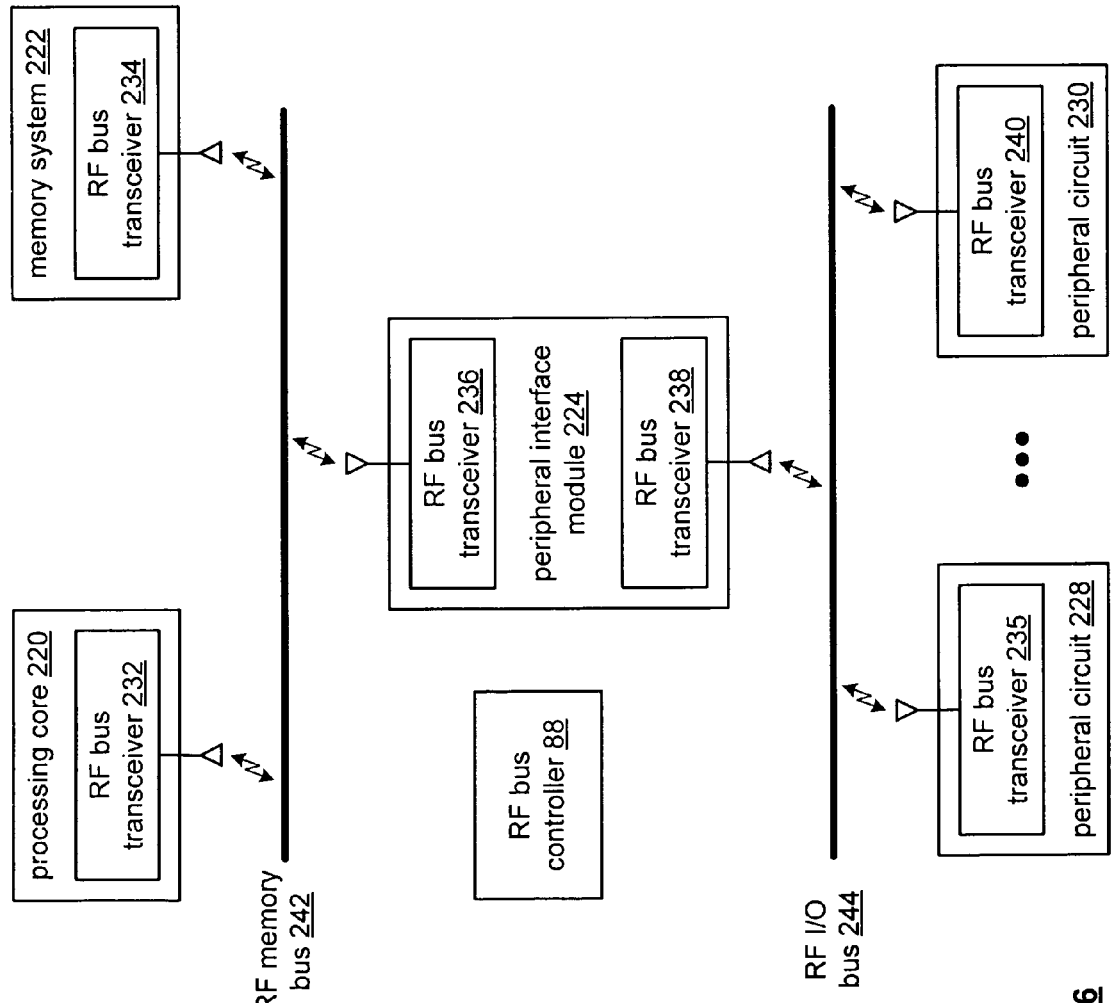

FIG. 16 is a schematic block diagram of another embodiment of the device 80 that includes the RF bus controller 88, a processing core 220, a memory system 222, a peripheral interface module 224, a plurality of peripheral circuits 228-230, an RF memory bus 242, and an RF I/O bus 244. Each of the processing core 220, the memory system 222, the peripheral interface module 224, and the plurality of peripheral circuits 228-230 includes one or more RF bus transceivers 232-240. The plurality of peripheral circuits 228-230 includes two or more of a hard disk drive, a compact disk (CD) drive, a digital video disk (DVD) drive, a video card, an audio card, a wireline network card, a wireless network card, a universal subscriber identity module (USIM) interface and/or security identification module (SIM) card, a USB interface, a display interface, a secure digital input/output (SDIO) interface and/or secure digital (SD) card or multi-media card (MMC), a coprocessor interface and/or coprocessor, a wireless local area network (WLAN) interface and/or WLAN transceiver, a Bluetooth interface and/or Bluetooth transceiver, a frequency modulation (FM) interface and/or FM tuner, a keyboard interface and/or keyboard, a speaker interface and/or a speaker, a microphone interface and/or a microphone, a global positioning system (GPS) interface and/or a GPS receiver, a camera interface and/or an image sensor, a camcorder interface and/or a video sensor, a television (TV) interface and/or a TV tuner, a Universal Asynchronous Receiver-Transmitter (UART) interface, a Serial Peripheral Interface (SPI) interface, a pulse code modulation (PCM) interface, etc.

In this embodiment, the peripheral interface module 224 includes a first RF bus transceiver 236 and a second RF bus transceiver 238. The first RF bus transceiver 236 communicates via the RF memory bus 242 and the second RF bus transceiver communicates via the RF I/O bus 244. In this instance, the peripheral interface module 224 functions as an interface for one of the plurality of peripheral circuits 228-230 to communicate with the processing core 220 and/or the memory system 222 via the RF memory bus 242.

The RF bus controller 88, which may be coupled to the processing core 220, the memory system 222 and the peripheral interface module 224 via a wireline serial link and/or a wireless link, controls access to the RF input/output bus 244 among the plurality of peripheral circuits 228-230 and the peripheral interface module 224 and controls access to the RF memory bus 242 among the processing core 220, the memory system 222, and the peripheral interface module 224. Note that the RF input/output bus 244 supports at least one of: RF peripheral data communications, RF peripheral instruction communications, and RF peripheral control signal communications, where the RF peripheral control signal communications includes an RF interrupt request communication, and/or an RF interrupt acknowledgement communication.

The RF memory bus 242 supports at least one of: RF memory data communications, RF memory instruction communications, and RF memory control signal communications. The RF memory bus may further support RF operating system level communications and RF application level communications.

Figure 17:
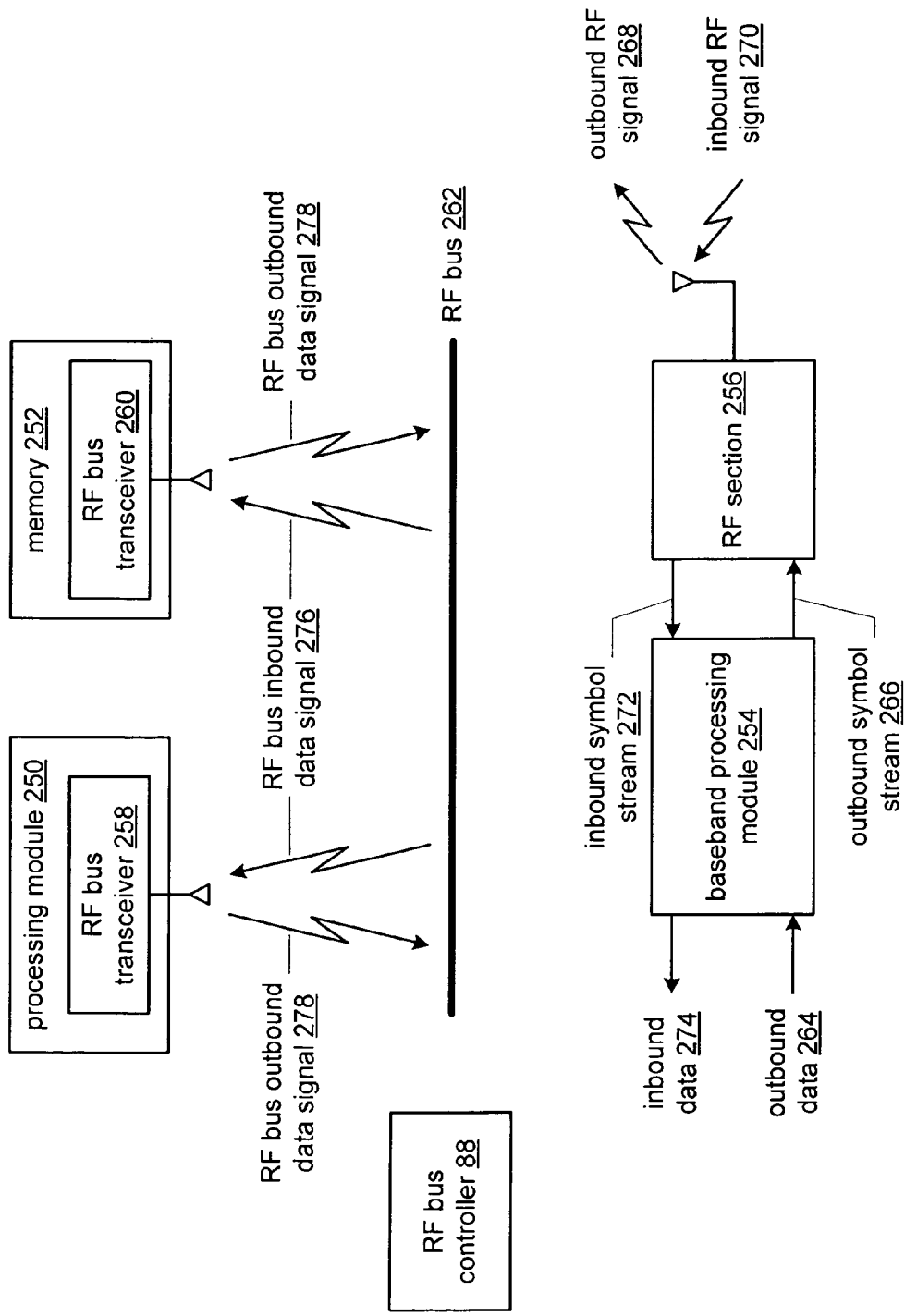
FIGS. 17-19 are schematic block diagrams of embodiments of an RF transceiver device in accordance with the present invention.

FIG. 17 is a schematic block diagram of an embodiment of an RF transceiver device that includes a processing module 250, memory 252, a baseband processing module 254, an RF section 256, the RF bus controller 88 and an RF bus 262. The processing module 250 includes a processing module RF bus transceiver 258 and the memory includes a memory RF bus transceiver 260. The processing module 250 and the baseband processing module 254 may be the same processing module or different processing modules, where a processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element (e.g., memory 252), which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module executes, hard coded and/or operational instructions corresponding to at least some of the steps and/or functions illustrated in FIGS. 17-25.

The baseband processing module 254 is coupled to convert outbound data 264 into an outbound symbol stream 266. This may be done in accordance with one or more wireless communication protocols including, but not limited to, IEEE 802.11, Bluetooth, GSM, RFID, CDMA, Enhanced Data rates for GSM Evolution (EDGE), General Packet Radio Service (GPRS), new and/or current versions thereof, modifications thereof, extensions thereof, combinations thereof, new WLAN standards, new cellular voice and/or data standards, and/or new wireless personal area networks (WPAN).

The RF section 256 converts the outbound symbol stream 266 into an outbound RF signal 268. In an embodiment, the RF section 256 includes a digital to analog conversion module, an up-conversion module, and a power amplifier module. The digital to analog conversion module converts the outbound symbol stream 266 into an analog symbol stream. The up-conversion module, which may be a direct conversion module or a superheterodyne module, mixes the analog symbol stream with a local oscillation to produce an up-converted signal. The power amplifier module amplifies the up-converted signal to produce the outbound RF signal 268. In another embodiment, the up-conversion module modulates phase of the local oscillation based on phase information of the analog symbol stream to produce the up-converted signal. The power amplifier module amplifies the up-converted signal based on a constant amplifier factor or based on amplitude modulation information of the analog symbol stream to produce the outbound RF signal 268.

The RF section 256 is also coupled to and to convert an inbound RF signal 270 into an inbound symbol stream 272. In one embodiment, the RF section 256 includes a low noise amplifier module, a down-conversion module, and an analog to digital conversion module. The low noise amplifier module amplifies the inbound RF signal 270 to produce an amplified inbound RF signal. The down conversion module, which may a direction conversion module or a superheterodyne module, mixes the amplified inbound RF signal with a local oscillation to produce an analog inbound symbol stream. The analog to digital conversion module converts the analog inbound symbol stream into the inbound symbol stream 272.

The baseband processing module 254 is also coupled to convert the inbound symbol stream 272 into inbound data 274. This may be done in accordance with one or more wireless communication protocols including, but not limited to, IEEE 802.11, Bluetooth, GSM, RFID, CDMA, Enhanced Data rates for GSM Evolution (EDGE), General Packet Radio Service (GPRS), new and/or current versions thereof, modifications thereof, extensions thereof, combinations thereof, new WLAN standards, new cellular voice and/or data standards, and/or new wireless personal area networks (WPAN). Note that the inbound and outbound data 264, 274 may be voice signals, audio signals, video signals, text signals, graphics signals, short messaging signals, cellular data signals, etc.

The RF bus controller 88 is coupled to control access to the RF bus 262, which may include one or more waveguide RF communication paths, one or more dielectric RF communication paths, and/or one or more free-space RF communication paths. In one embodiment, the processing module 250 generates the outbound data 264, which is converted into an RF bus outbound data signal 278 by the RF bus transceiver 258. The RF bus controller 88 controls conveyance of the RF bus outbound data signal 278 on the RF bus 262. In another embodiment, the memory 252 provides the outbound data 264, which is converted into the RF bus outbound data signal 278 by the RF bus transceiver 260.

The RF bus controller 88 further functions to control access to the RF bus 262 for providing the inbound data 274 as an RF bus inbound data signal 276 to the processing module RF bus transceiver 258 or to the memory RF bus transceiver 260. Note that in an embodiment of the RF transceiver device, the baseband processing module 254 is coupled to the RF section 256 via a wireless digital-RF interface.

Figure 18:
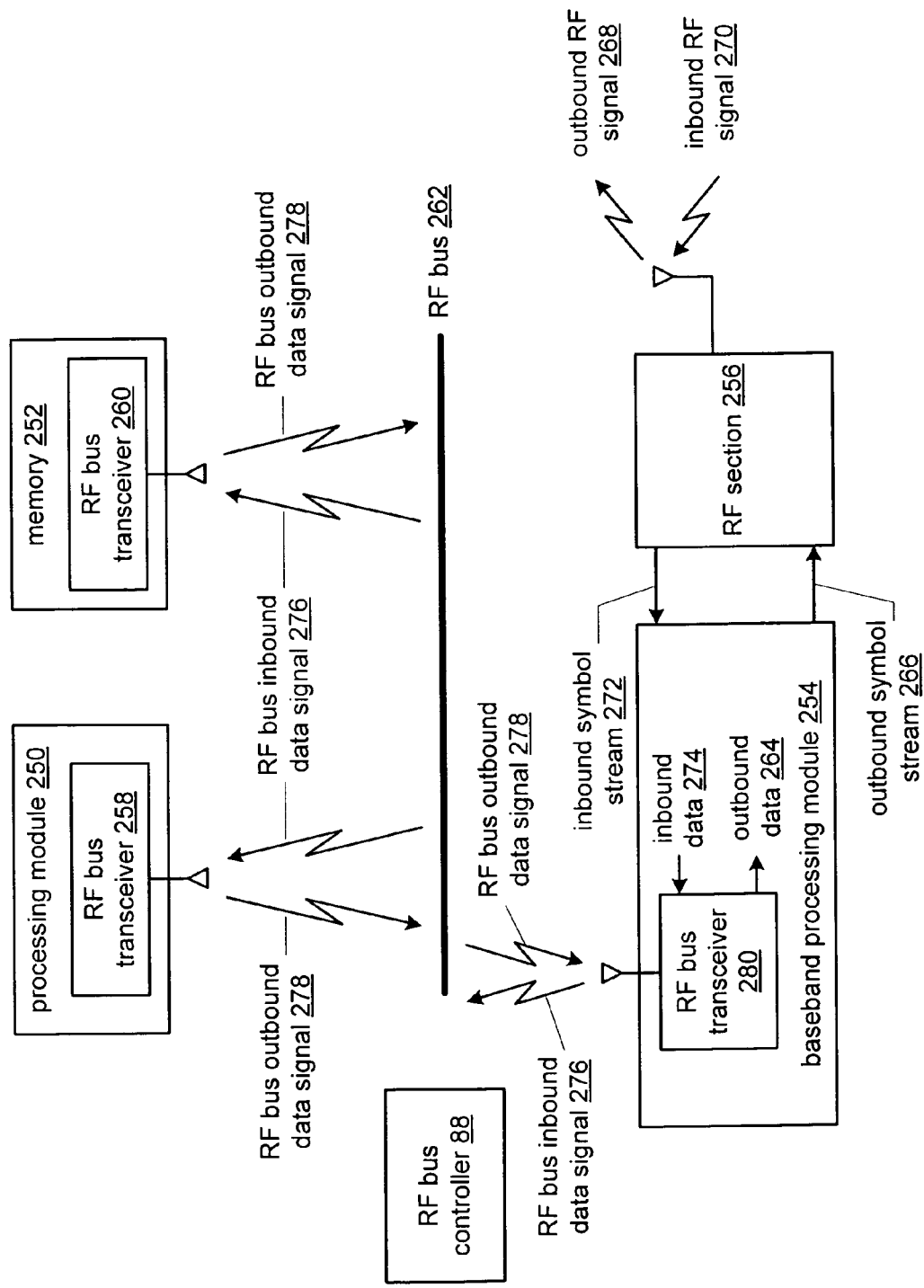

FIG. 18 is a schematic block diagram of an embodiment of an RF transceiver device that includes a processing module 250, memory 252, a baseband processing module 254, an RF section 256, the RF bus controller 88 and an RF bus 262. The processing module 250 includes a processing module RF bus transceiver 258 and the memory includes a memory RF bus transceiver 260. In this embodiment, the baseband processing module 254 includes an RF bus transceiver 280, which converts the inbound data 274 into the RF bus inbound data signal 276 and converts the RF bus outbound data signal 278 into the outbound data 264.

Figure 19:
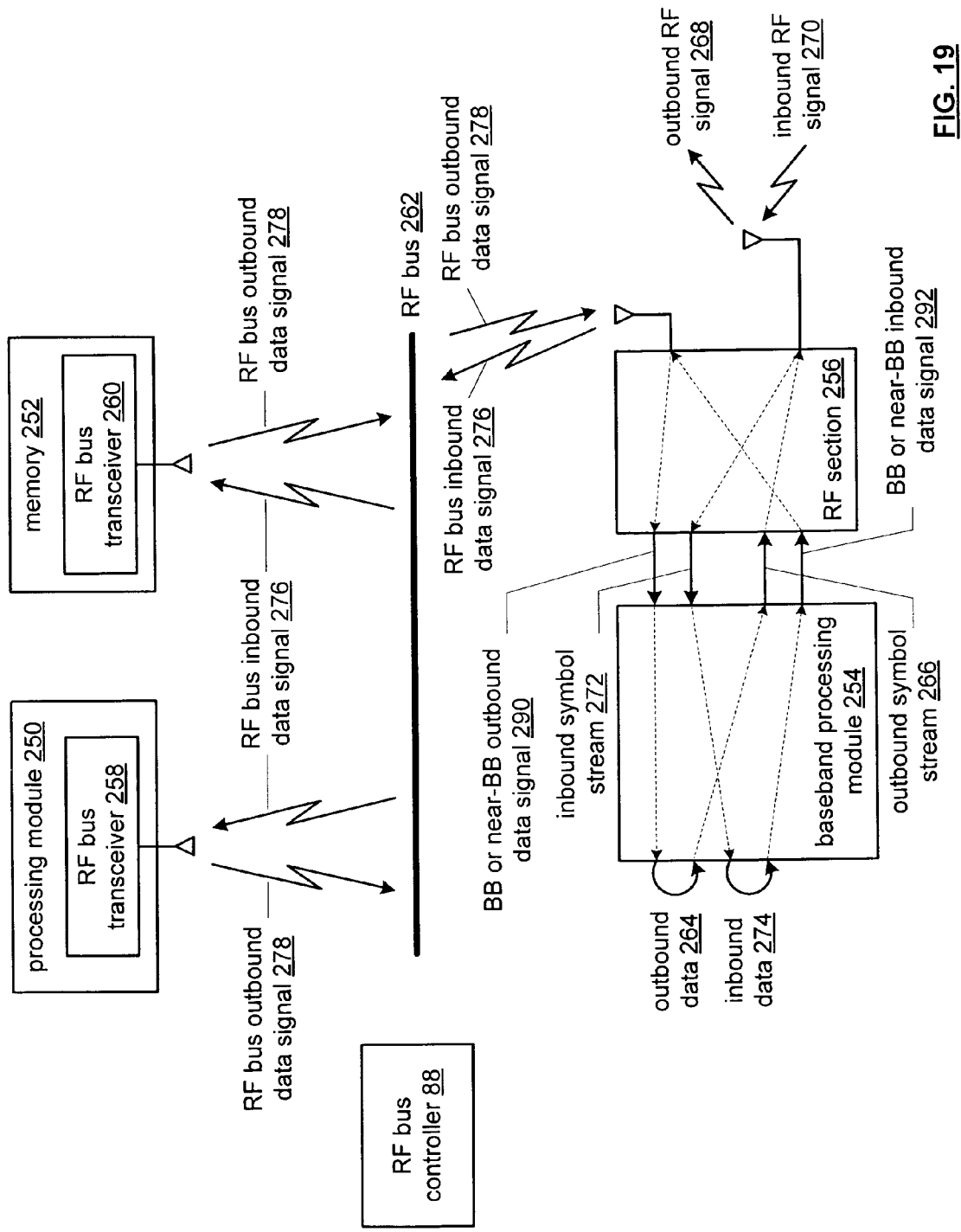

FIG. 19 is a schematic block diagram of an embodiment of an RF transceiver device that includes a processing module 250, memory 252, a baseband processing module 254, an RF section 256, the RF bus controller 88 and an RF bus 262. The processing module 250 includes a processing module RF bus transceiver 258 and the memory includes a memory RF bus transceiver 260. In this embodiment, the RF section 256 receives the RF bus outbound data signal 278 and converts it into a baseband (BB) or near baseband outbound data signal 290, which has a carrier frequency of 0 Hz to a few MHz. Note that the RF section 256 may be coupled to multiple antennas (as shown) or may be coupled to a single antenna.

The baseband processing module 254 converts the baseband or near baseband outbound data signal 290 into the outbound data 264 in accordance with a standardized wireless communication protocol (e.g., GSM, EDGE, GPRS, CDMA, IEEE 802.11 Bluetooth), a modified standard wireless communication protocol (e.g., a modified version of GSM, EDGE, GPRS, CDMA, IEEE 802.11 Bluetooth), or a proprietary wireless communication protocol (e.g., non-return to zero encode/decode, bi-phase encode/decode). The baseband processing module 254 then converts the outbound data 264 into the outbound symbol stream 266, which is converted into the outbound RF signal 268 by the RF section 256.

The RF section 256 receives the inbound RF signal 270 and converts it into the inbound symbol stream 272. The baseband processing module 254 converts the inbound symbol stream 272 into the inbound data 274 and then converts the inbound data 274 into a baseband or near baseband inbound data signal 292. The RF section 256 converts the baseband or near baseband inbound data signal 292 into the RF bus inbound data signal 276. Note that in an embodiment the baseband processing module converts the outbound data 264 into the outbound symbol stream 266 and converts the inbound symbol stream 272 into the inbound data 274 in accordance with one or more of a wireless personal area network (WPAN) protocol (e.g., Bluetooth), a wireless local area network (WLAN) protocol (e.g., IEEE 802.11), a cellular telephone voice protocol (e.g., GSM, CDMA), a cellular telephone data protocol (e.g., EDGE, GPRS), an audio broadcast protocol (e.g., AM/FM radio), and a video broadcast protocol (e.g., television).

In the various embodiments of an RF transceiver device as discussed with reference to FIGS. 17-19, the inbound and outbound RF signals 268 and 270 may be in the same frequency band or a different frequency band than the RF bus inbound and outbound data signals 276 and 278. For example, the inbound and outbound RF signals 268 and 270 may have a carrier frequency in a 2.4 GHz or 5 GHz frequency band while the RF bus inbound and outbound data signals 276 and 278 may have a carrier frequency in a 60 GHz frequency band. As another example, the inbound and outbound RF signals 268 and 270 and the RF bus inbound and outbound data signals 276 and 278 may have a carrier frequency in a 60 GHz frequency band. When the signals 268, 270, 276, and 278 are in the same frequency band, the frequency band may be shared to minimize interference between the different signals.

FIG. 20 is a diagram of an example of a frame of an RF transceiver device wireless communication that shares a frequency band and minimizes interference between the different signals 268, 270, 276, and 278. In this example, the frame includes an inbound RF signal slot 300, an RF bus inbound data signal slot 302, an RF bus outbound data signal 304, and an outbound RF signal 306. The slots 300-306 may be TDMA slots, CDMA slots, or FDMA slots, which may be reallocated on a frame by frame basis by the RF bus controller 88. For example, the processing module 250 and/or the baseband processing module 254 may request one or more slots from the RF bus controller 88 for the inbound RF signal 270, the outbound RF signal 268, the RF bus inbound data signal 276, and/or the RF bus outbound data signal 278. Note that the frame may include an additional slot for bus access communications if the RF bus requests and RF bus grants are communicated wirelessly within the same frequency band as the signals 268, 270, 276, and 278.

FIG. 21 is a logic diagram of an embodiment of a method of resource allocation for an intra-device wireless communication that begins at step 310 where the processing module 250 and/or the baseband processing module 254 determine a potential overlapping of one of the RF bus inbound data signal 276 and the RF bus outbound data signal 278 with one of the inbound RF signal 270 and the outbound RF signal 268. In this embodiment, the signals 268, 270, 276, and 278 may be transmitted and/or received at any time without a structured ordering of the signals (in other words, the signals do not have allocated slots). If a potential overlap is not detected (i.e., the transmission or reception of one signal will not interfere with the transmission or reception of another signal), the process proceeds to step 312 where the RF bus communication (e.g., the RF bus inbound or outbound data signal 276 or 278) or the inbound or outbound RF signal 270 or 268 is transmitted or received.

If a potential overlap is detected, the process proceeds to step 314 where the frequency and/or phase of the RF bus inbound data signal 276 and/or of the RF bus outbound data signal 278 is adjusted. For example, if a potential overlap is detected, the phase of the RF bus communications (e.g., signals 276 or 278) may be adjusted to be orthogonal with the inbound or outbound RF signals 270 or 268 thereby substantially reducing the received signal strength of the orthogonal signal. As another example, the carrier frequency may be adjusted by a frequency offset such that it has a different carrier frequency than the inbound or outbound RF signal 270 or 268.

The process then proceeds to step 316 where blocking of the inbound RF signal 270 or the outbound RF signal 268 for the RF bus communication is enabled. As such, by adjusting the phase and/or frequency of the RF bus communication, the inbound or outbound RF signal 270 or 268 may be treated as an interferer with respect to the RF bus communications that can be substantially blocked. Thus, if a potential overlap exists, the RF bus communications are adjusted such that they experience acceptable levels of interference from the inbound or outbound RF signals.

Figure 22:
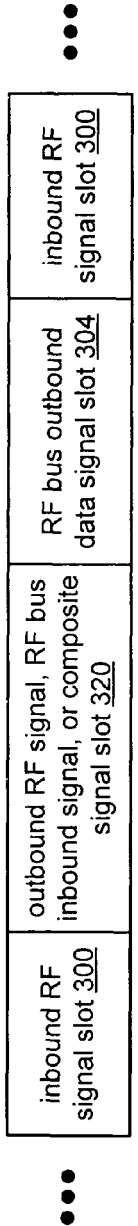
FIG. 22 is a diagram of another example of a frame of an RF transceiver device wireless communication in accordance with the present invention.

FIG. 22 is a diagram of another example of a frame of an RF transceiver device wireless communication that shares a frequency band and minimizes interference between the different signals 268, 270, 276, and 278. In this example, the frame includes the inbound RF signal slot 300; an outbound RF signal, an RF bus inbound data signal, or composite signal slot 320, and the RF bus outbound data signal 304. The slots 300, 320, and 304 may be TDMA slots, CDMA slots, or FDMA slots, which may be reallocated on a frame by frame basis by the RF bus controller 88. Note that the frame may include an additional slot for bus access communications if the RF bus requests and RF bus grants are communicated wirelessly within the same frequency band as the signals 268, 270, 276, and 278.

In this example, the baseband processing module 254 processes the data for the outbound RF signal 268 and the RF bus inbound data signal 276. As such, the baseband processing module 254 has knowledge of which signal it is processing and thus can request allocation of a resource for the appropriate signal (e.g., 268 or 276). In addition, the baseband processing module 254 may simultaneously process the data for the outbound RF signal 268 and the RF bus inbound data signal 276 via a composite signal.

Figure 23:
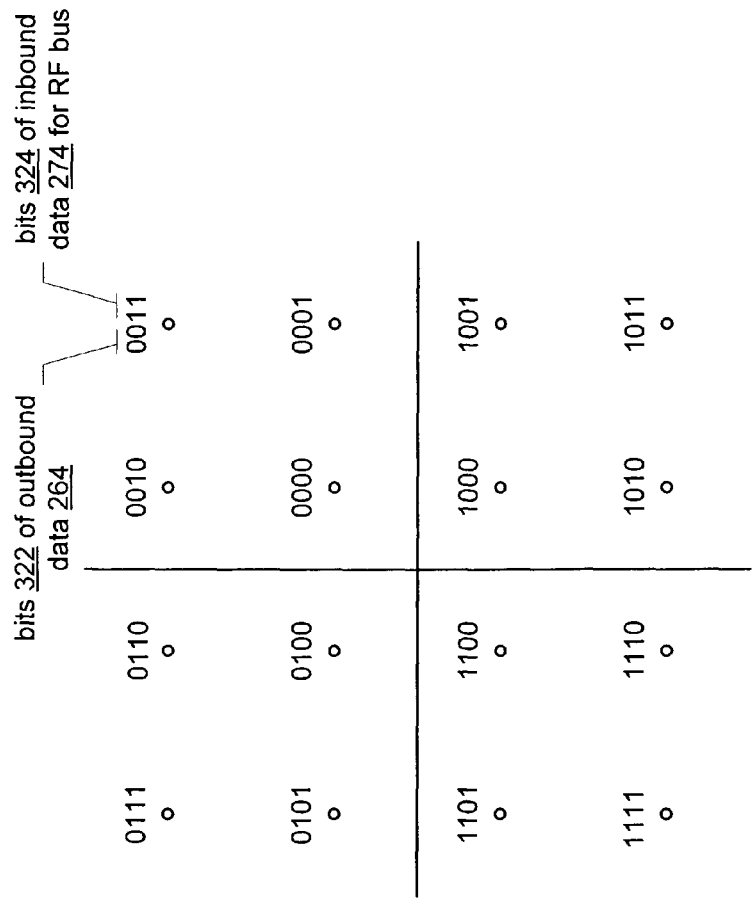
FIG. 23 is a diagram of an example of mapping data of an RF transceiver device wireless communication in accordance with the present invention.

FIG. 23 is a diagram of an example of mapping data of an RF transceiver device wireless communication into a composite signal. In this example, the baseband processing module 254 combines bits 322 of the outbound data 264 and bits 324 of the inbound data 274 to produce composite data. In this example, the bits 322 of the outbound data 264 are least significant bits of the composite data and the bits 324 of the inbound data 274 are most significant bits of the composite data. The baseband processing module then encodes the composite data to produce encoded data; interleaves the encoded data to produce interleaved data; maps the interleaved data to produce mapped data; and converts the mapped data from the frequency domain to the time domain to produce a baseband or near baseband composite outbound data signal. The RF section 256 converts the baseband or near baseband composite outbound data signal into a composite outbound RF signal, wherein the composite outbound RF signal includes the outbound RF signal 268 and the RF bus inbound data signal 276.

The RF bus transceiver 258 or 260 receives the composite outbound RF signal, converts it into the baseband or near baseband composite outbound data signal. A baseband processing module within the RF bus transceiver 258 or 260 converts the baseband or near baseband composite outbound data signal from the time domain to the frequency domain to produce the mapped data; demaps the mapped data to produce interleaved data; deinterleaves the interleaved data to produce encoded data; and decodes the encoded data to produce the inbound data 274 and outbound data 264. The RF bus transceiver 258 or 260 is programmed to ignore the outbound data 264 bits of the composite data such that the resulting recovered data from the composite outbound RF signal is the inbound data 274.

An RF transceiver within the target of the outbound RF signal 268 treats the composite outbound RF signal as a lower mapped rate outbound RF signal. As shown, the composite data is mapped using a 16 QAM (quadrature amplitude mapping scheme). A first quadrant has mapped bits of 0000, 0001, 0010, and 0011; a second quadrant has mapped bits of 0100, 0101, 0110, and 0111; a third quadrant has mapped bits of 1100, 1101, 1110, and 1111; and a fourth quadrant has mapped bits of 1000, 1001, 1010, and 1011. If the RF transceiver within the target uses a QPSK (quadrature phase shift keying), if the composite signal is within the first quadrant, the RF transceiver will interpret this as a mapped value of 00, if the composite signal is within the second quadrant, the RF transceiver will interpret this as a mapped value of 01, if the composite signal is within the third quadrant, the RF transceiver will interpret this as a mapped value of 11, and if the composite signal is within the fourth quadrant, the RF transceiver will interpret this as a mapped value of 10.

In general, since the RF bus transceivers should experience significantly greater signal integrity than the RF transceiver within the target, the RF bus transceivers can operate at a higher mapping rate than the RF transcevier within the target. As such, the baseband processing module may convert the bits 322 of the outbound data 264 and the bits 324 of the inbound data 274 into the baseband or near baseband composite outbound data signal using one of N-QAM (quadrature amplitude modulation) and N-PSK (phase shift keying), wherein N equals $2^x$ and x equals the number of bits of the outbound data 264 plus the number of bits of the inbound data 274.

Figure 24:
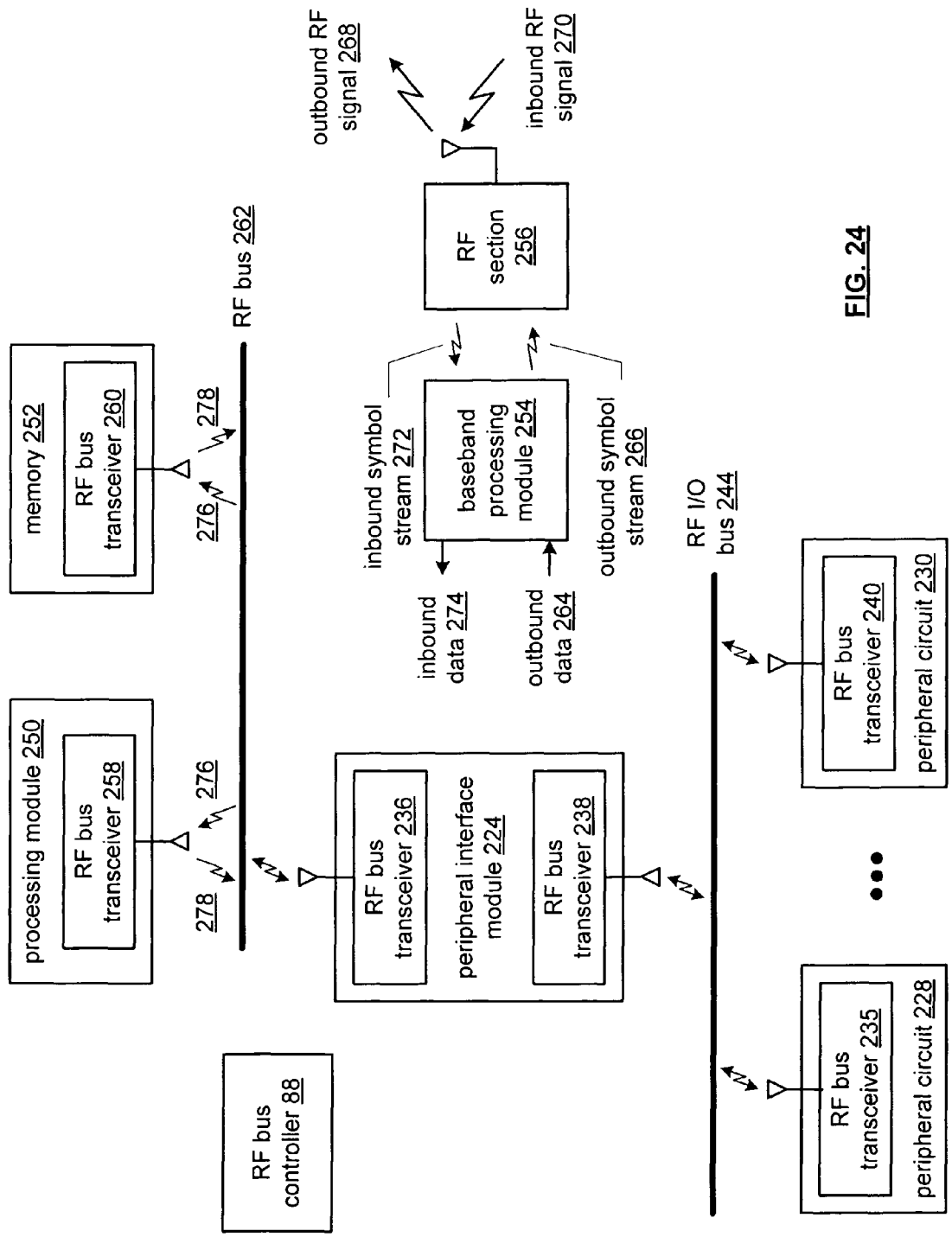
FIGS. 24 and 25 are schematic block diagrams of other embodiments of an RF transceiver device in accordance with the present invention.

FIG. 24 is a schematic block diagram of another embodiment of an RF transceiver device that includes a processing module 250, memory 252, a baseband processing module 254, an RF section 256, the RF bus controller 88, an RF bus 262, a peripheral interface module 224, an RF I/O bus 244, and a plurality of peripheral circuits 228-230. Each of the processing module 250, the memory 242, the peripheral interface module 224, and the peripheral circuits 228-230 includes at least one RF bus transceiver 235, 236, 238, 240, 258, and 260.

In this embodiment, the RF bus controller 88 controls access to the RF bus 262 for providing the RF bus outbound data signal 278 from one of the processing module RF bus transceiver 258, the memory RF bus transceiver 260, and the peripheral interface RF bus transceiver 236. The RF bus controller 88 also controls access to the RF bus 262 for providing the RF bus inbound data signal 276 to one of the processing module RF bus transceiver 258, the memory RF bus transceiver 260, and the peripheral interface RF bus transceiver 236.

The RF bus controller 88 further controls access to a peripheral I/O RF bus 244 among a plurality of peripheral circuits 228-230. In an embodiment, when access is granted to one of the plurality of peripheral circuits 228-230, it provides an inbound RF peripheral data signal to the peripheral interface RF bus transceiver 238 or receives an outbound RF peripheral data signal from the peripheral interface RF bus transceiver 238. The inbound or outbound RF peripheral data signal may data from the processing module 250, may be data from the memory 252, may be the RF bus inbound data signal 276, may be the RF bus outbound data signal 278, may be the inbound data 274, and/or may be the outbound data 264.

Figure 25:
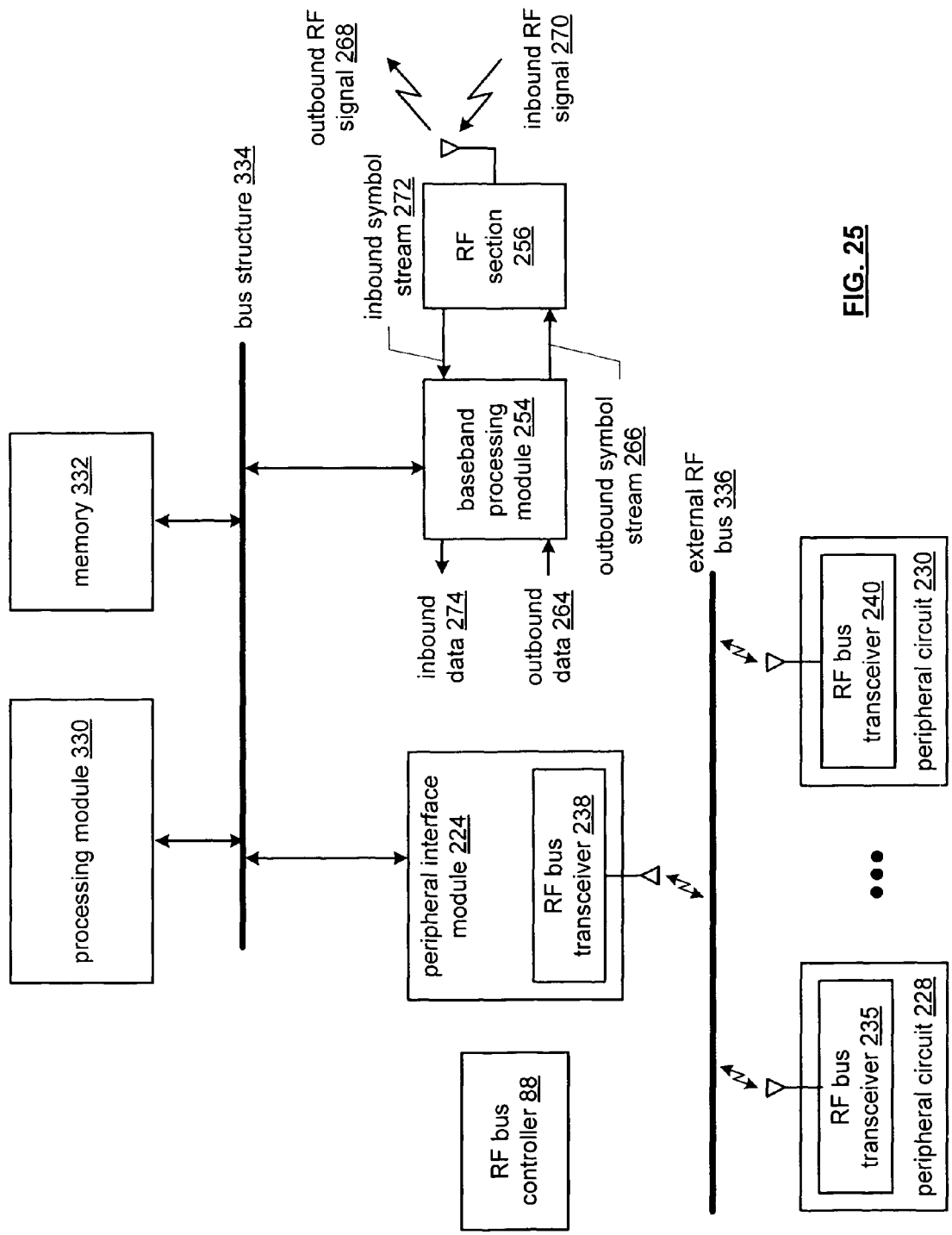

FIG. 25 is a schematic block diagram of another embodiment of an RF transceiver device that includes a processing module 330, memory 332, a baseband processing module 254, an RF section 256, the RF bus controller 88, a bus structure 334, a peripheral interface module 224, an external RF bus 336, and a plurality of peripheral circuits 228-230. Each of the peripheral interface module 224 and the peripheral circuits 228-230 includes at least one RF bus transceiver 235, 238, and 240. The processing module 330 and the baseband processing module 254 may be the same processing module or different processing modules, where a processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element (e.g., memory 332), which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

In this embodiment, the processing module 330, the memory 332, the baseband processing module 254, and the peripheral interface module 224 are coupled together via a bus structure 334, which may be an advanced high-performance (AHB) bus matrix. As such, data between these modules occurs with the bus. The peripheral interface module 224 is coupled to the plurality of peripheral circuits 228-230 via the external RF bus 336, which may be one or more waveguide RF communication paths, one or more dielectric RF communication paths, and/or one or more free-space RF communication paths.

In this instance, the RF bus controller 88 controls access the external RF bus 336 among a plurality of peripheral circuits 228-230. In an embodiment, when access is granted to one of the plurality of peripheral circuits 228-230, it provides an inbound RF peripheral data signal to the peripheral interface RF bus transceiver 238 or receives an outbound RF peripheral data signal from the peripheral interface RF bus transceiver 238. The inbound or outbound RF peripheral data signal may data from the processing module 330, may be data from the memory 332, may the inbound data 274, and/or may be the outbound data 264.

Figure 26:
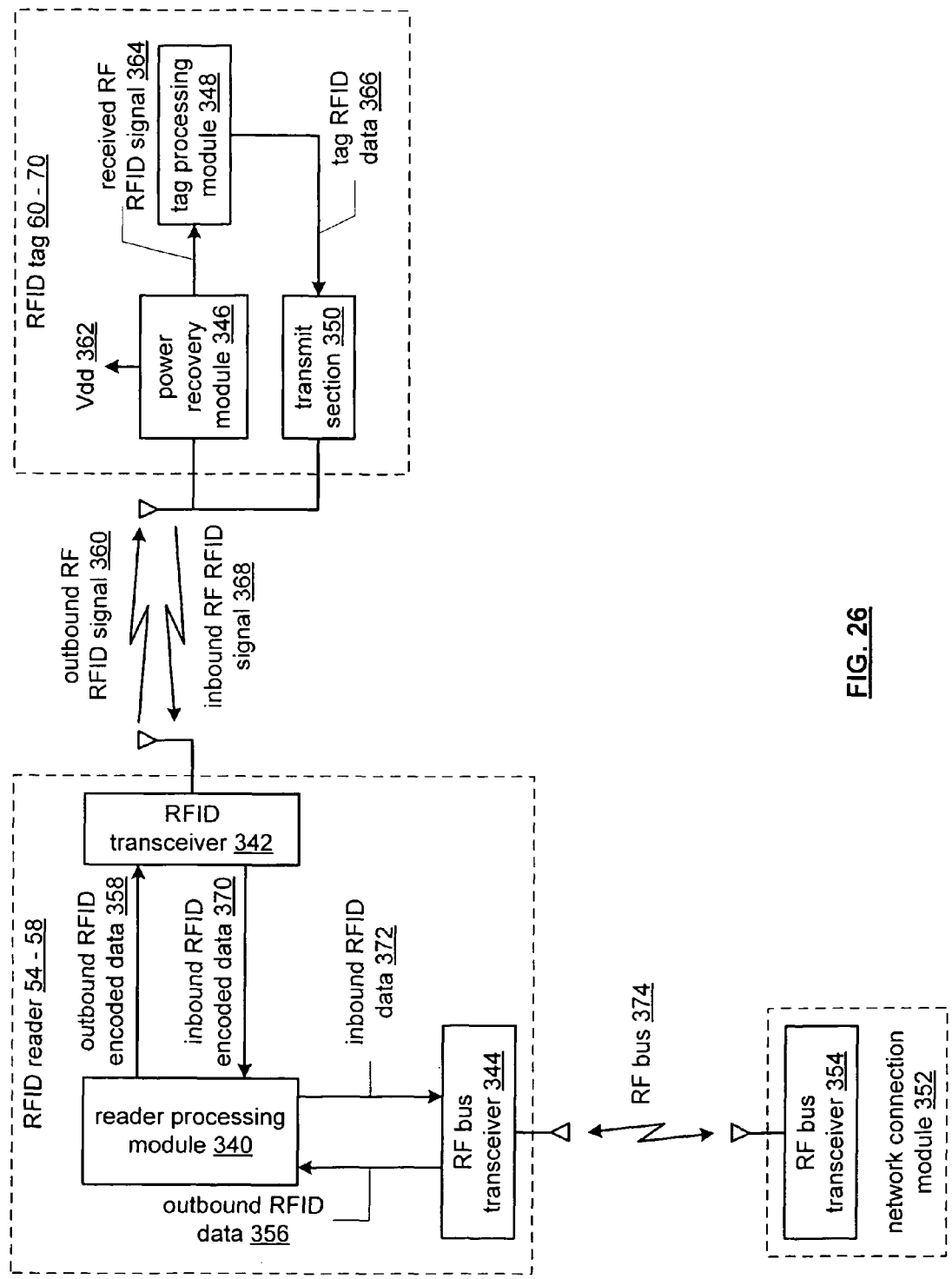
FIG. 26 is a schematic block diagram of another embodiment of an RFID system in accordance with the present invention.

FIG. 26 is a schematic block diagram of another embodiment of an RFID system that includes at least one RFID reader 54-58, at least one RFID tag 60-70, and a network connection module 352. The RFID reader 54-58 includes a reader processing module 340, an RFID transceiver 342, and an RF bus transceiver 344. The RFID tag 60-70 includes a power recovery module 346, a tag processing module 348, and a transmit section 350. The network connection module 352 includes an RF bus transceiver 354.

The reader processing module 340 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

In an embodiment, reader processing module 340 encodes outbound RFID data 356 to produce outbound RFID encoded data 358. The encoding may be done in accordance with an RFID protocol such as FM0, FM1, etc., may be a modified RFID protocol, and/or a proprietary protocol. Note that the reader processing module 340 may generate the outbound RFID data 356 or receive it from the network connection module 352 via the RF bus 374. Further note that the outbound RFID data 356 may be a request for status information from one or more RFID tags, may be data for storage and/or processing by one or more RFID tags, may be commands to be performed by one or more RFID tags, etc.

The RFID transceiver 342 is coupled to convert the outbound RFID encoded data 358 into an outbound RF RFID signal 360. One or more of the RFID tags 60-70 receives the outbound RF RFID signal 360 via an antenna coupled to the power recovery module 346. The power recovery module 346 is coupled to produce a supply voltage (Vdd) 362 from the outbound RF RFID signal 360 and to produce a received RF RFID signal 364.

The tag processing module 348 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

The tag processing module 348 is coupled to recover the outbound RFID data 356 from the received RF RFID signal 364 and to generate tag RFID data 366 in response thereto. The tag RFID data 366 may be response to an inquiry, may be an acknowledgement of data storage, may be an acknowledgement of a program update, and/or may be an acknowledgement of completion of execution of a command. The transmit section 350 is coupled to convert the tag RFID data 366 into and inbound RF RFID signal 368 using a backscatter technique or some other RF modulation protocol.

The RFID transceiver 342 is further coupled to convert the inbound RF RFID signal 368 into inbound RFID encoded data 370. In one embodiment, the RFID transceiver 342 includes a transmitter section and a receiver section. An embodiment of the transmitter section is discussed with reference to FIG. 30 and an embodiment of the receiver section is discussed with reference to FIG. 29.

The reader processing module 340 decodes the inbound RFID encoded data 370 to produce inbound RFID data 372. The decoding may be done in accordance with an RFID protocol such as FM0, FM1, etc., may be a modified RFID protocol, and/or a proprietary protocol.

The network connection module 352 may be one of, or included in one of, the communication device 18-30, access points, and/or base stations of FIG. 1, may be the computer or server of FIG. 2, and/or may be any other device that supports a wireline or wireless network connection (e.g., a local area connection, a wide area connection, a person area connection, etc.). In an embodiment, the reader RF bus transceiver 344 exchanges at least one of the inbound RFID data 372 and the outbound RFID data 356 with the network RF bus transceiver 354 via the RF bus 374. Note that the RF bus 374 may be one or more waveguide RF communication paths, one or more dielectric RF communication paths, and/or one or more free-space RF communication paths.

In one embodiment of the RFID system, the inbound and outbound RF RFID signals 360 and 368 have a carrier frequency in a first frequency band and the RF bus 374 supports RF bus communications having a carrier frequency in a second frequency band. For example, the first or the second frequency band may be a 60 GHz frequency band. In this instance, the RFID communications and the RF bus communications provide little interference for one another.

Figure 27:
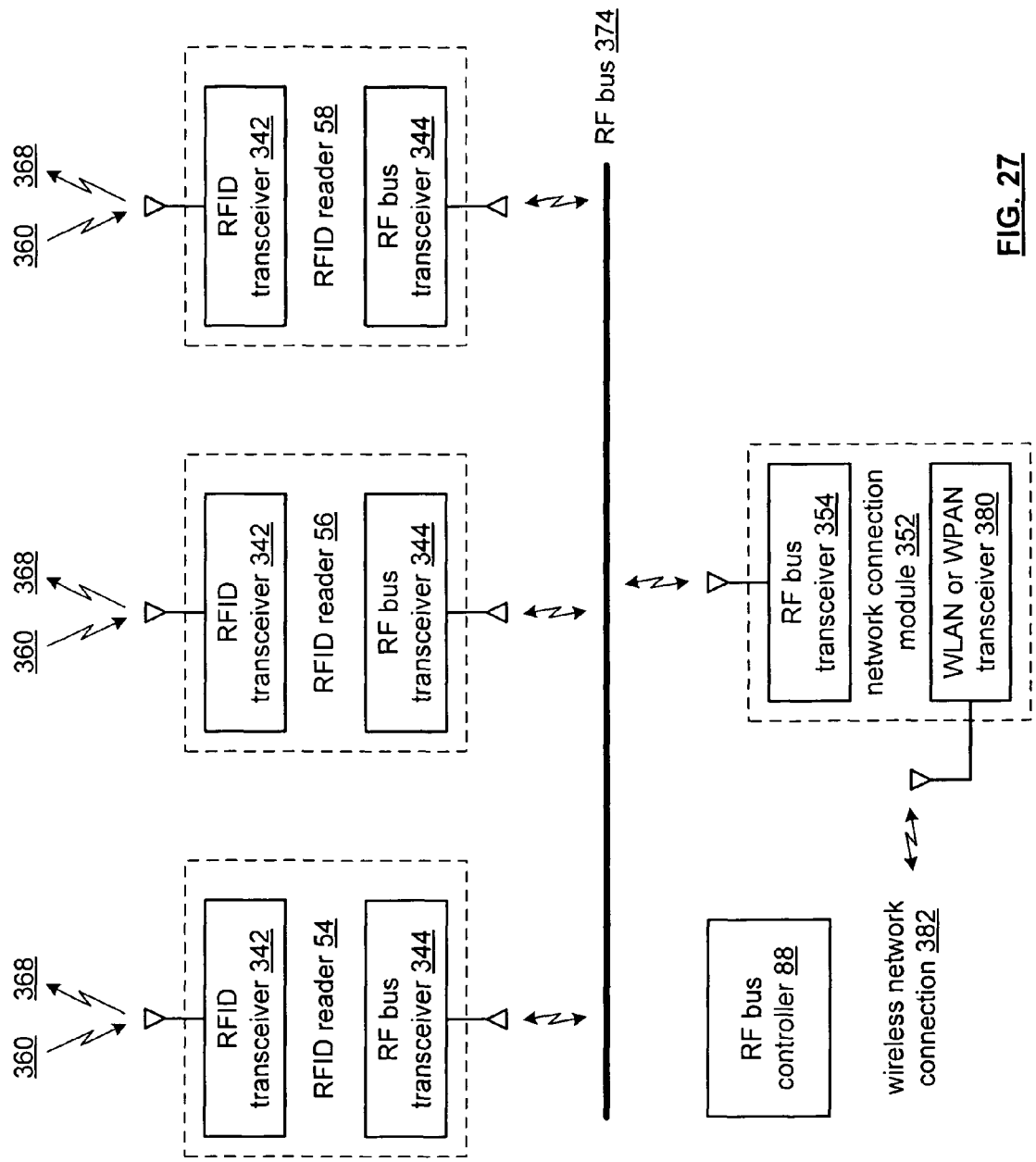
FIG. 27 is a schematic block diagram of another embodiment of an RFID system in accordance with the present invention.

FIG. 27 is a schematic block diagram of another embodiment of an RFID system that includes at least one RFID reader 54-58, at least one RFID tag 60-70, a network connection module 352, an RF bus 372, and an RF bus controller 88. Each of the RFID readers 54-58 includes the RFID transceiver 342 and the RF bus transceiver 344. The network connection module 352 includes the RF bus transceiver 354 and a WLAN (wireless local area network) or WPAN (wireless personal area network) transceiver 380.

In an embodiment, the RF bus controller 88 controls access to carrier frequencies within a frequency band, wherein the inbound and outbound RF RFID signals 360 and 368 having a carrier frequency within the frequency band and the RF bus 374 supports RF bus communications having a carrier frequency within the frequency band.

In another embodiment, the inbound and outbound RF RFID signals 360 and 368 have a carrier frequency in a first frequency band. The RF bus 374 supports RF bus communications having a carrier frequency in a second frequency band. The WLAN transceiver 380 transceives RF signals having a carrier frequency in a third frequency band, wherein the first, second or the third frequency bands is within a 60 GHz frequency band.

In another embodiment, the inbound and outbound RF RFID signals 360 and 368 have a carrier frequency within a frequency band and the RF bus 374 supports RF bus communications having the carrier frequency within the same frequency band. The WLAN transceiver 380 transceives RF signals having a carrier frequency outside of the frequency band. In this instance, the RF bus controller 88 controls access to carrier frequencies within the frequency band using a TDMA allocation, an FDMA allocation, a CDMA allocation, a CSMA with collision avoidance scheme, a polling-response scheme, a token passing scheme, and/or a combination thereof.

In another embodiment, the inbound and outbound RF RFID signals 360 and 368 have a carrier frequency within a frequency band, the RF bus 374 supports RF bus communications having a carrier frequency within the frequency band, and the WLAN transceiver 380 transceives RF signals having a carrier frequency within the frequency band. In this instance, the RF bus controller 88 controls access to carrier frequencies within the frequency band using a TDMA allocation, an FDMA allocation, a CDMA allocation, a CSMA with collision avoidance scheme, a polling-response scheme, a token passing scheme, and/or a combination thereof.

Figure 28:
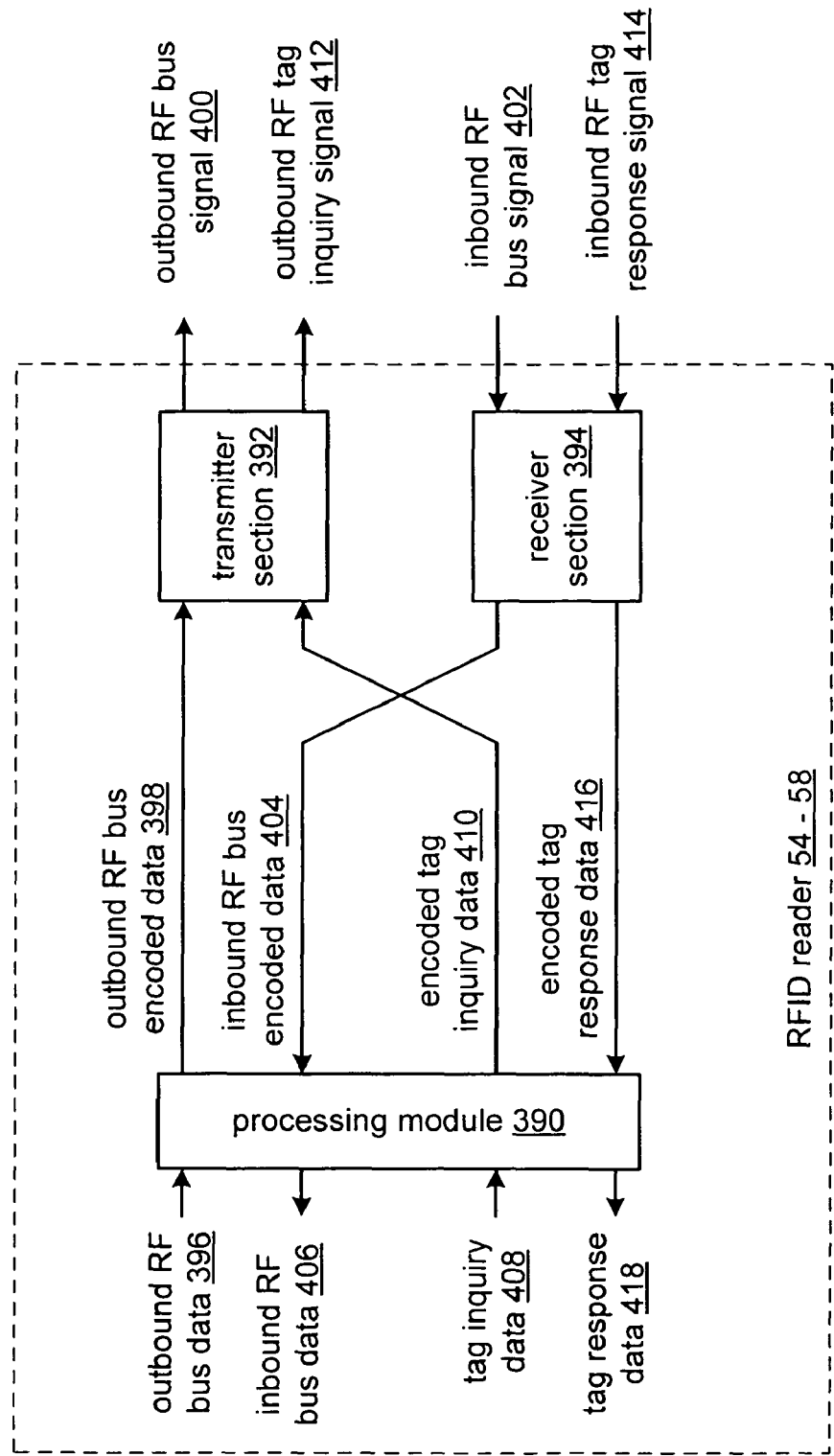
FIG. 28 is a schematic block diagram of an embodiment of an RFID reader in accordance with the present invention.

FIG. 28 is a schematic block diagram of an embodiment of an RFID reader 54-58 that includes a processing module 390, a transmitter section 392, and a receiver section 394. The processing module 390 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

In operation, the processing module 390 is coupled to encode tag inquiry data 408 to produce encoded tag inquiry data 410. The encoding may be done in accordance with an RFID protocol such as FM0, FM1, etc., may be a modified RFID protocol, and/or a proprietary protocol. Note that the processing module 390 may generate the tag inquiry data 408 or receive it from a network connection module 352 via the RF bus 374. Further note that the tag inquiry data 408 may be a request for status information from one or more RFID tags, may be data for storage and/or processing by one or more RFID tags, may be commands to be performed by one or more RFID tags, etc.

For the processing module 390 to receive the tag inquiry data 408 from the network connection module 352, the network connection module 352 generates the data 408 and the RF bus transceiver 354 converts it into an inbound RF bus signal 402. The receiver section 394, which will be described in greater detail with reference to FIG. 29, converts the inbound RF bus signal 402 into inbound RF bus encoded data 404. The processing module 390 decodes the inbound RF bus encoded data 404 to produce inbound RF bus data 406, which, in this example, is the tag inquiry data 408. Note that other data may be received from the network connection module 352 in this manner.

Figure 30:
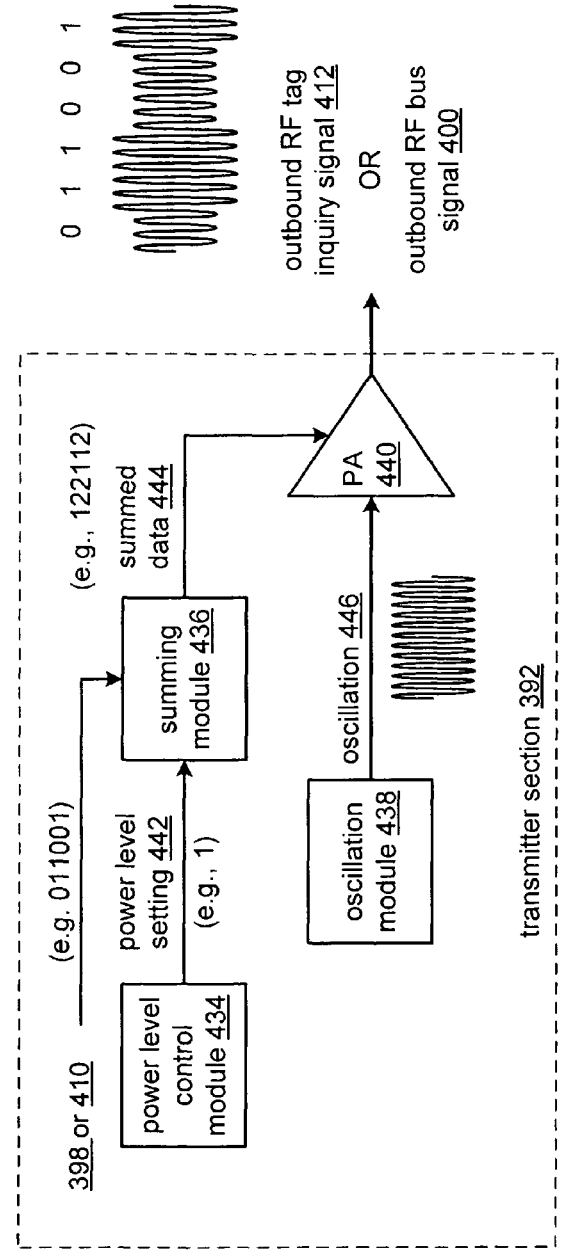
FIG. 30 is a schematic block diagram of an embodiment of a transmitter section of an RFID reader in accordance with the present invention.

The transmitter section 392, which will be described in greater detail with reference to FIG. 30, is coupled to convert the encoded tag inquiry data 410 into an outbound RF tag inquiry signal 412. If the tag inquiry data 408 instructs the RFID tag to respond, the receiver section 394 receives the inbound RF tag response signal 414.

The receiver section 394 converts the inbound RF tag response signal 414 into encoded tag response data 416. The processing module 390 decodes the encoded tag response data 416 to recover the tag response data 418. If the tag response data 418 is to be provided to the network connection module 352, the processing module 390 utilizes the tag response data 418 as the outbound RF bus data 396 and encodes the outbound RF bus data 396 to produce outbound RF bus encoded data 398.

The transmitter section 392 converts the outbound RF bus encoded data 398 into an outbound RF bus signal 400. The network connection module 352 receives the outbound RF bus signal 400 via the RF bus and its RF bus transcevier 354. Note that other data may be transmitted to the network connection module 352 in this manner.

In an embodiment, the processing module 390 further functions to arbitrate between RF bus communications (e.g., inbound and outbound RF bus signals 400 and 402) and RFID tag communications (e.g., outbound RF tag inquiry signal 412 and inbound RF tag response signal 414). In this manner, interference between the RF bus communications and the RFID tag communications is minimal. Note that in an embodiment, the RF bus communications and the RFID tag communications having a carrier frequency in a 60 GHz frequency band.

Figure 29:
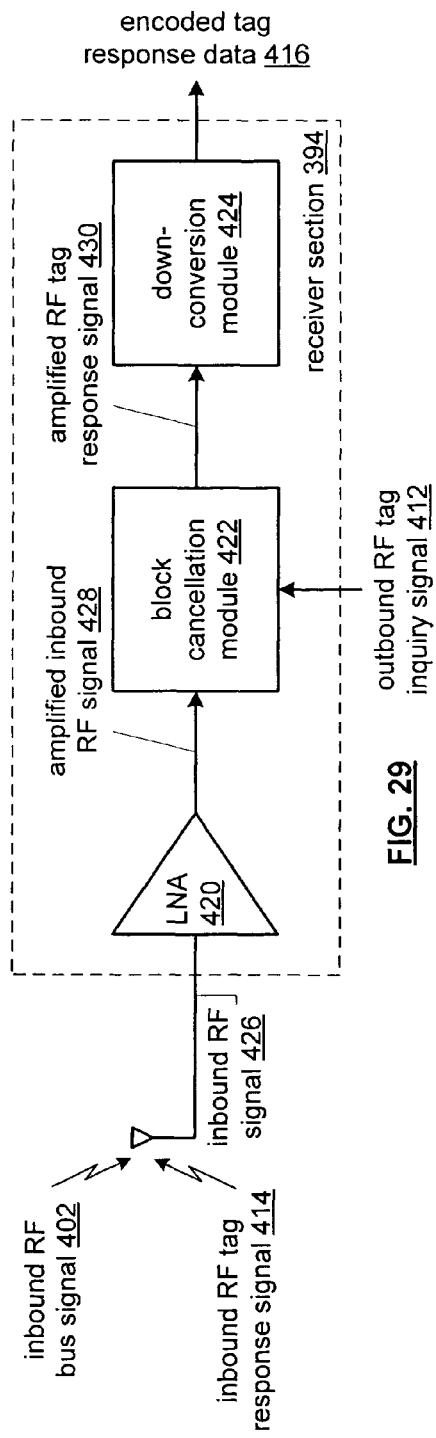
FIG. 29 is a schematic block diagram of an embodiment of a receiver section of an RFID reader in accordance with the present invention.

FIG. 29 is a schematic block diagram of an embodiment of a receiver section 394 that includes a low noise amplifier (LNA) 420, a block cancellation module 422, and a down-conversion module 424. The low noise amplifier 420 is coupled to amplify an inbound RF signal 426, which may be the inbound RF bus signal 402 or the inbound RF tag response signal 414 and the outbound RF tag inquiry signal 412, to produce an amplified inbound RF signal 428.

The block cancellation module 422 is coupled to receive the outbound RF tag inquiry signal 412 from the transmitter section 392 to produce a received RF tag inquiry signal. In addition, the block cancellation module 422 receives the amplified inbound RF signal 428 from the LNA 420. In one embodiment, the block cancellation module 422 substantially cancels the outbound RF tag inquiry signal 412 from the amplified inbound RF signal using the received RF tag inquiry signal 412 and to pass, substantially the inbound RF tag response signal 414 or the inbound RF bus signal 402 of the amplified inbound RF signal.

The down-conversion module 424 is coupled to convert the inbound RF tag response signal or the inbound RF bus signal 402 into the encoded tag response data 416 or the inbound RF bus encoded data 404.

FIG. 30 is a schematic block diagram of an embodiment of a transmitter section 392 that includes a power level control module 434, a summing module 436, an oscillation module 438, and a power amplifier module 440.

The power level control module 434 is coupled to generate a power level setting 442. The particular power level setting depends on the desired transmit power and whether the PA 440 is linear or non-linear. The summing module 436 is coupled to sum the power level setting 442 and the encoded tag inquiry data 410 or the outbound RF bus encoded data 398 to produce summed data 444. For example, the power level setting may be level 1, the encoded tag inquiry data 410 or the outbound RF bus encoded data 398 may be 011001 such that the summed data 444 is 122112.

Figure 32:
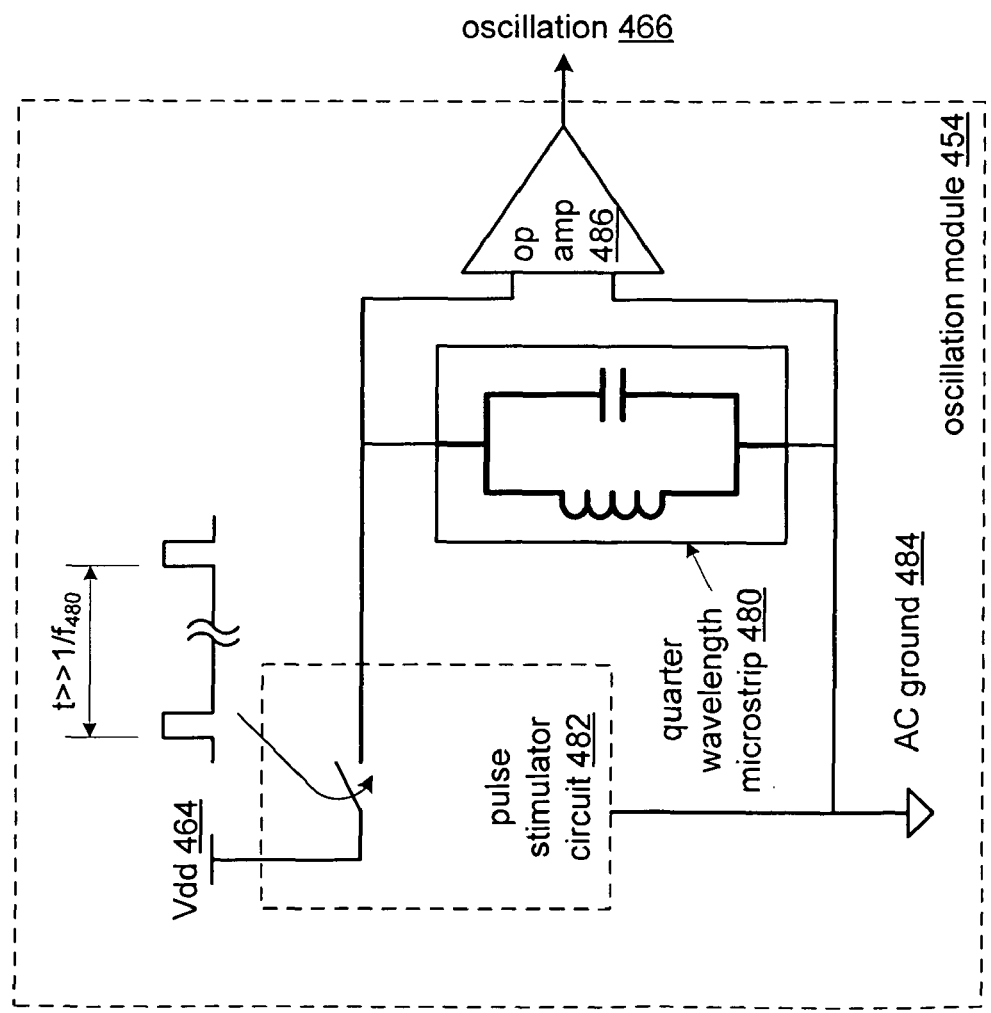
FIG. 32 is a schematic block diagram of an embodiment of an oscillation module of an RFID tag in accordance with the present invention.

The oscillation module 438, which may be implemented as shown in FIG. 32, may be phase locked loop, etc., is coupled to generate an oscillation 446 at a desired frequency (e.g., 13 MHz, 900 MHz, 2.4 GHz, 5.2 GHz, 60 GHz). The power amplifier section 440 is coupled to amplitude modulate the oscillation 446 based on the summed data 444 to produce the outbound RF tag inquiry signal 412 or the outbound RF bus signal 400. An example of the amplitude modulated output is shown.

In a tag start up mode, the data input to the summing module is disabled such that the summing module 436 outputs the power level setting 442. In this manner, the power amplifier section 440 amplifies the oscillation 446 to produce a continuous wave signal. Such a continuous wave signal it used by the RFID tag to derive its initial power.

Figure 31:
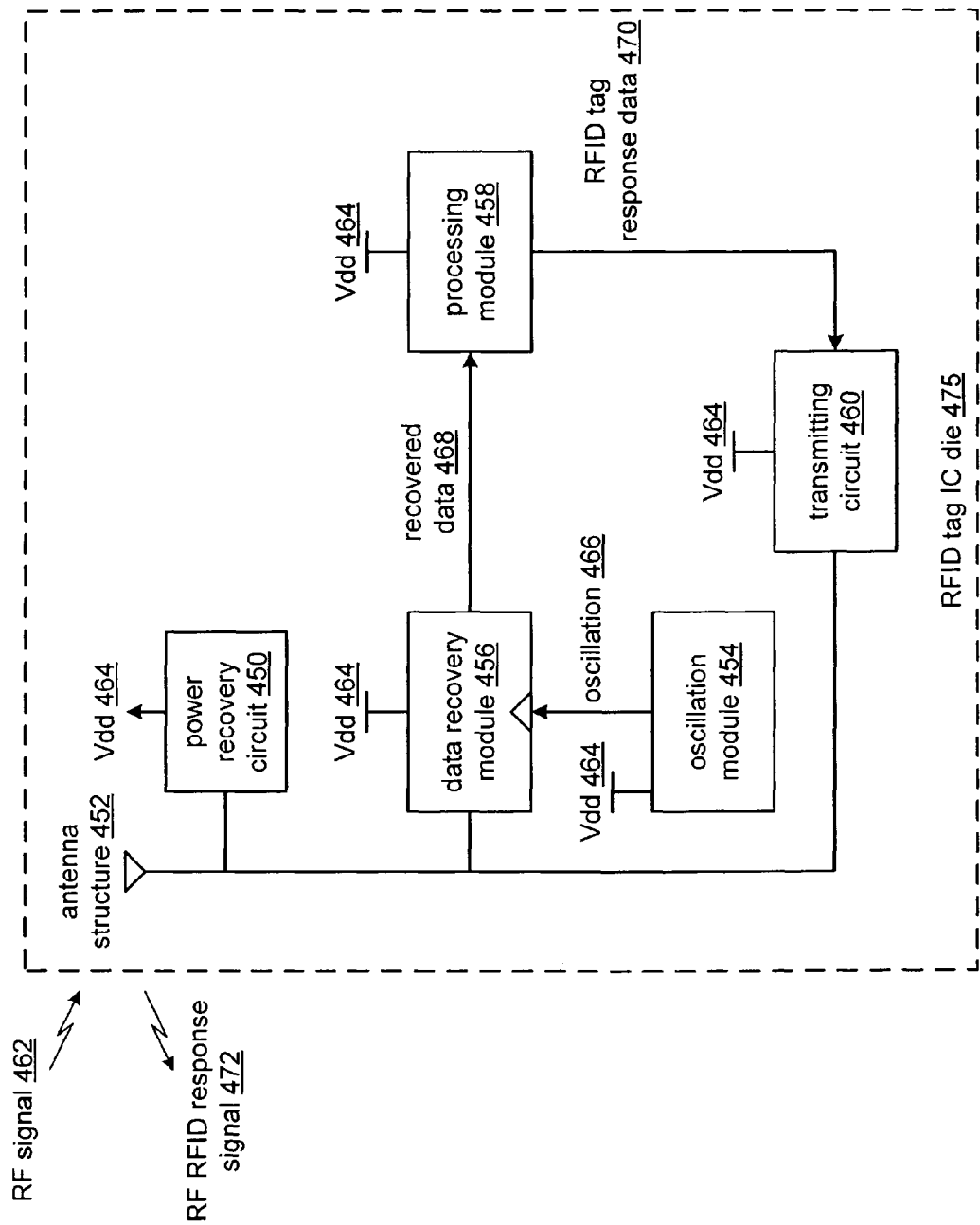
FIG. 31 is a schematic block diagram of an embodiment of an RFID tag in accordance with the present invention.

FIG. 31 is a schematic block diagram of an embodiment of an RFID tag 60-70 that is implemented on a die 475 that includes an antenna structure 452, a power recovery circuit 450, a data recovery module 456, a processing module 458, an oscillation module 454, and a transmitting circuit 460. The processing module 458 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

In operation, the antenna structure 452, which may be sized for operation in a 60 GHz frequency band, receives an RF signal 462. The RF signal 462 may be a continuous wave signal and/or the outbound RF tag inquiry signal 412. The antenna structure 452 provides the received RF signal 462 to the power recovery circuit 450 and the data recovery circuit 456. The antenna structure 452 will be described in greater detail with reference to FIG. 33.

The power recovery circuit 450 converts the RF signal 462 into a supply voltage (Vdd) 464. In one embodiment, the power recovery circuit 450 includes a rectifying module, which may be an active cell rectifier or a charge pump rectifier, and a tuning module. The tuning module tunes the rectifying module in accordance with the RF signal. In other words, the tuning module tunes the frequency response of the rectifying module based on the frequency of the RF signal such that the frequency response of the power recovery circuit 450 is optimized for the RF signal 462. The rectifying module, having been tuned, rectifies the RF signal 462 and stores the rectified RF signal in a capacitor to produce the supply voltage 464, which is used to power the data recovery module 456, the processing module 458, the oscillation module 454, and the transmitting circuit 460.

The oscillation module 454, an embodiment of which will be described in greater detail with reference to FIG. 32, produces an oscillation 466 having a frequency approximately equal to a carrier frequency of the RF signal 462. The oscillation module 454 provides the oscillation 466 to the data recovery module 456 and may also provide the oscillation to the processing module 458.

The data recovery module 456 is clocked via the oscillation 466 to recover data 468 from the RF signal 462. For example, the RF signal 462 includes bi-phase encoded data that has the state of the encoded signal change at the bit boundaries and, within the bit boundaries, a constant state may represent a logic one and a toggle state may represent a logic zero. In this example, the data recovery module 456 recovers the bi-phase encoded data as the recovered data 468 and provides it to the processing module 458. In another example, the data recovery module 456 may decode the recovered bi-phase encoded data to produce the recovered data 468.

The processing module 468 processes the recovered data 468 and, when indicated within the recovered data 468, generates RFID tag response data 470. The transmitting circuit 460, which may be a transistor, provides the RFID tag response data 470 to the antenna structure 452 for transmission as an RF RFID response signal 472.

FIG. 32 is a schematic block diagram of an embodiment of the oscillation module 454 that includes a quarter-wavelength microstrip 480, a pulse stimulator circuit 482, and an amplifier circuit 486. The pulse stimulator circuit 482 provides a low frequency periodic pulse (e.g., the time (t) between pulses is much greater than the period of the resonant frequency of the quarter wavelength microstrip ($1/f_{460}$)) to the quarter wavelength microstrip 480 to stimulate self-resonance of the quarter wavelength microstrip 480. As shown, at a self-resonant frequency, the quarter wavelength microstrip 480 includes an inherent tank circuit. The amplifier circuit 486 is coupled to the quarter wavelength microstrip 480 to produce the oscillation 466 from the self-resonance of the quarter wavelength microstrip.

Figure 33:
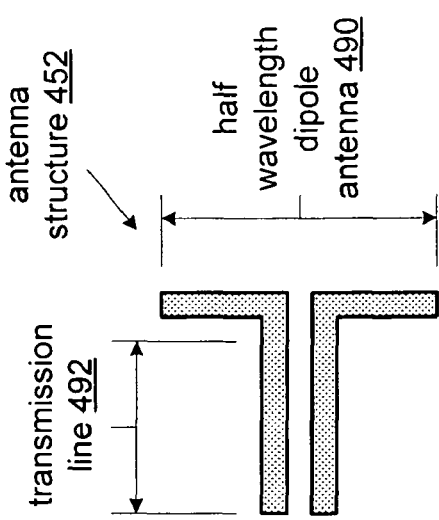
FIG. 33 is a schematic block diagram of an embodiment of an antenna structure of an RFID tag in accordance with the present invention.

FIG. 33 is a schematic block diagram of an embodiment of an antenna structure 452 that includes a half wavelength dipole antenna 490 and a transmission line 490. Note that other on-die antenna structures may be used. For example, a quarter wavelength mono pole antenna may be used.

FIG. 34 is a schematic block diagram of another embodiment of a device that includes a plurality of integrated circuits (ICs) 500-502 and an RF bus structure 528. Each of the plurality of ICs 500-502 includes a plurality of circuit modules 504-506, 508-510, a switching module 512, 514, an RF bus transceiver 516, 518, an antenna interface 520, 522, and an antenna structure 534, 526. The circuit modules 504-510 may be any type of digital circuit, analog circuit, logic circuit, and/or processing circuit. For example, one of the circuit modules 504-510 may be, but is not limited to, a microprocessor, a component of a microprocessor, cache memory, read only memory, random access memory, programmable logic, digital signal processor, logic gate, amplifier, multiplier, adder, multiplexor, etc.

In this embodiment, the circuit modules 504-506 and 508-510 of an IC 500, 502 share an RF bus transceiver 516, 518 for external IC communications (e.g., intra-device communications and/or inter-IC communications) and communicate via the switching module 512, 514 for internal IC communications (e.g., intra-IC communications). The switching module 512, 514 may include a wireline bus structure (e.g., AHB) and a plurality of switches, multiplexers, demultiplexers, gates, etc. to control access to the wireline bus structure and/or access to the RF bus transceiver.

The antenna interface 520, 522 may include one or more of a transformer balun, an impedance matching circuit, and a transmission line to provide a desired impedance, frequency response, tuning, etc. for the antenna structure 524, 526. The antenna structure 524, 526 may be implemented as described in co-pending patent application entitled AN INTEGRATED CIRCUIT ANTENNA STRUCTURE, having a filing date of Dec. 29, 2006, and a Ser. No. of 11/648,826.

The RF bus structure 528, which may be one or more waveguide RF communication paths, one or more dielectric RF communication paths, and/or one or more free-space RF communication paths, receives outbound RF bus signal from the antenna structure 524, 526 and provides it to the antenna structure 524, 526 of another one of the plurality of ICs 500-502.

In an embodiment, the switching module 512, 514 performs the method of FIG. 35 to control internal IC communications and external IC communications. The method begins at step 530 where the switching module 512, 514 receives an outbound bus communication from one of the plurality of circuit modules 504-510. The process then proceeds to step 532 where the switching module 512, 514 determines whether the outbound bus communication is an internal IC communication or an external IC communication.

When the outbound bus communication is an internal IC communication, the process proceeds to step 534 where the switching module 512, 514 provides the outbound bus communication to another one of the plurality of circuit modules

504-506, 508-510. In this instance, the switching module 512, 514 utilizes the wireline bus structure and the appropriate switches, multiplexers, etc. to couple one circuit module 504 to the other 506 for the conveyance of the outbound bus communication.

When the outbound bus communication is an external IC communication, the switching module 512, 514 outputs the outbound bus communication to the RF bus transceiver 516, 518, which converts the outbound bus communication into an outbound RF bus signal. The antenna interface and the antenna structure provide the outbound RF bus signal to the RF bus structure 528 for conveyance to another circuit module of another IC.

For an inbound RF bus signal, the antenna structure 524, 526 receives the inbound RF bus signal from the RF bus structure 528 and provides it to the RF bus transceiver 516, 518 via the antenna interface 520, 522. The RF bus transceiver 516, 518 converts the inbound RF bus signal into an inbound bus communication. The switching module 512, 514 interprets the inbound bus communication and provides it to the addressed circuit module or modules.

Figure 36:
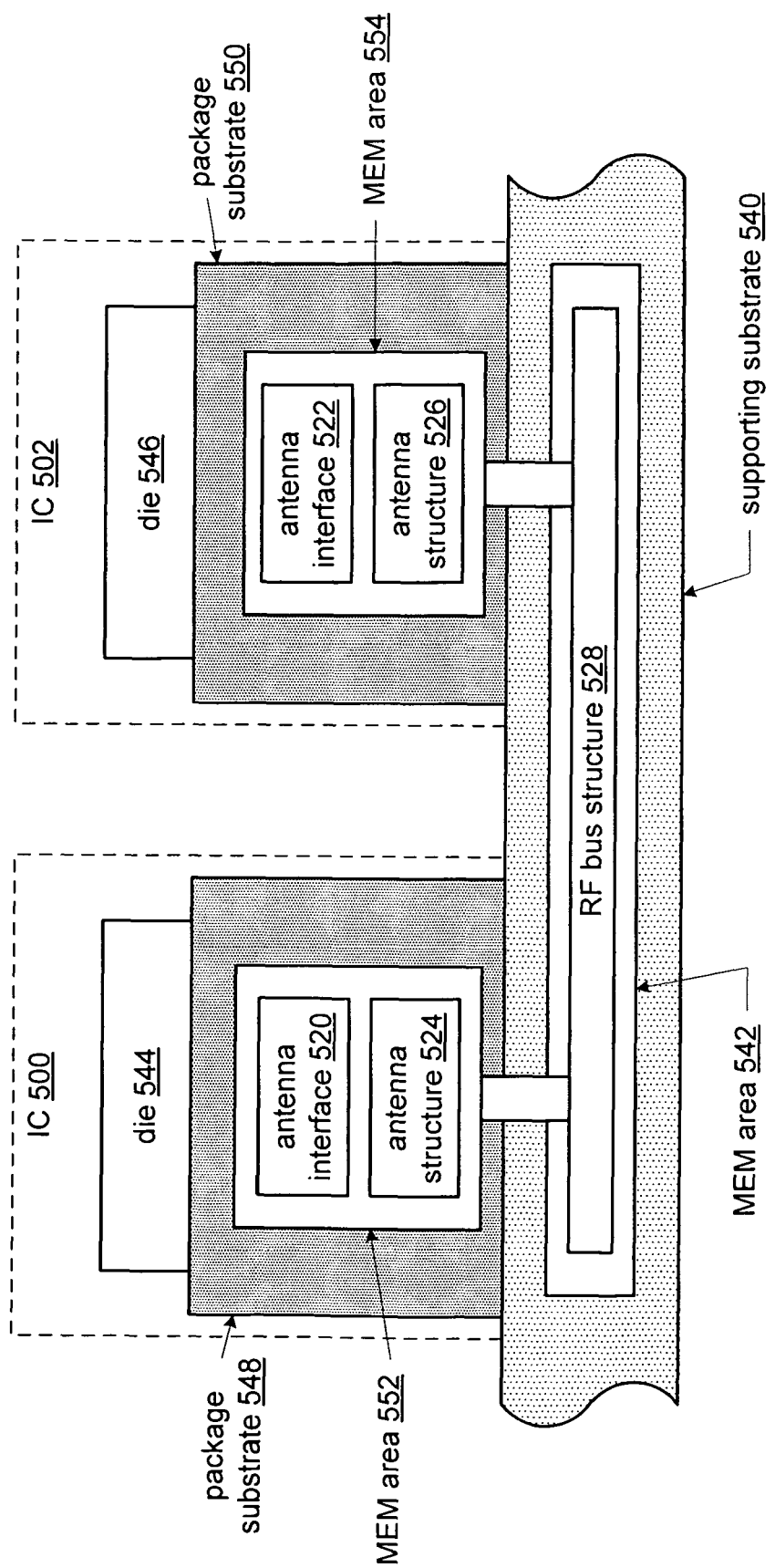
FIGS. 36-38 are diagrams of embodiments of a device in accordance with the present invention.

FIG. 36 is a diagram of an embodiment of a device that includes the plurality of integrated circuits (ICs) 500-502, the RF bus structure 528, and a supporting substrate 540. In this embodiment, each of the ICs 500-502 includes a package substrate 548, 550, and a die 544, 546 and the supporting substrate 540 supports the ICs 500-502 and includes a supporting substrate micro-electromechanical (MEM) area 542. The supporting substrate 540 may be printed circuit board with or without traces, a non-conductive plastic board, and/or any other type of substrate that will support a plurality of ICs 500-502.

As shown, the RF bus structure 528 is within the supporting substrate MEM area 542 and includes channels to the antenna structures 524, 526 of the ICs 500-502. In this manner, RF bus transmissions by the antenna structures 524, 526 is substantially contained within the MEM area 542 that contains the RF bus structure 528. As such, interference from other RF communications should be minimized and the RF bus transmissions should have minimal interference on the other RF transmissions.

As is also shown, the package substrate 548, 550 includes a MEM area 552, 554. In an embodiment, the antenna interface 520, 522 and the antenna structure 524, 526 are within the package substrate MEM area 552, 554.

Figure 37:
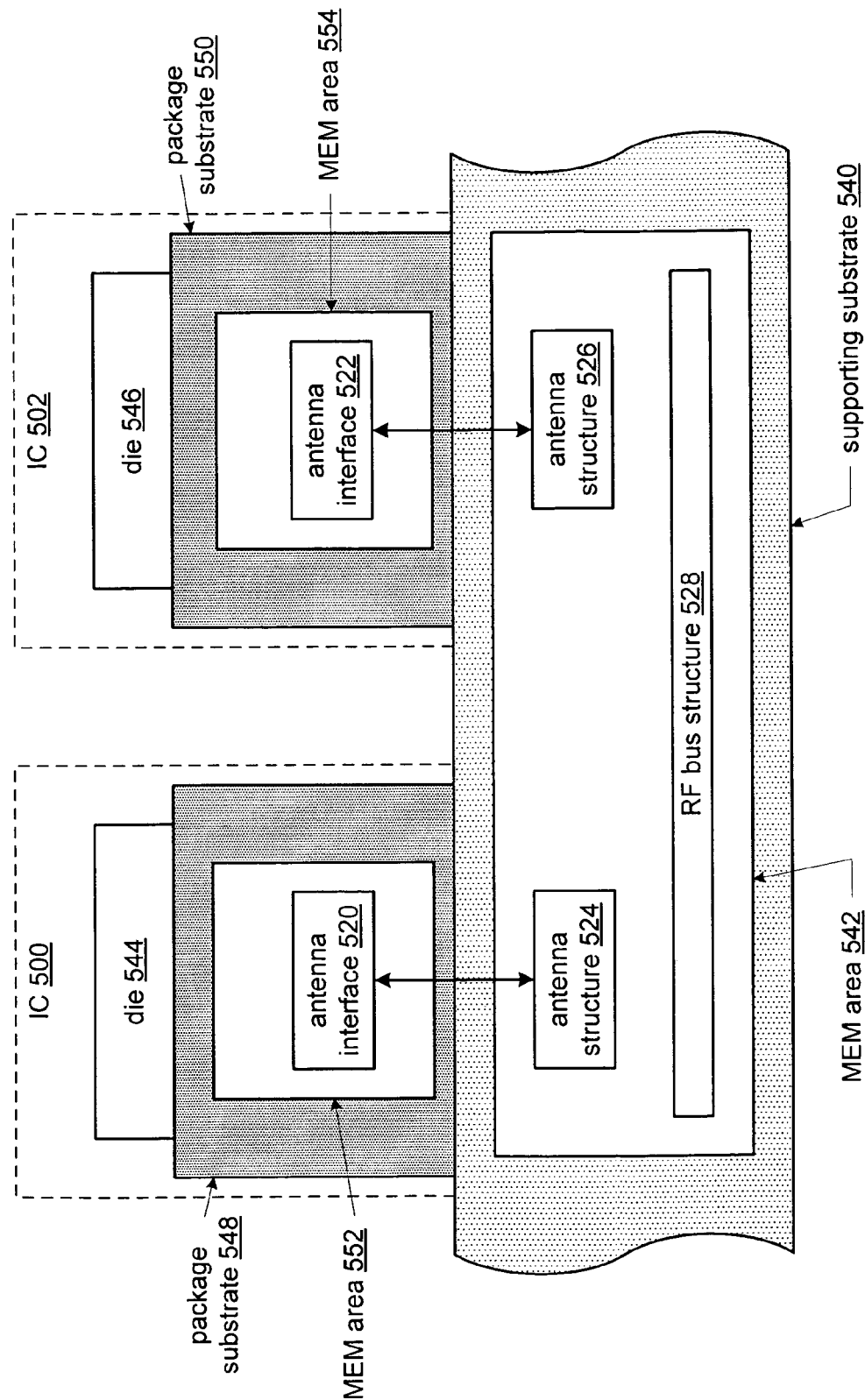

FIG. 37 is a diagram of an embodiment of a device that includes the plurality of integrated circuits (ICs) 500-502, the RF bus structure 528, and the supporting substrate 540. In this embodiment, each of the ICs 500-502 includes a package substrate 548, 550, and a die 544, 546, the package substrate 548, 550 includes a MEM area 552, 554, and the supporting substrate 540 supports the ICs 500-502 and includes a supporting substrate micro-electromechanical (MEM) area 542.

As shown, the antenna interface 520, 522 may be within the package substrate MEM area 552, 554 and the antenna structure 524, 526 and the RF bus structure 528 may be within the supporting substrate MEM area 542. In this embodiment, the antenna interface 520, 522 is coupled to the antenna structure 524, 526 by a via and/or a pin on the package of the IC 500-502.

Figure 38:
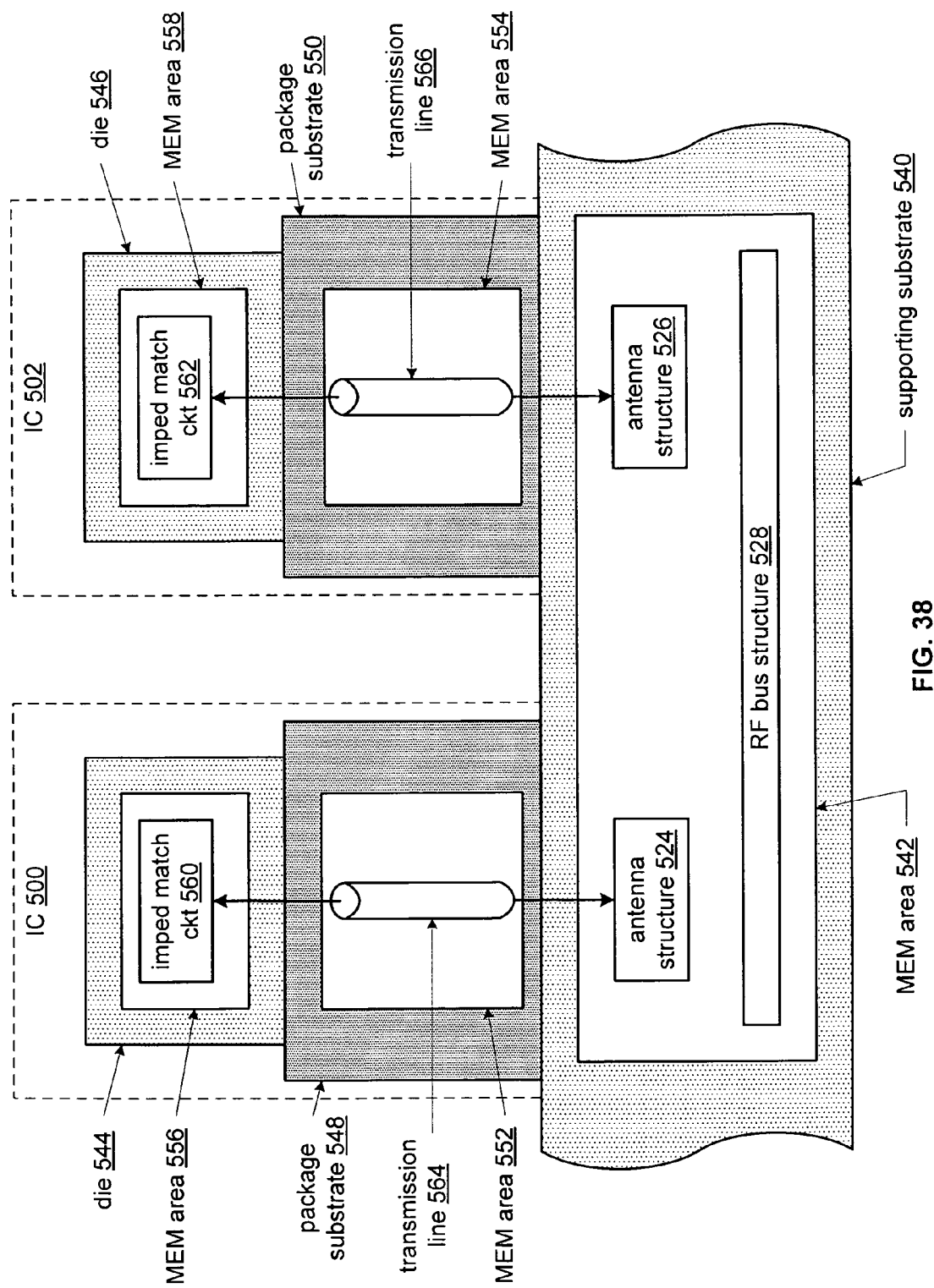

FIG. 38 is a diagram of an embodiment of a device that includes the plurality of integrated circuits (ICs) 500-502, the RF bus structure 528, and a supporting substrate 540. In this embodiment, each of the ICs 500-502 includes a package substrate 548, 550, and a die 544, 546, the package substrate 548, 550 includes a MEM area 552, 554, the die 544, 546 includes a MEM area 556, 558, and the supporting substrate 540 supports the ICs 500-502 and includes a supporting substrate micro-electromechanical (MEM) area 542.

As shown, an impedance matching circuit 560, 562 of the antenna interface 520, 522 is within the die MEM area 556, 558, a transmission line 564, 566 of the antenna interface 520, 522 is within the package substrate MEM area 552, 554, and the antenna structure 524, 526 and the RF bus structure 528 are within the supporting substrate MEM area 542. Alternatively, the antenna structure 524, 526 may be within the package substrate MEM area 552, 554.

Figure 39:
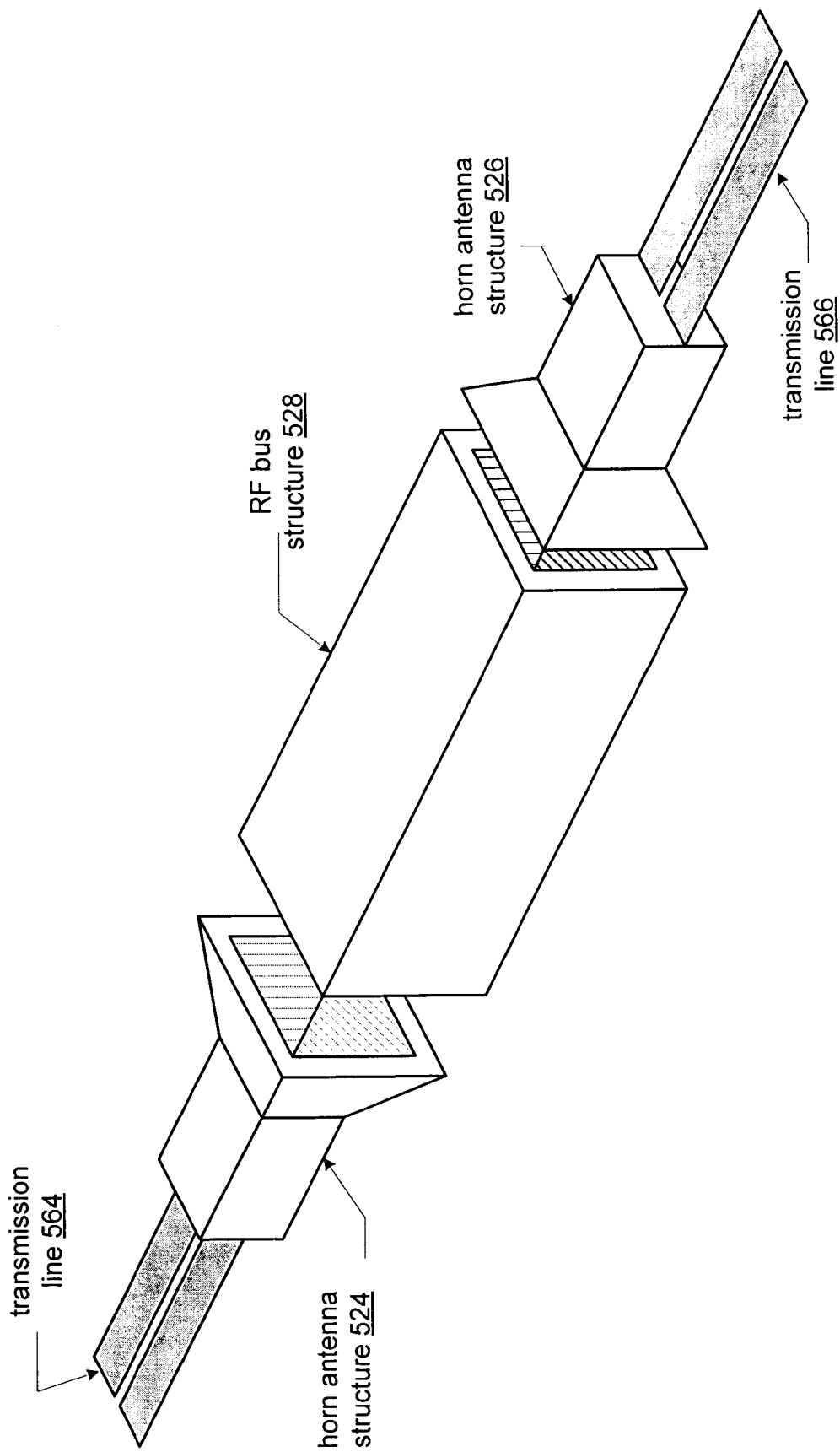
FIG. 39 is a diagram of an embodiment of an intra-device RF bus communication accordance with the present invention.

FIG. 39 is a diagram of an embodiment of an intra-device RF bus communication between two circuit modules of different ICs. In this embodiment, the antenna structure 524 of a first one of the plurality of ICs 500 has a three-dimensional aperture antenna shape, a three-dimensional lens shape, or a three-dimensional dipole shape (shown as a horn aperture antenna shape). The antenna structure 526 of a second one of the plurality of ICs 502 has the three-dimensional aperture antenna shape, the three-dimensional lens shape, or the three-dimensional dipole shape (also shown as a horn aperture antenna shape).

The RF bus structure 528 has a three-dimensional waveguide construct (shown as a rectangular tube having a shape approximately equal to the shape of the horn antenna) and is proximally located between the antenna structures 524, 526 of the first and second ones of the plurality of ICs 500-502. In this manner, RF bus communications between the ICs can be substantially contained with the RF bus structure and, with the three-dimensional antenna design and relatively short travel distances, the transmit power can be very low (e.g., <−50 dBm).

Figure 40:
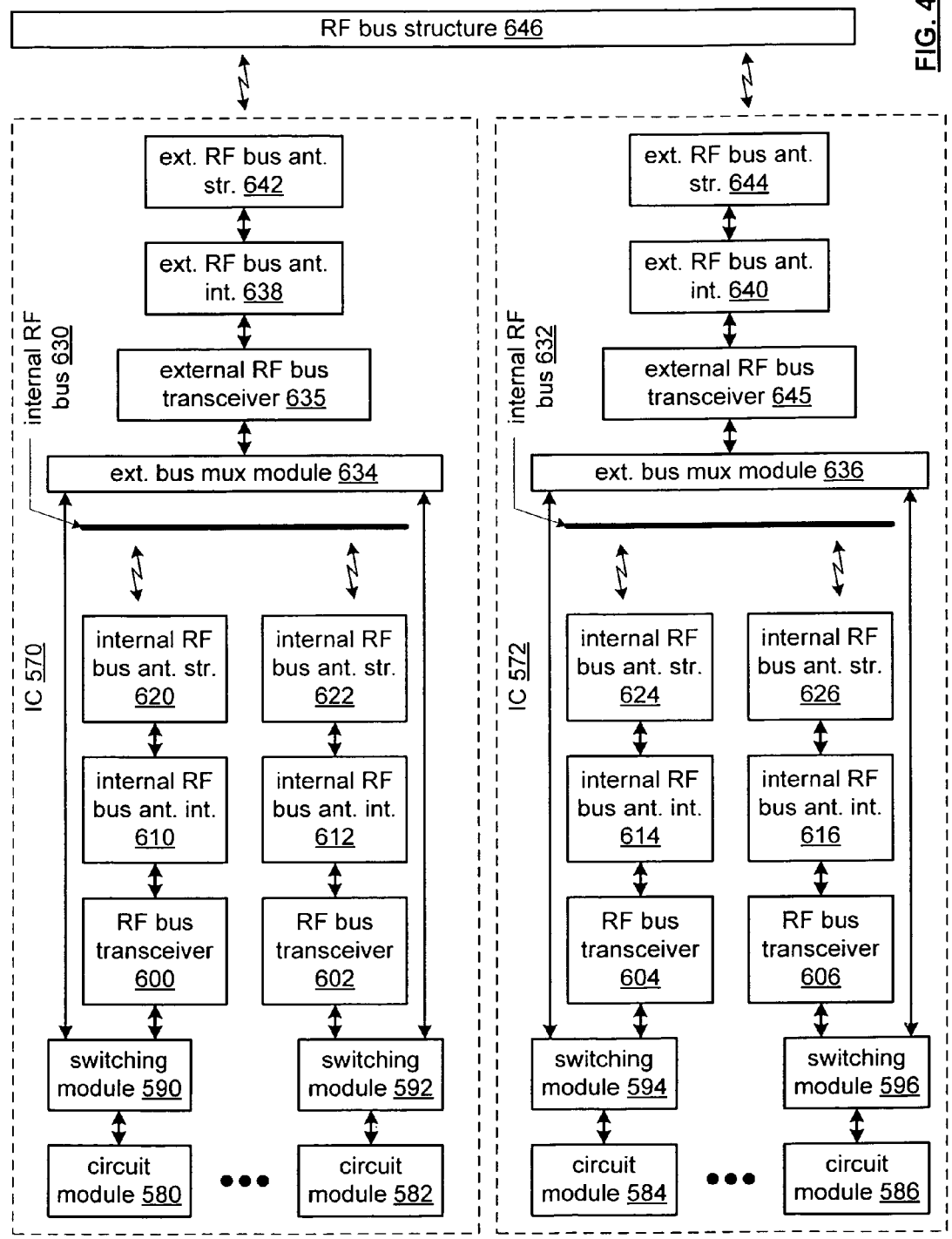
FIG. 40 is a schematic block diagram of another embodiment of a device in accordance with the present invention.

FIG. 40 is a schematic block diagram of another embodiment of a device that includes a plurality of integrated circuits (ICs) 570-572 and an RF bus structure 646. Each of the plurality of ICs 570-572 includes a plurality of circuit modules 580-582, 584-586, a plurality of switching modules 590-592, 594-596, a plurality of internal RF bus transceivers 600-602, 604-606, a plurality of internal RF bus antenna interfaces 610-612, 614-616, a plurality of internal RF bus antenna structures 620-622, 624-626, an internal RF bus 630, 632, an external bus multiplexer module 634, 636, an external RF bus transceiver 635, 645, an external RF bus antenna interface 638, 640, and an external RF bus antenna structure 642, 644. The circuit modules 580-586 may be any type of digital circuit, analog circuit, logic circuit, and/or processing circuit. For example, one of the circuit modules 580-586 may be, but is not limited to, a microprocessor, a component of a microprocessor, cache memory, read only memory, random access memory, programmable logic, digital signal processor, logic gate, amplifier, multiplier, adder, multiplexor, etc.

In this embodiment, one or more of the circuit modules 580-584 generates an outbound bus signal and provides it to a corresponding one of the switching modules 590-596 (e.g., switching module 590 for circuit module 580). The switching module 590-596, which includes a processing module and switching elements (e.g., switches, transistors, multiplexers, gates, etc.), determines whether the outbound bus signal is an internal IC communication or an external IC communication.

When the outbound bus communication is an internal IC communication, the corresponding switching module 590-596 outputs the outbound bus signal via a first path to a corresponding one of the RF bus transceivers 600-606 (e.g., RF bus transceiver 600 for switching module 590). The corresponding RF bus transceiver 600-606 converts the outbound bus signal into an outbound RF bus signal, which it provides to a corresponding internal RF bus antenna interface 610-616 (e.g., internal RF bus antenna interface 610 for RF bus transceiver 600). The internal RF bus antenna interface 610, which may include a transformer, an impedance matching circuit, and/or a transmission line, provides the outbound RF bus signal to a corresponding internal RF bus antenna structure 620-626. The corresponding internal RF bus antenna structure 620-626, which may be any one of the antenna structures disclosed in co-pending patent application entitled AN INTEGRATED CIRCUIT ANTENNA STRUCTURE, having a filing date of Dec. 29, 2006, and a Ser. No. of 11/648,826, transmits the outbound RF bus signal to another antenna structure within the same IC via the internal RF bus 630, 632. The internal RF bus 630, 632 includes one or more waveguide RF communication paths, one or more dielectric RF communication paths, and/or one or more free-space RF communication paths.

When the outbound bus communication is an external IC communication, the corresponding switching module 590-596 outputs the outbound bus signal via a second path to the external bus multiplexing module 634, 636. The external bus multiplexing module 590-596, which includes control logic and one or more multiplexers, outputs an outbound bus signal from one of the plurality of switching module 590-592, 594-596 to the external RF bus transceiver 635, 645. The external RF bus transceiver 635, 645 converts the outputted outbound bus signal into an outbound external RF bus signal, which is provided to the external RF bus antenna interface 638, 640.

The external RF bus antenna interface 638, 640, which includes a transformer, an impedance matching circuit, and/or a transmission line, provides the outbound external RF bus signal to the external RF bus antenna structure 642, 644. The external RF bus antenna structure 642, 644, which may be any one of the antenna structures disclosed in co-pending patent application entitled AN INTEGRATED CIRCUIT ANTENNA STRUCTURE, having a filing date of Dec. 29, 2006, and a Ser. No. of 11/648,826, transmits the outbound external RF bus signal to another IC 570, 572 via the external RF bus structure 646. In an embodiment, the external RF bus structure includes one or more waveguide RF communication paths, one or more dielectric RF communication paths, and/or one or more free-space RF communication paths.

Figure 41:
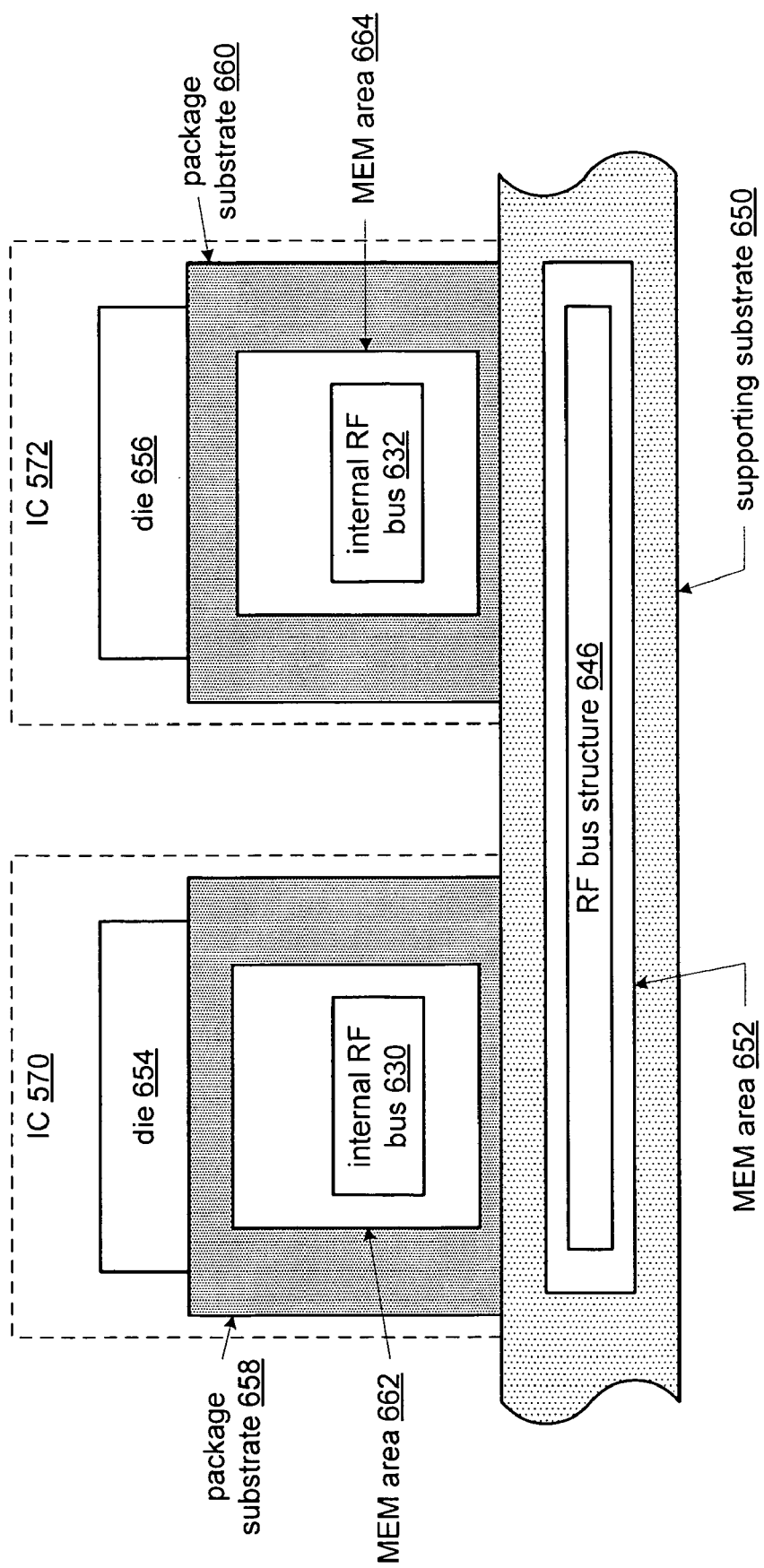
FIGS. 41 and 42 are diagrams of embodiments of a device in accordance with the present invention.

FIG. 41 is a diagram of an embodiment of a device that includes the plurality of integrated circuits (ICs) 570-572, the RF bus structure 646, and a supporting substrate 650. In this embodiment, each of the ICs 570-572 includes a die 654, 656, and a package substrate 658, 660, the package substrate 658, 660 includes a package substrate MEM area 662, 664, and the supporting substrate 650 includes a supporting substrate micro-electromechanical (MEM) area 652.

The MEM areas of the package substrate 658, 660 and the supporting substrate 650 may be used in a variety of ways to provide the internal IC RF bus communications and the external IC RF bus communications. For example, the external RF bus structure 646 may be within the supporting substrate MEM area 652 and the internal RF bus structures 630, 632 may be within the respective package substrate MEM areas 662, 664. As another example, the external RF bus antenna interface 638, 640 and the external RF bus antenna structure 642, 644 may be within the package substrate MEM area 662, 664. As yet another example, the external RF bus antenna interface 638, 640 may be within the package substrate MEM area 662, 664 and the external RF bus antenna structure 642, 644 may be within the supporting substrate MEM area 652. The later two examples are similar to the examples provided in FIGS. 36-37.

In another embodiment, the die 654, 656 may include a die MEM area, which contains therein an impedance matching circuit of one of the plurality of internal RB bus antenna interfaces 610-616. In such an embodiment, a transmission line of one of the plurality of internal RB bus antenna interfaces 610-616, the corresponding internal RF bus antenna structure 620-626, and the internal RF bus structure 630-632 may be within the package substrate MEM area 662, 664.

In an embodiment of an external RF bus communication between two circuit different ICs, the external RF bus antenna structure 642 of one IC 570 has a three-dimensional aperture antenna shape, a three-dimensional lens shape, or a three-dimensional dipole shape. The external RF bus antenna structure 644 of a second IC 572 has the three-dimensional aperture antenna shape, the three-dimensional lens shape, or the three-dimensional dipole shape.

The external RF bus structure 646 has a three-dimensional waveguide construct that is proximally located between the external RF bus antenna structures 642, 644 of the ICs 570-572. In this manner, external RF bus communications between the ICs can be substantially contained with the external RF bus structure 6464 and, with the three-dimensional antenna design and relatively short travel distances, the transmit power can be very low (e.g., <−50 dBm).

Figure 42:
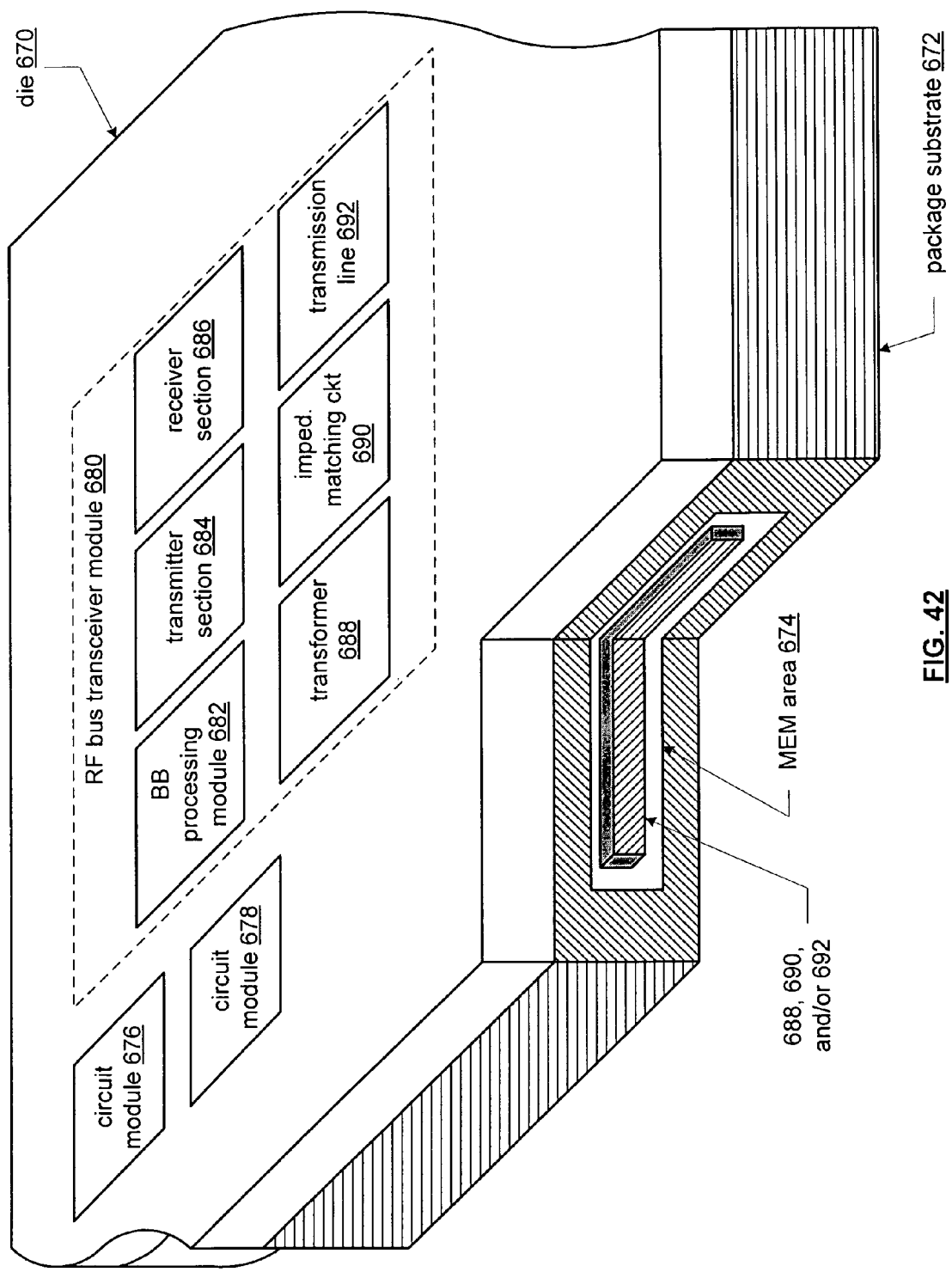

FIG. 42 is a diagram of an embodiment of an IC 500-502, 570-572 that includes a plurality of circuit modules 676, 678, an RF bus transceiver module 680, a die 670, and a package substrate 672. The RF bus transceiver module 680 includes an RF bus transceiver and an antenna interface module. The RF bus transceiver includes a baseband (BB) processing module 682, a transmitter section 684, and a receiver section 686. The antenna interface module includes one or more of a transformer 688, an impedance matching circuit 690, and a transmission line 692. The package substrate 672 supports the die and includes a micro-electromechanical (MEM) area 674.

In this embodiment, the baseband processing module 682, which may be single processing device or a plurality of processing devices as previously defined, is coupled to convert outbound bus data into an outbound bus symbol stream. The transmitter section 684 is coupled to convert the outbound bus symbol stream into an outbound RF bus signal, which is provided to the transformer 688. The transformer 688 includes a differential winding coupled to the transmitter section 684 and a single-ended winding coupled to the impedance matching circuit 690.

The impedance matching circuit 690 adjusts gain, phase, and/or impedance of the single-ended outbound RF bus signal and provides the adjusted single-ended outbound RF bus signal to the transmission line 692 for conveyance to an antenna structure. The transmission line 692 is also coupled to receive a single-ended inbound RF bus signal from the antenna structure and to provide it to the impedance matching circuit 690.

The impedance matching circuit 690 adjusts gain, phase, and/or impedance of the single-ended inbound RF bus signal and provides the adjusted single-ended outbound RF bus signal to single-ended winding of the transformer 688. The transformer 688 converts the single-ended inbound RF bus signal into a differential inbound RF bus signal via the differential winding or a second differential winding. The transformer provides the differential inbound RF bus signal to the receiver section 686.

The receiver section 686 is coupled to convert an inbound RF bus signal into an inbound bus symbol stream. The baseband processing module 682 converts the inbound bus symbol stream into inbound bus data. In this embodiment, at least one of the transformer 688, the impedance matching circuit 690, and the transmission line 692 is within the MEM area 674.

Figure 43:
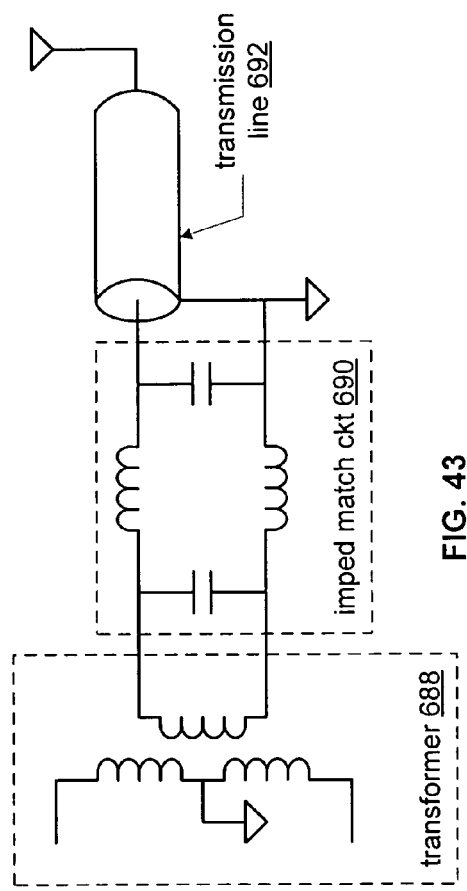
FIG. 43 is a schematic block diagram of an embodiment of a portion of an RF bus transceiver module in accordance with the present invention.

FIG. 43 is a schematic block diagram of an embodiment of a portion of an RF bus transceiver module 680 that includes the transformer 688, the impedance matching circuit 690, and the transmission line 692. In this diagram, the transformer includes a differential winding and a single-ended winding; and the impedance matching circuit 690 includes at least one capacitor and at least one inductor (2 of each are shown, but could include more or less of each, at least one of the capacitors and inductors may be adjustable or including a selectable network of capacitors or inductors). In an embodiment, the transmission line 692, when implemented within the MEM area 674 may have a three-dimensional shape corresponding to a coaxial cable.

Figure 44:
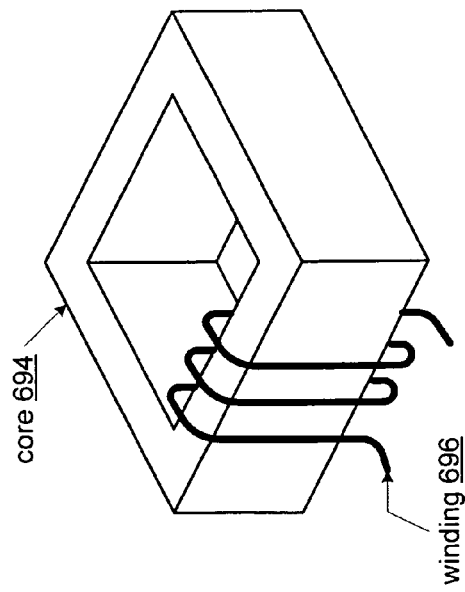
FIG. 44 is a diagram of an embodiment of an inductor and/or transformer accordance with the present invention.

FIG. 44 is a diagram of an embodiment of a three-dimensional inductor of the impedance matching circuit 690 and/or a three-dimensional transformer 688 implemented within the MEM area 674. The inductor and/or transformer 688 may have an air core, a ferrite core, or other material that provides a medium for electromagnetic waves. The core 694 may be of any shape to provide the desired magnetic coupling of the winding 696. Note that the transformer 688 would include multiple windings 696.

Figure 45:
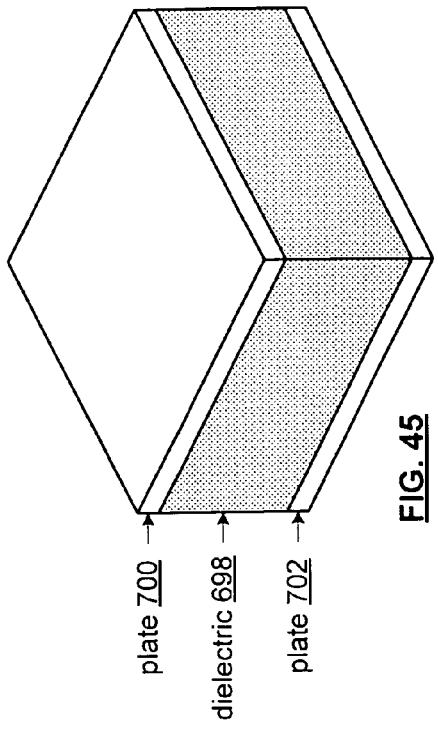
FIG. 45 is a diagram of an embodiment of a capacitor accordance with the present invention.

FIG. 45 is a diagram of an embodiment of a three-dimensional capacitor of the impedance matching circuit 690. The three-dimensional capacitor includes first and second plates 700 and 702, which may be any conductive material, and a dielectric 698, which may be air or any other type of dielectric material that can sustain an electric field. Note that the shape of the plates 700 and 702 may be square as shown or some other geometric shape.

Figure 46:
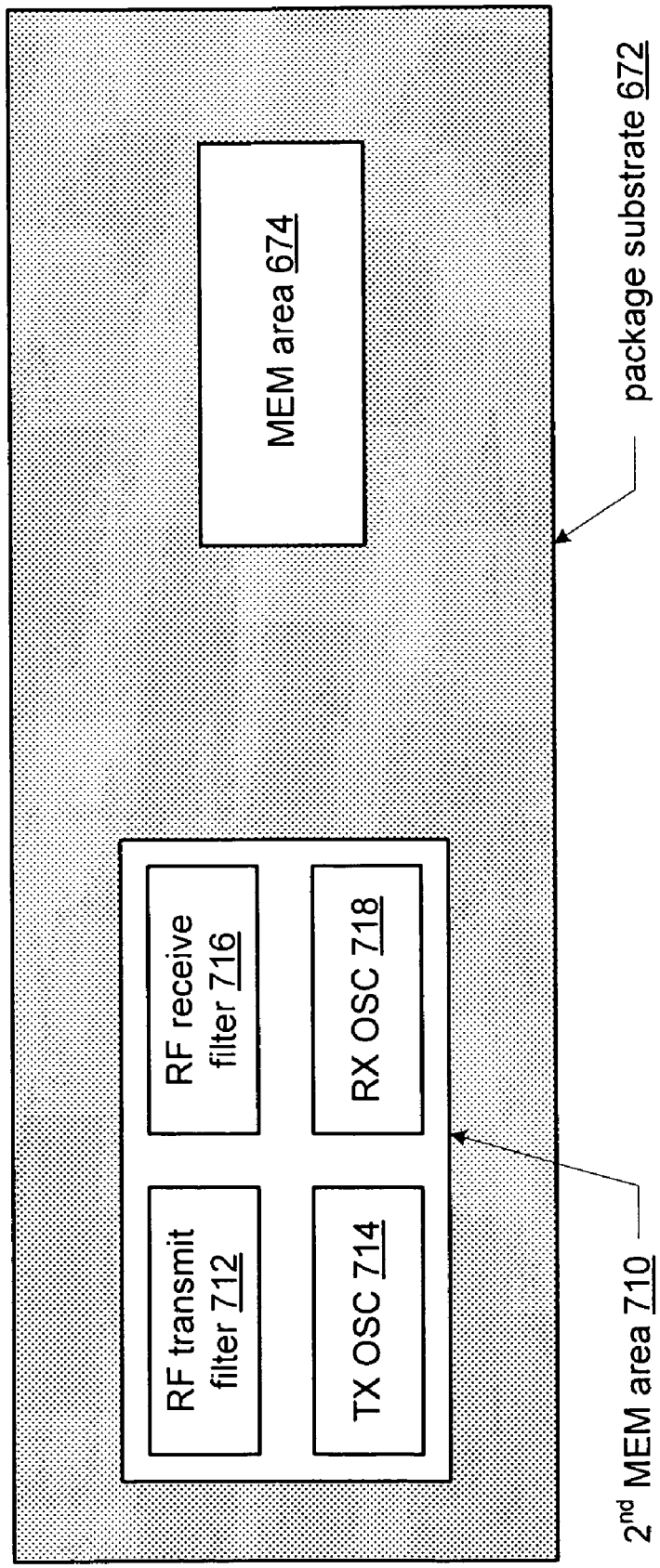
FIGS. 46 and 47 are diagrams of embodiments of an IC in accordance with the present invention.

FIG. 46 is a diagram of an embodiment of a package substrate 672 of an IC. The package substrate 674 includes two MEM areas 674 and 710. The second MEM area 710 supports an RF transmit filter 712, a transmit oscillator (TX OSC) 714, an RF receive filter 716, and/or a receive oscillator (RX OSC) 718. The RF transmit filter 714 may be a low pass filter, a bandpass filter, or a high pass filter used within the transmitter section 684.

The transmitter section 684 also includes the transmit oscillator 714, which generates a local oscillation for mixing with the outbound bus symbol stream to produce the outbound RF bus signal. The transmit oscillator 714 may be implement as shown in FIG. 31, may be a phase locked loop, or some other controlled resonating circuit.

The receiver section 686 includes the RF receive filter 716 and a receive oscillator 718. The RF receive filter 716 may be a low pass filter, a bandpass filter, or a high pass filter and the receive oscillator 718 generates a local oscillation for mixing with the inbound RF bus signal to produce the inbound bus symbol stream. The receive oscillator 718 may be implement as shown in FIG. 31, may be a phase locked loop, or some other controlled resonating circuit.

Figure 47:
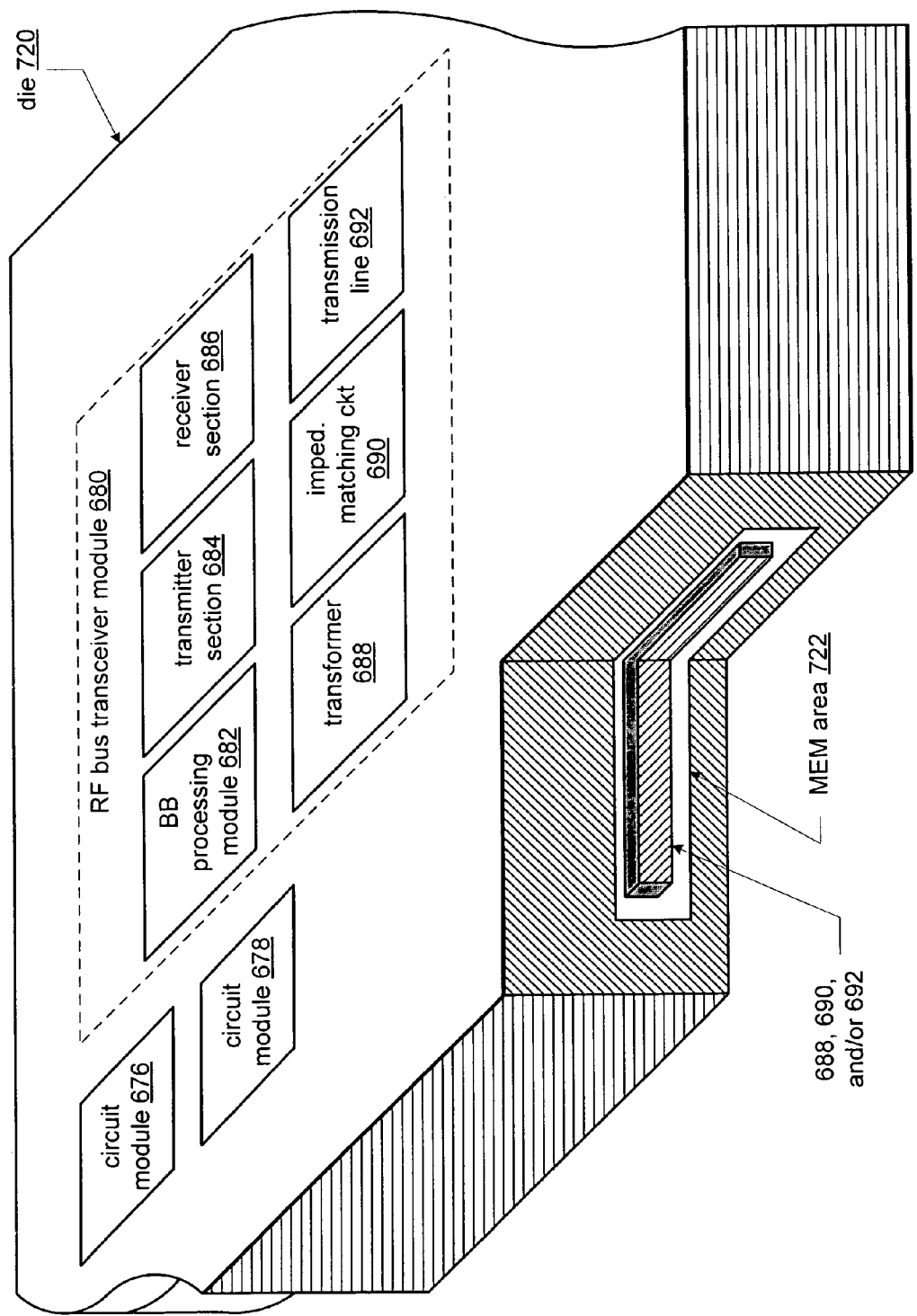

FIG. 47 is a diagram of an embodiment of an IC 500-502, 570-572 that includes a plurality of circuit modules 676, 678, an RF bus transceiver module 680, and a die 720. The RF bus transceiver module 680 includes an RF bus transceiver and an antenna interface module. The RF bus transceiver includes a baseband (BB) processing module 682, a transmitter section 684, and a receiver section 686. The antenna interface module includes one or more of a transformer 688, an impedance matching circuit 690, and a transmission line 692. The die includes a micro-electromechanical (MEM) area 722. In this embodiment, at least one of the transformer 688, the impedance matching circuit 690, and the transmission line 692 is within the MEM area 722.

Figure 48:
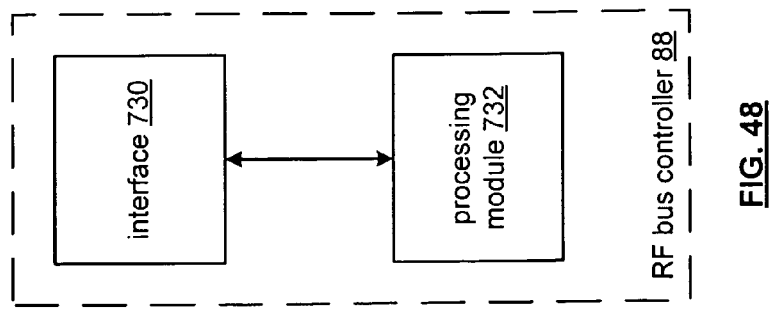
FIG. 48 is a schematic block diagram of an embodiment of an RF bus controller in accordance with the present invention.

FIG. 48 is a schematic block diagram of an embodiment of an RF bus controller 88 that includes an interface 730 and a processing module 732. The processing module 732 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 732 may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the processing module 732 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Further note that, the memory element stores, and the processing module 732 executes, hard coded and/or operational instructions corresponding to at least some of the steps and/or functions illustrated in FIGS. 49-55.

The interface 730 may be a wireline interface (e.g., an Ethernet connection, a USB connection, an I2C connection, an I2S connection, or any other type of serial interface) or a wireless interface (e.g., WLAN, WPAN, Intra-device communication, etc.) If the interface 730 is a wireless interface, it may include a transceiver module to access a control RF communication path having a different frequency than a frequency of the RF bus, a transceiver module to access a control time slot of a time division multiple access partitioning of the RF bus, a transceiver module to access a control frequency slot of a frequency division multiple access partitioning of the RF bus, or a transceiver module to access the RF bus for communicating the intra-device RF bus access requests and allocations via a carrier sense multiple access (CSMA) protocol. Regardless of the type of interface, the interface 732 is coupled for communicating intra-device RF bus access requests and allocations.

Figure 49:
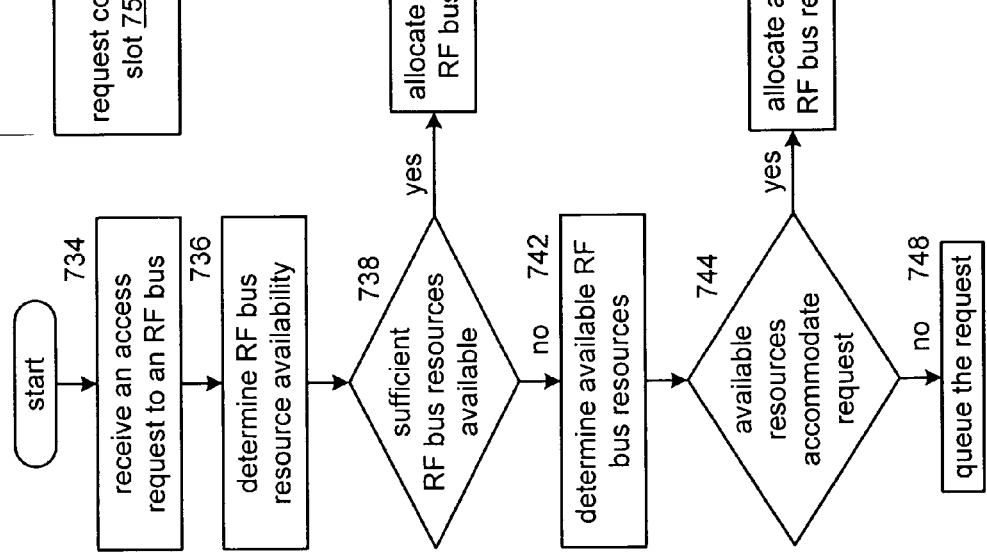
FIG. 49 is a logic diagram of method for controlling access to an RF bus in accordance with the present invention.

FIG. 49 is a logic diagram of method for controlling access to an RF bus that is performed by the RF bus controller 88. The method begins at step 734 where the RF Bus controller 88 receives an access request to an RF bus via the interface 730. The access request may be received in a variety of ways. For example, the access request may be received in response to a polling request, in an allocated time division multiple access (TDMA) slot, in response to a token ring passing scheme, in accordance with a carrier sense multiple access (CSMA) protocol of a RF bus control resource, in accordance with an interrupt protocol, in an allocated frequency division multiple access (FDMA) slot, and/or in an allocated code division multiple access (CDMA) slot.

The method continues at step 736 where the RF bus controller 88 determines RF bus resource availability. This step may also include determining an RF bus protocol based on the access request. The RF bus protocol may be a standardized wireless protocol (e.g., GSM, EDGE, GPRS, IEEE 802.11, Bluetooth, etc), a proprietary wireless protocol, and/or a modified standardized wireless protocol (based on one of the standard protocols but modified, for instance, using an IEEE 802.11 protocol but skipping the interleaving). The determining of the RF bus resource availability will be described in greater detail with reference to FIG. 51.

The method branches at step 738 based on whether sufficient RF bus resources are availability. When sufficient RF bus resources are available, the process proceeds to step 740 where the RF bus controller allocates, via the interface, at least one RF bus resource in response to the access request. Note that the RF bus resources include, but are not limited to, a Single Input Single Output (SISO) channel, a Multiple Input Multiple Output (MIMO) channel, multiple SISO channels, multiple MIMO channels, null-reinforce multipath patterning (e.g., use multipath reinforced areas for RF bus communications between two ICs and multipath nulls to block RF bus communications between two ICs), frequency band selection, a TDMA slot, a CDMA slot, an FDMA slot, an unused free-space RF communication path or channel, an unused waveguide RF communication path or channel, an unused dielectric RF communication path or channel, and/or any other medium or portioning scheme for transmitting RF signals.

When sufficient RF bus resources are not available, the method proceeds to step 742 where the RF bus controller 88 determining what RF bus resources are available. The method then proceeds to step 744 where the RF bus controller determines whether the access request can be adequately accommodated by the available RF bus resources. In other words, optimal servicing of the original resource request would require a certain level of RF bus resource allocation based on the amount of data to be transmitted, the type of data being transmitted, the requester of the RF bus access, the target(s) of the data, etc. In this instance, the optimal amount of RF bus resources is not available, but there are some resources available and the RF bus controller is determining whether this less than optimal amount of RF bus resources can adequately accommodate (e.g., less than optimal, but acceptable) the request. For example, assume that for a particular RF bus access request, the optimal amount of RF bus resources supports a data transfer rate of 100 Mega-bits per second, but that the available RF bus resources can only accommodate 66 Mega-bits per second. In this example, the RF bus controller 88 will determine whether the 66 Mbps rate will accommodate the request (i.e., won't suffer loss of data integrity, loss of data continuity, etc.).

When the access request can be accommodated by the available RF bus resources, the method proceeds to step 746 where the RF bus controller 88 allocates the available RF bus resources to for the access request. If, however, the access request cannot be accommodated by the available RF bus resources, the method proceeds to step 748 where the RF bus controller queues the access request.

Figure 50:
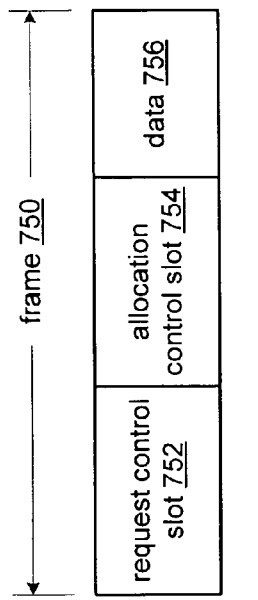
FIG. 50 is a diagram of another embodiment of a frame of an RF bus communication in accordance with the present invention.

FIG. 50 is a diagram of another embodiment of a frame 750 of an RF bus communication that includes a request control slot 752, an allocation control slot 754, and a data slot(s) 756. In this embodiment, the slots 752-756 may be TDMA slots, FDMA slots, or CDMA slots on a single channel or multiple channels. Access to the request control slot 752 be allocated to the requesting ICs or circuit modules by the RF bus controller 88 in a round robin manner, in a poll-request manner, in a CSMA with collision avoidance manner, etc.

In this embodiment, when an IC or circuit module has data to transmit via an RF bus (e.g., intra-IC RF bus and/or inter-IC RF bus), the requesting IC or circuit module provides its request within the request control slot 752. The requesting IC or circuit module waits until it detects an RF bus grant from the RF bus controller via the allocation control slot 754. The RF bus grant will indicate the RF bus resources being allocated, the duration of the allocation, etc. and may further include an indication of the RF bus protocol to be used. Once the requesting IC or circuit module has been granted access, it transmits its data via the allocated RF bus resources during the appropriate data slots 756.

Figures 51, 52:
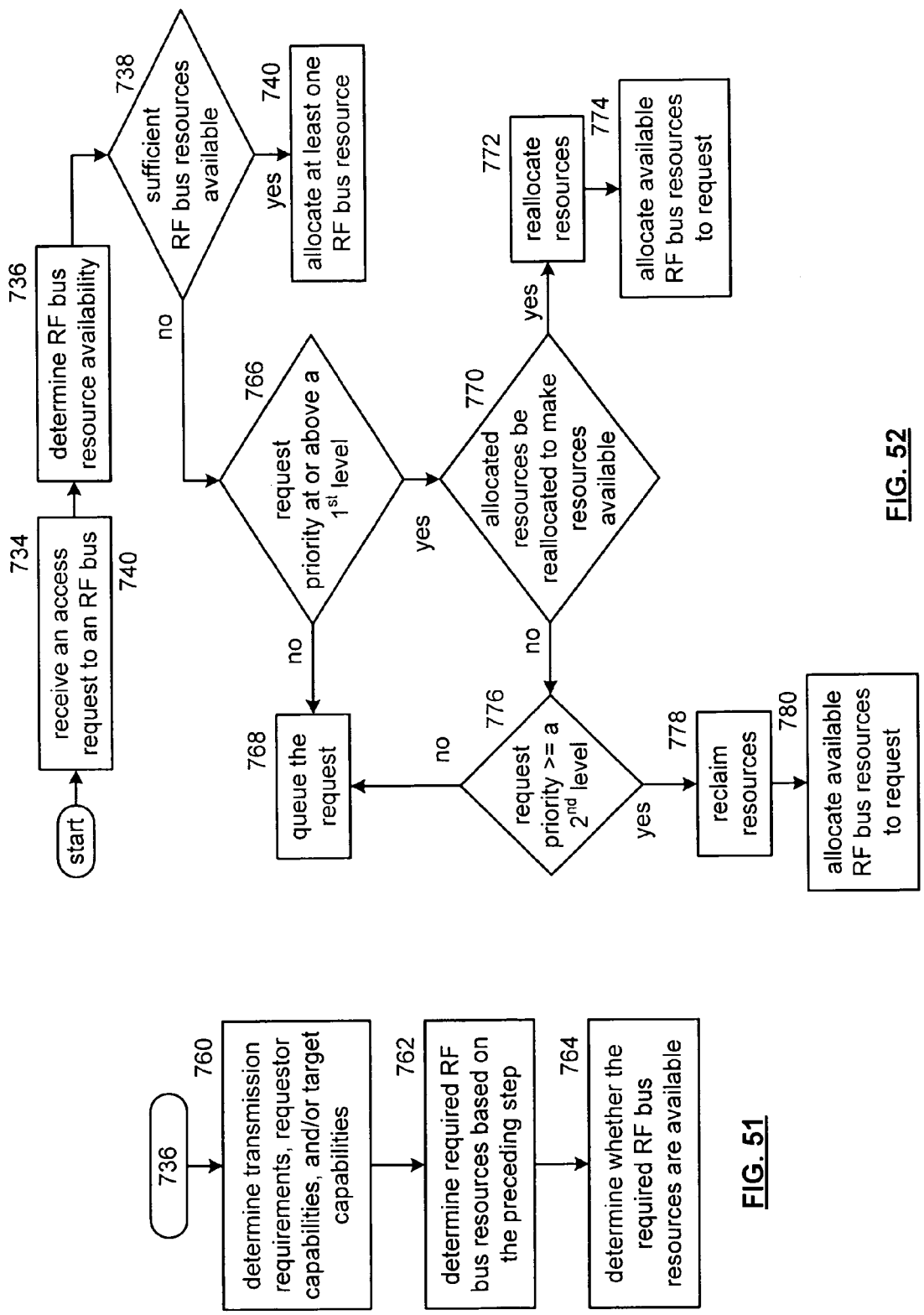
FIG. 51 is a logic diagram of method for determining RF bus resource availability in accordance with the present invention.
FIG. 52 is a logic diagram of another method for controlling access to an RF bus in accordance with the present invention.

FIG. 51 is a logic diagram of method for determining RF bus resource availability of step 736 of FIG. 49. This method begins at step 760 where the RF bus controller determines transmission requirements of the access request, RF bus capabilities of requester, and/or RF bus capabilities of target. The transmission requirements include one or more of amount of information to be conveyed, priority level of requester (e.g., application level priority, operating system level priority, continuous data priority, discontinuous data priority, etc.), priority level of the information to be conveyed (e.g., application data, interrupt data, operating system data, etc.), real-time or non-real-time aspect of the information to be conveyed, and/or information conveyance integrity requirements.

The conveyance integrity requirements relate to the sensitivity of the data, the requester, and/or the target is to data transmission errors and the ability to correct them. Thus, if any of the target or requestor is intolerant to data transmission errors and/or they cannot be corrected, the data needs to be transmitted with the highest level of integrity to insure that very few data transmission errors will occur. Conversely, if the requestor and target can tolerate data transmission errors and/or can correct them; lower levels of integrity can be used to provide an adequate RF bus communication. Thus, the RF bus controller may consider the RF communication paths available (e.g., waveguide, dielectric, free-space), the level of rate encoding, the level of interleaving, the level of error correction, and/or the level of acknowledgement. For example, a request that can tolerate data transmission errors, the data may be bi-phase encoded with no interleaving and rate encoding and transmitted over a free-space RF communication path, where a request that cannot tolerate data transmission errors, the data will be encoded using the rate encoding, it will be interleaved, error correction (e.g., forward error correct) enabled, and transmitted over a waveguide RF communication path.

The method then proceeds to step 762 where the RF bus controller determines required RF bus resources based on the at least one of the transmission requirements, the RF bus capabilities of the requester, and the RF bus capabilities of the target. The method then proceeds to step 764 where the RF bus controller determines whether the required RF bus resources are available for allocation.

FIG. 52 is a logic diagram of another method for controlling access to an RF bus that is performed by the RF bus controller 88. The method begins at step 734 where the RF Bus controller 88 receives an access request to an RF bus via the interface 730. The access request may be received in a variety of ways. For example, the access request may be received in response to a polling request, in an allocated time division multiple access (TDMA) slot, in response to a token ring passing scheme, in accordance with a carrier sense multiple access (CSMA) protocol of a RF bus control resource, in accordance with an interrupt protocol, in an allocated frequency division multiple access (FDMA) slot, and/or in an allocated code division multiple access (CDMA) slot.

The method continues at step 736 where the RF bus controller 88 determines RF bus resource availability. This step may also include determining an RF bus protocol based on the access request. The RF bus protocol may be a standardized wireless protocol (e.g., GSM, EDGE, GPRS, IEEE 802.11, Bluetooth, etc), a proprietary wireless protocol, and/or a modified standardized wireless protocol (based on one of the standard protocols but modified, for instance, using an IEEE 802.11 protocol but skipping the interleaving). The determining of the RF bus resource availability was described with reference to FIG. 51.

The method branches at step 738 based on whether sufficient RF bus resources are availability. When sufficient RF bus resources are available, the process proceeds to step 740 where the RF bus controller allocates, via the interface, at least one RF bus resource in response to the access request. Note that the RF bus resources include, but are not limited to, a Single Input Single Output (SISO) channel, a Multiple Input Multiple Output (MIMO) channel, multiple SISO channels, multiple MIMO channels, null-reinforce multipath patterning (e.g., use multipath reinforced areas for RF bus communications between two ICs and multipath nulls to block RF bus communications between two ICs), frequency band selection, a TDMA slot, a CDMA slot, an FDMA slot, an unused free-space RF communication path or channel, an unused waveguide RF communication path or channel, an unused dielectric RF communication path or channel, and/or any other medium or portioning scheme for transmitting RF signals.

When sufficient RF bus resources are not available, the method proceeds to step 766 where the RF bus controller 88 determines whether priority of requestor is at or above a first priority level. The priority level may be user defined, system defined, an ordering based on data type (e.g., operating system level data, application level data, interrupt data, real-time or continuous data v. non-real-time or discontinuous data, etc.), system level based (e.g., processing module, memory, peripheral device, etc. in order) and/or any other priority and/or ordering scheme. When the request is not above the $1^{st}$ level, the method proceeds to step 768 where the RF bus controller queues the request.

When priority of the requester is at or above the first priority level, the method proceeds to step 77 where the RF bus controller 88 determines whether allocated RF bus resources can be reallocated to make available the sufficient RF bus resources. In this determination, the RF bus controller is determining whether existing RF bus communications can have their RF bus resources reallocated such that their level of service is below optimal, but still acceptable, to make sufficient resources available for the $1^{st}$ level or higher priority RF bus request.

When the RF bus resources can be reallocated, the method proceeds to step 772 where the RF bus controller reallocates at least some of the allocated RF bus resources to make resources available for the $1^{st}$ level or higher priority RF bus request. The method then proceeds to step 774 where the RF bus controller 88 allocates the sufficient RF bus resources to the $1^{st}$ level or higher priority request.

When the allocated RF bus resources cannot be reallocated and still provide an acceptable level of performance, the RF bus controller 88 determines whether the priority of the requester is of a second priority level (i.e., of the highest level that if its request is not timely satisfied, the entire system or device may lock up). If the priority is not at the $2^{nd}$ level, the method proceeds to step 768 where the RF bus controller 88 queues the request.

If, however, the priority level of the requestor is of the second priority level, the method proceeds to step 778 where the RF bus controller reclaims RF bus resources from the allocated RF bus resources to provide the sufficient RF bus resources. In other words, the RF bus controller cancels a current RF bus communication to reclaim them for the $2^{nd}$ priority level request. In one embodiment, the current RF bus communication having the most tolerance to a data transmission interruption is selected for reclaiming the RF bus resources. The method then proceeds to step 780 where the RF bus controller 88 allocates the reclaimed RF bus resources to the $2^{nd}$ priority level requestor.

Figure 53:
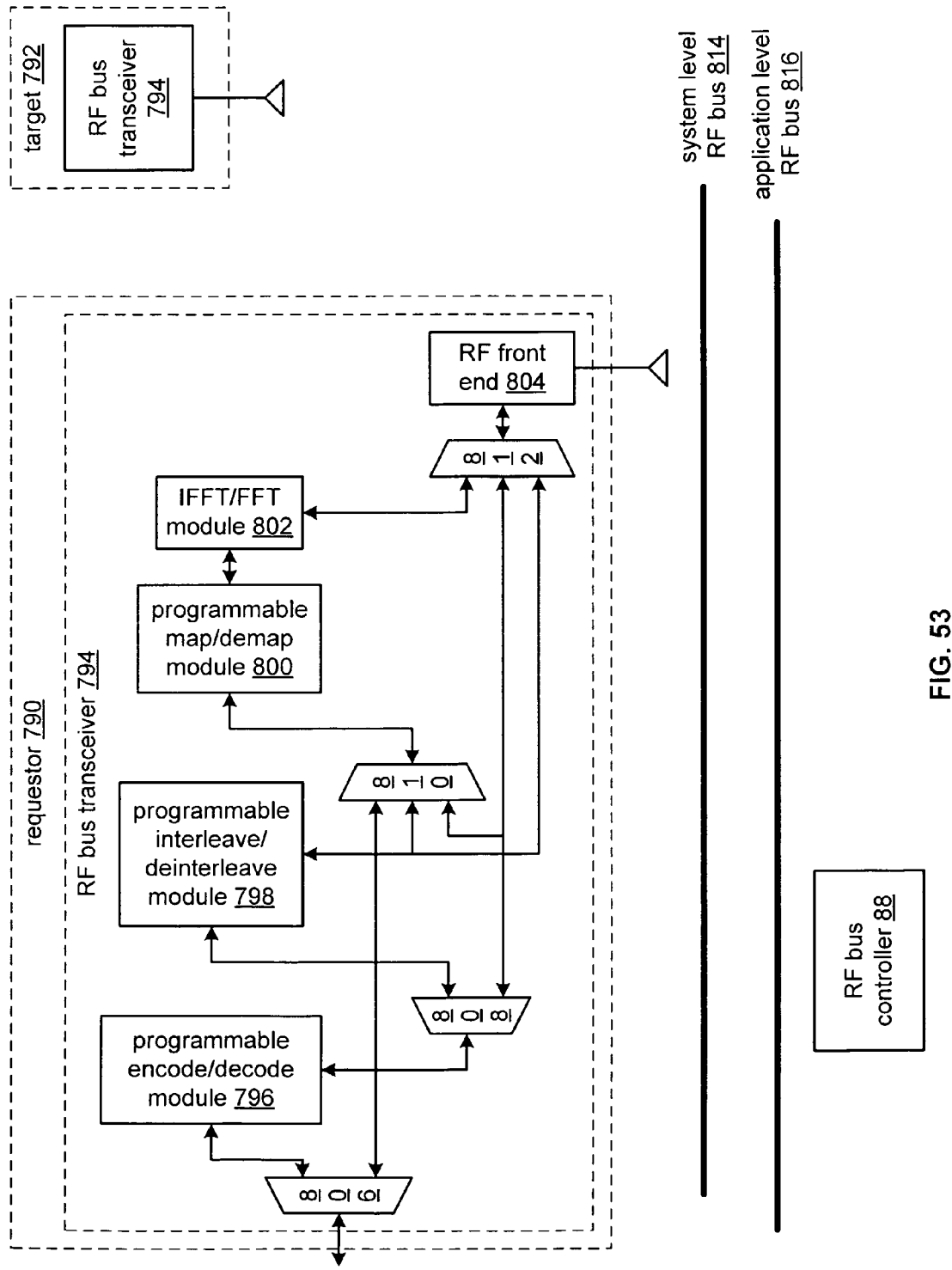
FIG. 53 is a schematic block diagram of another embodiment of a device in accordance with the present invention.

FIG. 53 is a schematic block diagram of another embodiment of a device 80 that includes a requester IC or circuit module 790, a target IC or circuit module 792, the RF bus controller 88, a system level RF bus 814, and an application level RF bus 816. The requestor 790 and the target 792 each include an RF bus transceiver 974. The RF bus transceiver 794 includes a programmable encode/decode module 796, a programmable interleave/deinterleave module 798, a programmable map/demap module 800, an inverse fast Fourier transform (IFFT)/FFT module 804, an RF front-end 804, and a plurality of multiplexers 806-810. The system level RF bus 814 and the application level RF bus 816 each include one or more waveguide RF communication paths, one or more dielectric RF communication paths, and/or one or more free-space RF communication paths.

In this embodiment, the RF bus controller 88 controls access to the system level RF bus 814 for operating system level data conveyances and controls access to the application level RF bus 816 for application level data conveyances. Such data conveyances may include control information, operational instructions, and/or data (e.g., raw data, intermediate data, processed data, and/or stored data that includes text information, numerical information, video files, audio files, graphics, etc.).

In addition to controlling access to the RF buses 814 and 816, the RF bus controller 88 may indicate to the RF bus transceivers 794 the RF bus protocol to be used for converting outbound data into outbound RF bus signals. For example, the RF bus protocol may be a standardized wireless protocol (e.g., IEEE 802.11, Bluetooth, GSM, EDGE, GPRS, CDMA, etc.), may be a proprietary wireless protocol, or a modified standard wireless protocol.

For example, if the RF bus controller 88 indicates using a standard IEEE 802.11 wireless protocol (e.g., IEEE 802.11a, b, g, n, etc.), the RF bus transceiver 794 enables the programmable modules 796, 798, and 800 and the multiplexers 806-810 to perform in accordance with the IEEE 802.11 standard. For instance, multiplexer 806 provides outbound data to the programmable encoding/decoding module 706 that performs a half rate (or other rate) convolution encoding on the outbound data to produce encoded data. The programmable encoding/decoding module 706 may further puncture the encoded data to produce punctured data.

Continuing with the example, the encoded or punctured data is outputted to multiplexer 808, which provides the data to the programmable interleave/deinterleave module 708. The programmable interleave/deinterleave module 708 interleaves bits of different encoded data words to produce interleaved data. Multiplexer 810 provides the interleaved data to the programmable map/demap module 800 which maps the interleaved data to produce mapped data. The mapped data is converted from the frequency domain to the time domain by the IFFT portion of the IFFT/FFT module 802 to produce an outbound symbol stream. Multiplexer 810 provides the outbound symbol stream to the RF front end 804, which includes an RF transmitter section and an RF receiver section. The RF transmitter section converts the outbound symbol stream into an outbound RF bus signal.

The target 792 receives the outbound RF bus signal via the system level RF bus 814 or the application level RF bus 816 via its RF bus transceiver 794. The receiver section of the RF front end 804 converts the received RF bus signal into an inbound symbol stream. The FFT portion of the IFFT/FFT module 802 converts the inbound symbol stream from the time domain to the frequency domain to produce inbound mapped data. The programmable map/demap module 800 demaps the inbound mapped data to produce inbound interleaved data. Multiplexer 810 provides the inbound interleaved data to the programmable interleave/deinterleave module 798, which deinterleaves the inbound interleaved data to produce encoded or punctured data. The programmable encoding/decoding module 796 depunctures and/or decodes the encoded or punctured data to recapture the data.

As an example of a modified standard wireless protocol, multiplexer 806 provides outbound data to the programmable encoding/decoding module 706 that performs a half rate (or other rate) convolution encoding on the outbound data in accordance with a standard wireless protocol (e.g., IEEE 802.11) to produce encoded data. The programmable encoding/decoding module 706 may further puncture the encoded data to produce punctured data.

Continuing with the example, the encoded or punctured data is outputted to multiplexer 808, which provides the data to the programmable map/demap module 800 which maps the encoded or punctured data to produce mapped data. The mapped data is converted from the frequency domain to the time domain by the IFFT portion of the IFFT/FFT module 802 to produce an outbound symbol stream. Multiplexer 810 provides the outbound symbol stream to the RF transmitter section, which converts the outbound symbol stream into an outbound RF bus signal. As illustrated by this example, a modified standard wireless protocol is based on a standard wireless protocol with one or more of its functional steps omitted or modified.

As another example of a modified standard wireless protocol, multiplexer 806 provides outbound data to the programmable map/demap module 800 which maps the outbound data to produce mapped data. The mapped data is converted from the frequency domain to the time domain by the IFFT portion of the IFFT/FFT module 802 to produce an outbound symbol stream, which is subsequently converted into the outbound RF bus signal.

As an example of a proprietary RF bus protocol, multiplexer 806 provides outbound data to the programmable encoding/decoding module 706 that performs a bi-phase, return to zero (RTZ), non-return to zero (NRZ), and/or another binary encoding scheme to produce binary encoded data. The binary encoded data may be provided directly to the RF front end 804 via multiplexers 808 and 812, to the programmable interleave/deinterleave module 798 via multiplexer 808, or to the programmable map/demap module 800 via multiplexers 808 and 810.

The programmable map/demap module 800 may be programmed to map/demap data in a variety of ways. For example, the programmable map/demap module 800 may map the data into Cartesian coordinates having an in-phase component (e.g., $A_I(t)\cos \omega(t)$) and a quadrature component (e.g., $A_Q(t)\sin \omega(t)$). As another example, the programmable map/demap module 800 may map the data into polar coordinates (e.g., $A(t) \cos(\omega(t)+\phi(t))$). As yet another example, the programmable map/demap module 800 may map the data into hybrid coordinates having a normalized in-phase component (e.g., $\cos(\omega(t)+\phi(t))$) and a normalized quadrature component (e.g., $\sin(\omega(t)+\phi(t))$).

Figure 54:
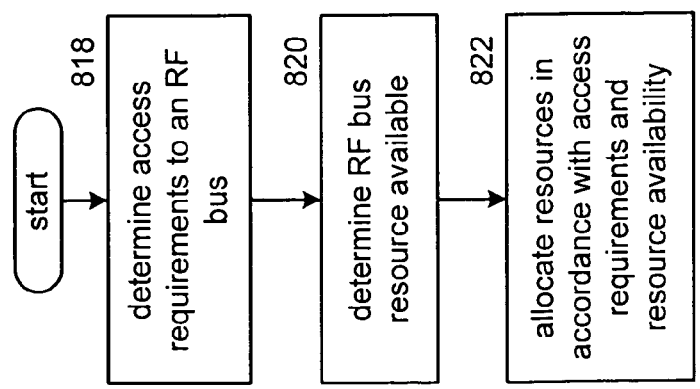
FIG. 54 is a logic diagram of another method for controlling access to an RF bus in accordance with the present invention.

FIG. 54 is a logic diagram of another method for controlling access to an RF bus. The method begins at step 818 where the RF bus controller determines access requirements to an RF bus. The access requirements may include system configuration information, system level RF bus resources, application level RF bus resources, RF bus capabilities of requester, RF bus capabilities of target, amount of information to be conveyed, priority level of requestor, priority level of the information to be conveyed, real-time or non-real-time aspect of the information to be conveyed, and/or information conveyance integrity requirements.

The system configuration information includes number of ICs in the device, number of circuit modules in the ICs, nulling and reinforcing patterns, number and type of intra-device RF data bus, number and type of intra-device RF instruction bus, number and type of intra-device RF control bus, number and type of intra-IC RF data bus, number and type of intra-IC RF instruction bus, number and type of intra-IC RF control bus, types of ICs in the device, and/or bus interface capabilities of the ICs and/or its circuit modules. Note that the information conveyance integrity requirements include level of rate encoding (e.g., ½ rate, ¾ rate, etc.), level of interleaving, level of error correction, and/or level of acknowledgement (e.g., whether an ACK back is required or not, if required content of the ACK). Further note that the system level RF bus resources and the application level RF bus resources includes a Single Input Single Output (SISO) channel, a Multiple Input Multiple Output (MIMO) channel, multiple SISO channels, multiple MIMO channels, null-reinforce multipath patterning, frequency band selection, waveguide RF path, dielectric RF path, free space RF path, time division multiple access (TDMA) time slot, frequency division multiple access (FDMA) frequency slot, code division multiple access (CDMA) code slot, proprietary resource, and carrier sense multiple access (CSMA).

The method then proceeds to step 820 where the RF bus controller determines RF bus resource available. This step may further include determining an RF bus protocol based on the access request, wherein the RF bus protocol is one of: a standardized wireless protocol, a proprietary wireless protocol, and a modified standardized wireless protocol.

The method then proceeds to step 822 where the RF bus controller allocates, via the interface, RF bus resources in accordance with the access requirements and the RF bus resource availability. This may be done by determining whether sufficient RF bus resources are available to fulfill the access requirements; when the sufficient RF bus resources are available to fulfill the access request, allocating the sufficient RF bus resources to a requester; when the sufficient RF bus resources are not available to fulfill the access request, determining available RF bus resources; determining whether the access requirements can be accommodated by the available RF bus resources; when the access request can be accommodated by the available RF bus resources, allocating the available RF bus resources to the requestor; and when the access request cannot be accommodated by the available RF bus resources, queuing the access requirements.

The method may further include, when the sufficient RF bus resources are not available to fulfill the access requirements, the RF bus controller determining whether priority of the requester is at or above a first priority level; when priority of the requestor is at or above the first priority level, determining whether allocated RF bus resources can be reallocated to make available the sufficient RF bus resources; when the allocated RF bus resources can be reallocated, reallocating at least some of the allocated RF bus resources; when the RF bus resources cannot be reallocated, determining whether the priority of the requestor is of a second priority level; when the priority level of the requestor is of the second priority level, reclaiming RF bus resources from the allocated RF bus resources to provide the sufficient RF bus resources; and when the priority level of the requestor is below the second priority level, queuing the access requirements.

Figure 55:
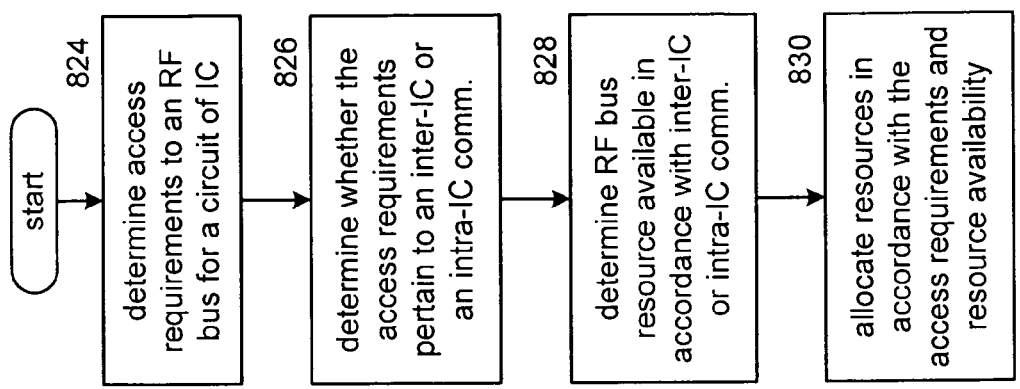
FIG. 55 is a logic diagram of another method for controlling access to an RF bus in accordance with the present invention.

FIG. 55 is a logic diagram of another method for controlling access to an RF bus. The method begins at step 824 where the RF bus controller determines access requirements to an RF bus for a circuit of an integrated circuit (IC) of a plurality of integrated circuits. This may be done as previously discussed. The method then proceeds to step 826 where the RF bus controller determines whether the access requirements pertain to an inter-IC communication or an intra-IC communication.

The method then proceeds to step 828 where the RF bus controller 88 determines RF bus resource available in accordance with inter-IC communication or the intra-IC communication. This may be done as previously described. The method then proceeds to step 830 where the RF bus controller allocates, via the interface, RF bus resources in accordance with the access requirements and the RF bus resource availability.

Figure 56:
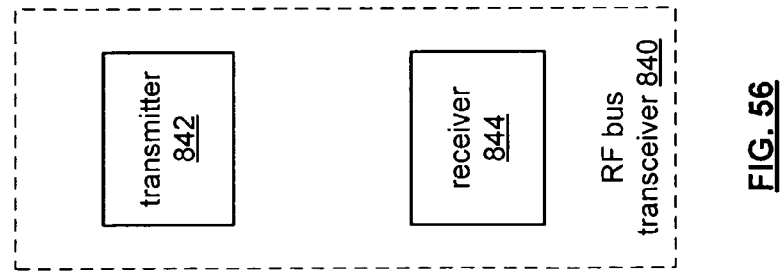
FIG. 56 is a schematic block diagram of an embodiment of an RF bus transceiver in accordance with the present invention.

FIG. 56 is a schematic block diagram of an embodiment of an RF bus transceiver 840 that may be used as or in combination with RF bus transceiver 108, 110, 130, 150, 152, 180-186, 210, 212, 232, 234, 235, 236, 238, 240, 258, 260, 280, 344, 354, 516, 518, 600-604, 635, 645, 680, and/or 794. The RF bus transceiver 840 includes a transmitter 842 and a receiver 844. The transmitter 842 performs the methods of FIGS. 57 and 59 and the receiver 844 performs the method of FIG. 58.

Figure 57:
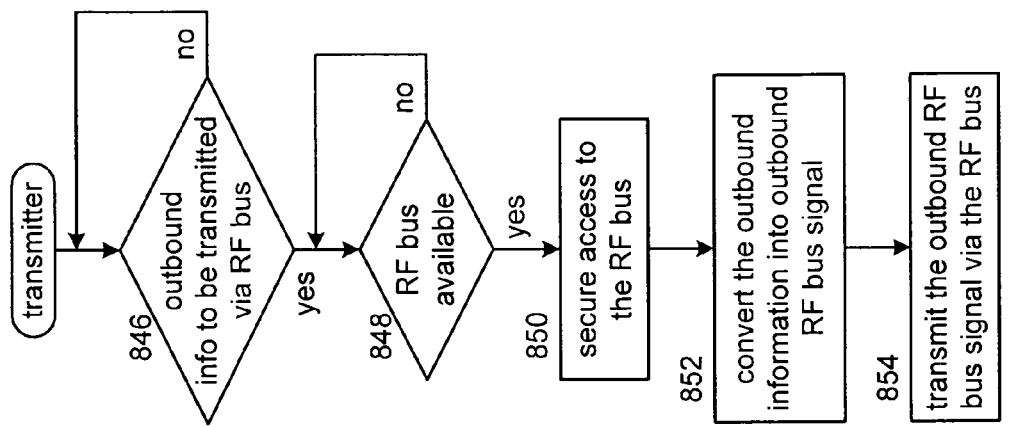
FIG. 57 is a logic diagram of method for RF bus transmitting in accordance with the present invention.

FIG. 57 is a logic diagram of method for RF bus transmitting that begins at step 846 where the transmitter 842 determine whether outbound information is to be transmitted via the RF bus. Such a determination may be made by setting a flag by the IC or circuit module that includes the RF bus transceiver, by providing the outbound information to the RF bus transceiver, and/or any other mechanism for notifying that it has information to transmit.

When the outbound information is to be transmitted via the RF bus, the method proceeds to step 848 where the transmitter 842 determines whether the RF bus is available. When the RF bus is not available, the transmitter 842 waits until the RF bus becomes available. The transmitter 842 may determine by the availability of the RF bus by utilizing a carrier sense multiple access with collision avoidance (CSMA/CD) access protocol, utilizing a request to send frame and clear to send frame exchange access protocol, utilizing a poll-response access protocol, interpreting a control time slot of a time division multiple access (TDMA) frame, interpreting a control frequency slot of a frequency division multiple access (FDMA) frame, interpreting a control code slot of a code division multiple access (CDMA) frame, and/or utilizing a request-grant access protocol.

When the RF bus is available, the method proceeds to step 850 where the transmitter 842 secures access to the RF bus. The transmitter 842 may secure access to the RF bus by accessing the RF bus in accordance with a carrier sense multiple access with collision avoidance (CSMA/CD) access protocol, accessing the RF bus in response to a favorable request to send frame and clear to send frame exchange, accessing the RF bus in accordance with a poll-response access protocol, accessing the RF bus via an allocated time slot of a time division multiple access (TDMA) frame, accessing the RF bus via an allocated frequency slot of a frequency division multiple access (FDMA) frame, accessing the RF bus via an allocated code slot of a code division multiple access (CDMA) frame, and/or accessing the RF bus in accordance with a request-grant access protocol. Note that the transmitter 842 may determine whether the RF bus is available and secures access to the RF bus by communicating with the RF bus controller 88 via a wireline link, via a wireless link, and/or via the RF bus.

The method proceeds to step 852 where the transmitter 842 converts the outbound information into outbound RF bus signal. The method then proceeds to step 844 where the transmitter 842 transmits the outbound RF bus signal via the RF bus when access to the RF bus is secured. As such, the transmitter 842 prepares data for transmission via one of the RF buses in a device and transmits the RF bus signal when it is the transmitter's turn and/or when the RF bus is not in use.

Figure 58:
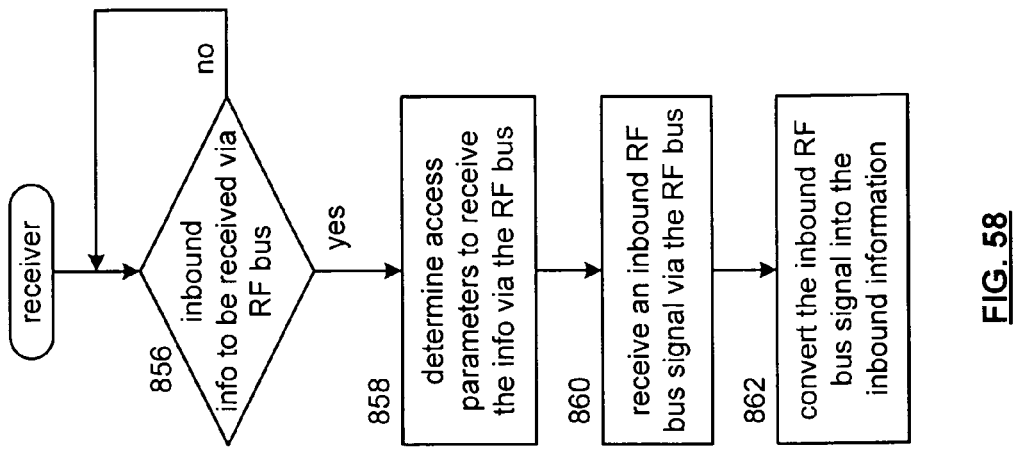
FIG. 58 is a logic diagram of method for RF bus receiving in accordance with the present invention.

FIG. 58 is a logic diagram of method for RF bus receiving that begins at step 856 where the receiver 844 determines whether inbound information is to be received via the RF bus. The receiver 844 may determine that there is inbound information to be received by utilizing a carrier sense multiple access with collision avoidance (CSMA/CD) access protocol, utilizing a request to send frame and clear to send frame exchange access protocol, utilizing a poll-response access protocol, interpreting a control time slot of a time division multiple access (TDMA) frame, interpreting a control frequency slot of a frequency division multiple access (FDMA) frame, interpreting a control code slot of a code division multiple access (CDMA) frame, and/or utilizing a request-grant access protocol.

When there is inbound information to be received via the RF bus, the method proceeds to step 858 where the receiver 844 determines access parameters to the RF bus for receiving the inbound information. The receiver 844 may determine the access parameters by receiving the inbound RF bus signal in accordance with a carrier sense multiple access with collision avoidance (CSMA/CD) access protocol, receiving the inbound RF bus signal in accordance with a request to send frame and clear to send frame exchange, receiving the inbound RF bus signal in accordance with a poll-response access protocol, receiving the inbound RF bus signal via an allocated time slot of a time division multiple access (TDMA) frame, receiving the inbound RF bus signal via an allocated frequency slot of a frequency division multiple access (FDMA) frame, receiving the inbound RF bus signal via an allocated code slot of a code division multiple access (CDMA) frame, and/or receiving the inbound RF bus signal in accordance with a request-grant access protocol. Note that the receiver 844 may determine the access parameters by communicating with the RF bus controller 88 via a wireline link, a wireless link, and/or the RF bus.

The method then proceeds to step 860 where the receiver 844 receives an inbound RF bus signal during the access to the RF bus in accordance with the access parameters. The method then proceeds to step 862 where the receiver 844 converts the inbound RF bus signal into the inbound information.

Figure 59:
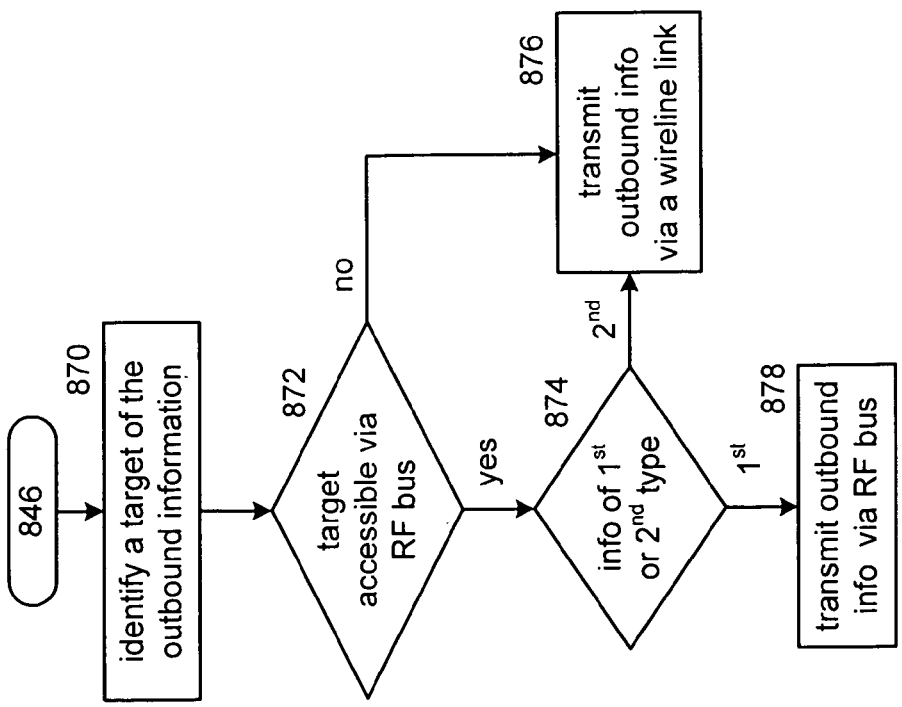
FIG. 59 is a logic diagram of method for determining whether information is to be transmitted via an RF bus in accordance with the present invention.

FIG. 59 is a logic diagram of method for determining whether information is to be transmitted via an RF bus by the transmitter 842. The method begins at step 870 where the transmitter 842 identifies a target of the outbound information. In one embodiment, the outbound information will be in packet or frame format having a header portion that includes the address of the source, the address of the destination, the size of the packet or frame, etc.

The method then proceeds to step 872 where the transmitter 842 determines whether the target is accessible via the RF bus. The target may not be accessible via the RF bus for several reasons. For example, the nature of the data being transmitted may require that it be transmitted via a wireline link, the target may be in a multipath null with respect to the source, the target is currently using the RF bus for another RF bus communication, etc. When the target is not accessible via the RF bus, the method proceeds to step 876 where the transmitter 842 sends the outbound information via a wireline link.

When the target is accessible via the RF bus, the method proceeds to step 874 where the transmitter determines the type of the outbound information to be transmitted. When the type of the outbound information is of a first type (e.g., tolerant of transmission errors), the method proceeds to step 878 where the transmitter 842 indicates that the outbound information is to be transmitted via the RF bus. When the type of the outbound information is of a second type (e.g., not tolerant of transmission errors), the method proceeds to step 876 where the transmitter 842 indicates that the outbound information is to be transmitted via a wireline link. Note that step 874 could be omitted.

Figure 60:
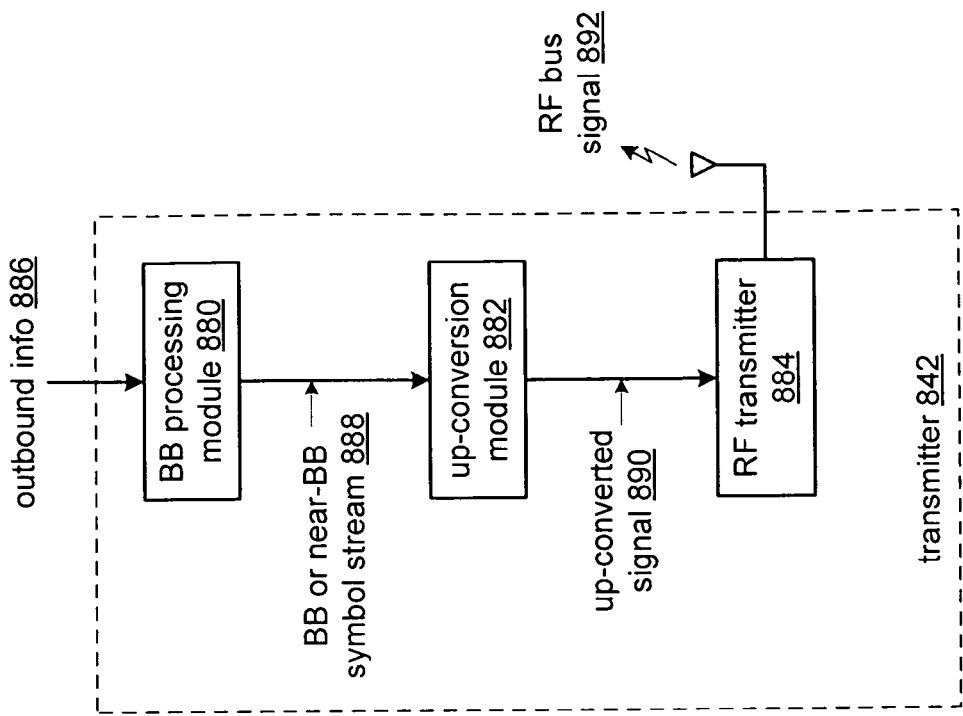
FIG. 60 is a schematic block diagram of an embodiment of a transmitter section of an RF bus transceiver in accordance with the present invention.

FIG. 60 is a schematic block diagram of an embodiment of a transmitter 842 of an RF bus transceiver 840. The transmitter 842 includes a baseband processing module 880, an up-conversion module 882, and an RF transmitter 884. The baseband (BB) processing module 880 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The BB processing module 880 may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the BB processing module 880 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

In operation, the baseband processing module 880 is coupled to convert the outbound information 886 into a baseband or near baseband symbol stream 888 (e.g., a symbol stream having a carrier frequency of 0 Hz to a few MHz). The baseband processing module 880 functions to converting the outbound information into a baseband or near baseband symbol stream by utilizing a standard single input single output data modulation protocol, utilizing a proprietary single input single output data modulation protocol, utilizing a modified standard single input single output data modulation protocol, utilizing a standard multiple input multiple output data modulation protocol, utilizing a proprietary multiple input multiple output data modulation protocol, utilizing a modified standard multiple input multiple output data modulation protocol, and/or utilizing a baseband beamforming data modulation protocol. Examples of this were provided with reference to FIG. 53.

Figure 61:
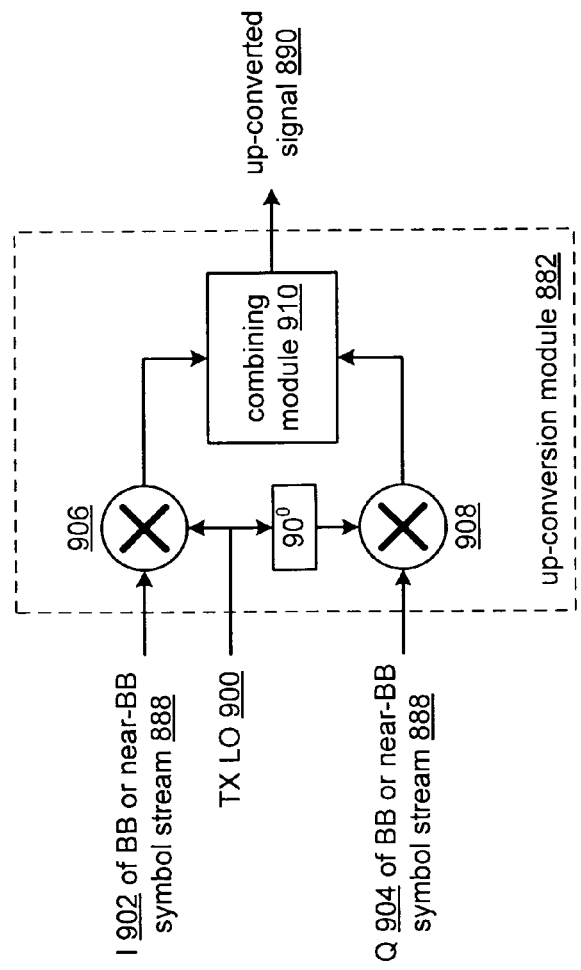
FIGS. 61-63 are schematic block diagrams of embodiments of an up-conversion module of a transmitter section in accordance with the present invention.
Figure 63:
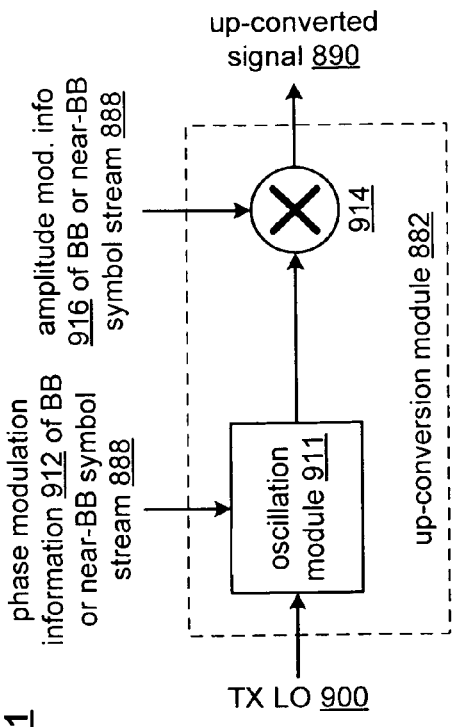
Figure 62:
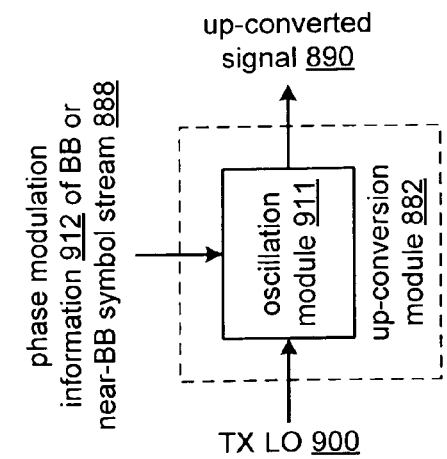

The up-conversion module 882, embodiments of which will be described in greater detail with reference to FIGS. 61-63, is coupled to up-convert the baseband or near baseband symbol stream 888 into an up-converted signal 890. The RF transmitter 884 is coupled to transmit the up-converted signal 890 as the RF bus signal 892 in accordance with an RF transmission setting. The RF transmission setting includes transmitting multiple phase adjusted representations of the up-converted signal as the RF bus signal in accordance with an in-air beamforming RF transmission setting, transmitting the RF bus signal via a waveguide in accordance with a waveguide RF transmission setting, and/or transmitting the RF bus signal via free space in accordance with a free space RF transmission setting.

FIG. 61 is a schematic block diagram of an embodiment of an up-conversion module 882 of a transmitter 842. The up-conversion module 882 includes a first mixer 906, a second mixer 908, a ninety degree phase shift module, and a combining module 910. In this embodiment, the up-conversion module 882 converts a Cartesian-based baseband or near baseband symbol stream 888 into the up-converted signal 890.

In this embodiment, the first mixer 906 mixes an in-phase component 902 of the baseband or near baseband symbol stream 888 with an in-phase component of the transmit local oscillation 900 to produce a first mixed signal. The second mixer 908 mixes a quadrature component 904 of the baseband or near baseband symbol stream 888 with a quadrature component of the transmit local oscillation to produce a second mixed signal. The combining module 910 combines the first and second mixed signals to produce the up-converted signal 890.

For example, if the I component 902 is expressed as $A_I\cos(\omega_{dn}+\Phi_n)$, the Q component 904 is expressed as $A_Q\sin(\omega_{dn}+\Phi_n)$, the I component of the local oscillation 900 is expressed as $\cos(\omega_{RF})$ and the Q component of the local oscillation 900 is represented as $\sin(\omega_{RF})$, then the first mixed signal is $\frac{1}{2}A_I\cos(\omega_{RF}-\omega_{dn}-\Phi_n)+\frac{1}{2}A_I\cos(\omega_{RF}+\omega_{dn}+\Phi_n)$ and the second mixed signal is $\frac{1}{2}A_Q\cos(\omega_{RF}-\omega_{dn}-\Phi_n)-\frac{1}{2}A_Q\cos(\omega_{RF}+\omega_{dn}+\Phi_n)$. The combining module 910 then combines the two signals to produce the up-converted signal 890, which may be expressed as $A\cos(\omega_{RF}+\omega_{dn}+\Phi_n)$. Note that the combining module 910 may be a subtraction module, may be a filtering module, and/or any other circuit to produce the up-converted signal from the first and second mixed signals.

FIG. 62 is a schematic block diagram of an embodiment of an up-conversion module 882 of a transmitter 842. In this embodiment, the up-conversion module 882 includes an oscillation module 911 and converts phase modulation information 912 of the baseband or near baseband symbol stream 888 into the up-converted signal 890.

In operation, the oscillation module 911, which may be a phase locked loop, a fractional N synthesizer, and/or other oscillation generating circuit, utilizes the transmit local oscillation 900 as a reference oscillation to produce an oscillation at the frequency of the up-converted signal 890. The phase of the oscillation is adjusted in accordance with the phase modulation information 912 of the baseband or near baseband symbol stream 888 to produce the up-converted signal 890.

FIG. 63 is a schematic block diagram of an embodiment of an up-conversion module 882 of a transmitter 842. In this embodiment, the up-conversion module 882 includes the oscillation module 911 and a multiplier 914 to convert phase modulation information 912 and amplitude modulation information 916 of the baseband or near baseband symbol stream 888 to produce the up-converted signal 890.

In operation, the oscillation module 911, which may be a phase locked loop, a fractional N synthesizer, and/or other oscillation generating circuit, utilizes the transmit local oscillation 900 as a reference oscillation to produce an oscillation at the frequency of the up-converted signal 890. The phase of the oscillation is adjusted in accordance with the phase modulation information 912 of the baseband or near baseband symbol stream 888 to produce a phase modulated RF signal. The multiplier 914 multiplies the phase modulated RF signal with amplitude modulation information 916 of the baseband or near baseband symbol stream 888 to produce the up-converted signal 890.

Figure 64:
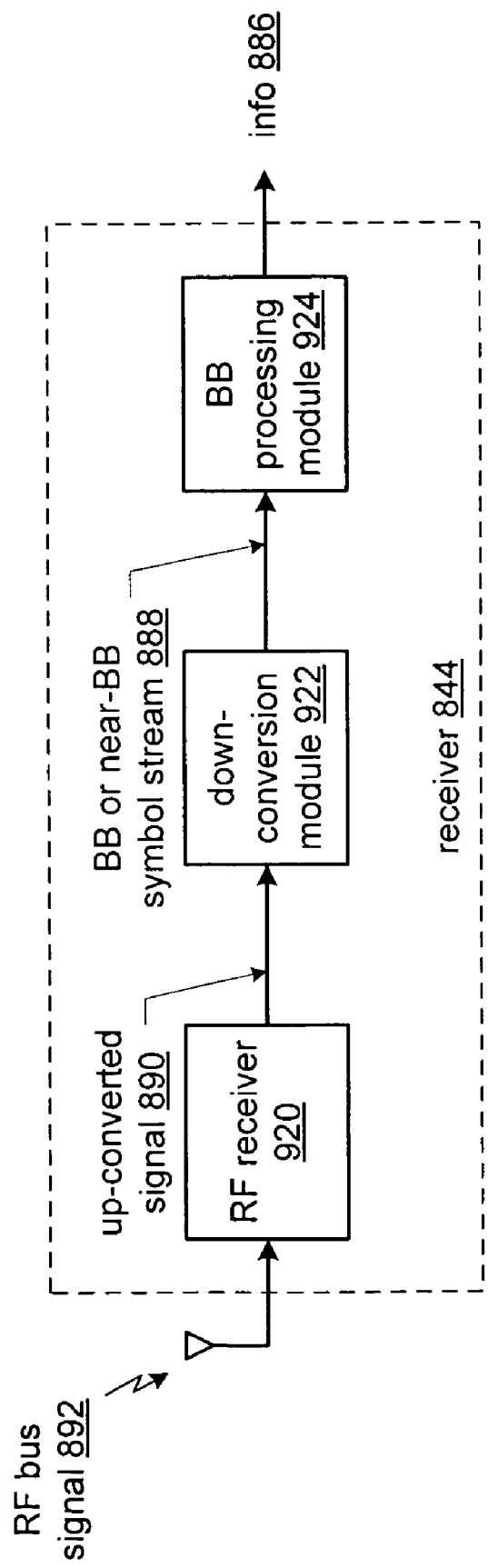
FIG. 64 is a schematic block diagram of an embodiment of a receiver section of an RF bus transceiver in accordance with the present invention.

FIG. 64 is a schematic block diagram of an embodiment of the receiver 844 of the RF bus transceiver 840. The receiver 844 includes an RF receiver 920, a down-conversion module 922, and a baseband processing module 924. The baseband (BB) processing module 924 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The BB processing module 924 may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information. Note that when the BB processing module 924 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry.

In operation, the RF receiver 920 is coupled to convert the RF bus signal 892 into an up-converted signal 890 in accordance with the RF transmission setting. The down-conversion module 922 is coupled to down-convert the up-converted signal to produce a baseband or near baseband symbol stream 888. The baseband processing module 924 is coupled to convert the baseband or near baseband symbol stream 888 into the information 886. The baseband processing module 924 may use convert the baseband or near baseband symbol stream into the information by utilizing a standard single input single output data demodulation protocol, utilizing a proprietary single input single output data demodulation protocol, utilizing a modified standard single input single output data demodulation protocol, utilizing a standard multiple input multiple output data demodulation protocol, utilizing a proprietary multiple input multiple output data demodulation protocol, utilizing a modified standard multiple input multiple output data demodulation protocol, and utilizing a baseband beamforming data demodulation protocol.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A radio frequency identification (RFID) system comprises:
　an RFID reader including:
　　a reader processing module to encode outbound RFID data to produce outbound RFID encoded data and to decode inbound RFID encoded data to produce inbound RFID data;
　　an RFID transceiver coupled to convert the outbound RFID encoded data into an outbound RF RFID signal and to convert an inbound RF RFID signal into the inbound RFID encoded data; and
　　a reader radio frequency (RF) bus transceiver;
　an RFID tag including:
　　a power recovery module coupled to produce a supply voltage from the outbound RF RFID signal and to produce a received RF RFID signal;
　　a tag processing module coupled to recover the outbound RFID data from the received RF RFID signal and to generate tag RFID data; and
　　transmit section coupled to convert the tag RFID data into the inbound RF RFID signal;

a network connection module coupled to provide connection to a network, wherein the network connection module includes a network connection RF bus transceiver, wherein the reader RF bus transceiver exchanges at least one of the inbound RFID data and the outbound RFID data with the network RF bus transceiver via an RF bus.

2. The RFID system of claim 1 further comprises:
the inbound and outbound RF RFID signals having a first carrier frequency; and
the RF bus supporting RF bus communications having a second carrier frequency, wherein the first or the second carrier frequency is within a 60 GHz frequency band.

3. The RFID system of claim 1 further comprises:
an RF bus controller; wherein the inbound and outbound RF RFID signals having a carrier frequency within a frequency band and the RF bus supporting RF bus communications having the carrier frequency, wherein the RF bus controller controls access to carrier frequencies within the frequency band.

4. The RFID system of claim 1, wherein the network connection module further comprises at least one of:
a wireless local area network (WLAN) transceiver to provide the connection to the network;
a wireless personal area network (WPAN) transceiver to provide the connection to the network;
a wireline network card to provide the connection to the network; and
a serial interface to provide the connection to the network.

5. The RFID system of claim 4 further comprises:
the inbound and outbound RF RFID signals having a first carrier frequency;
the RF bus supporting RF bus communications having a second carrier frequency; and
the WLAN transceiver transceiving RF signals having a third carrier frequency, wherein the first, second or the third carrier frequency is within a 60 GHz frequency band.

6. The RFID system of claim 4 further comprises:
an RF bus controller; wherein the inbound and outbound RF RFID signals having a carrier frequency within a frequency band and the RF bus supporting RF bus communications having the carrier frequency within the frequency band, wherein the RF bus controller controls access to carrier frequencies within the frequency band, and wherein the WLAN transceiver transceives RF signals having a carrier frequency outside of the frequency band.

7. The RFID system of claim 4 further comprises:
an RF bus controller; wherein the inbound and outbound RF RFID signals having a carrier frequency within a frequency band, the RF bus supporting RF bus communications having the carrier frequency within the frequency band, wherein the WLAN transceiver transceives RF signals having a carrier frequency within the frequency band, and wherein the RF bus controller controls access to carrier frequencies within the frequency band.

8. A radio frequency identification (RFID) reader comprises:
a processing module coupled to:
encode outbound RF bus data to produce outbound RF bus encoded data;
decode inbound RF bus encoded data to produce inbound RF bus data;
encode tag inquiry data to produce encoded tag inquiry data; and
decode encoded tag response data to produce tag response data;
a transmitter section coupled to:
convert the outbound RF bus encoded data into an outbound RF bus signal; and
convert the encoded tag inquiry data into an outbound RF tag inquiry signal; and
a receiver section coupled to:
convert an inbound RF bus signal into the inbound RF bus encoded data;
convert an inbound RF tag response signal into the encoded tag response data;
wherein the receiver section comprises:
a low noise amplifier coupled to amplify an inbound RF signal to produce an amplified inbound RF signal, wherein the inbound RF signal includes the inbound RF tag response signal or the inbound RF bus signal and the outbound RF tag inquiry signal;
a block cancellation module coupled to receive the outbound RF tag inquiry signal from the transmitter section to produce a received RF tag inquiry signal and to substantially cancel the outbound RF tag inquiry signal from the amplified inbound RF signal using the received RF tag inquiry signal and to pass, substantially the inbound RF tag response signal or the inbound RF bus signal of the amplified inbound RF signal;
a down-conversion module coupled to convert the inbound RF tag response signal into the encoded tag response data.

9. The RFID reader of claim 8, wherein the processing module further functions to:
convert the tag response data into the outbound RF bus data.

10. The RFID reader of claim 8, wherein the processing module further functions to:
convert the inbound RF bus data into the tag inquiry data.

11. The RFID reader of claim 8, wherein the transmitter section comprises:
a power level control module coupled to generate a power level setting;
a summing module coupled to sum the power level setting and the encoded tag inquiry data to produce summed data;
an oscillation module coupled to generate an oscillation at a desired frequency; and
a power amplifier section coupled to amplitude modulate the oscillation based on the summed data to produce the outbound RF tag inquiry signal.

12. The RFID reader of claim 11, wherein the transmitter section further comprises:
the power amplifier section amplifying the oscillation to produce a continuous wave signal prior to the encoding of the tag inquiry data, wherein an RFID tag utilizes the continuous wave to generate power.

13. The RFID reader of claim 8, wherein the processing module further functions to:
arbitrate between RF bus communications and RFID tag communications, wherein the RF bus communications include the inbound and outbound RF bus signals and the RFID tag communications include outbound RF tag inquiry signal and the inbound RF tag response signal.

14. The RFID reader of claim 13 further comprises:
the RF bus communications and the RFID tag communications having a carrier frequency in a 60 GHz frequency band.

* * * * *